US011171071B2

(12) United States Patent
Hatano et al.

(10) Patent No.: US 11,171,071 B2
(45) Date of Patent: Nov. 9, 2021

(54) POWER MODULE AND FABRICATION METHOD OF THE POWER MODULE

(71) Applicant: ROHM CO., LTD., Kyoto (JP)

(72) Inventors: Maiko Hatano, Kyoto (JP); Takukazu Otsuka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/541,750

(22) Filed: Aug. 15, 2019

(65) Prior Publication Data
US 2019/0371695 A1 Dec. 5, 2019

Related U.S. Application Data

(63) Continuation of application No. PCT/JP2018/012634, filed on Mar. 28, 2018.

(30) Foreign Application Priority Data

Mar. 31, 2017 (JP) .............................. JP2017-071880

(51) Int. Cl.
H01L 23/367 (2006.01)
H01L 21/52 (2006.01)
(Continued)

(52) U.S. Cl.
CPC ............ *H01L 23/367* (2013.01); *H01L 21/52* (2013.01); *H01L 23/12* (2013.01);
(Continued)

(58) Field of Classification Search
CPC ....... H01L 23/367; H01L 21/52; H01L 23/12; H01L 23/3735; H01L 24/32; H01L 24/48;
(Continued)

(56) References Cited

U.S. PATENT DOCUMENTS 4,993,148 A * 2/1991 Adachi ................. H05K 1/021
174/252
9,786,577 B2 * 10/2017 Terasaki ................ H01L 31/04
(Continued)

FOREIGN PATENT DOCUMENTS

DE        43 15 272      11/1994
DE    10 2006 019 602    11/2006
(Continued)

OTHER PUBLICATIONS

Nashida et al., "All-SiC Module Technologies", Special Edition: Power Semiconductor Contributing to Energy Management, Fuji Electric Review, 2012, vol. 85, No. 6, p. 403 (15)-407 (19), with English abstract.
(Continued)

*Primary Examiner* — Vu A Vu
(74) *Attorney, Agent, or Firm* — Hamre, Schumann, Mueller & Larson, P.C.

(57) ABSTRACT

A power module includes: a plate-shaped thick copper substrate, a conductive stress relaxation metal layer disposed on the thick copper substrate, a semiconductor device disposed on the stress relaxation metal layer, and a plated layer disposed on the stress relaxation metal layer, wherein the semiconductor device is bonded to the stress relaxation metal layer via the plated layer. The thick copper substrate includes a first thick copper layer and a second thick copper layer disposed on the first thick copper layer, and the stress relaxation metal layer is disposed on the second thick copper layer. A part of the semiconductor device is embedded to be fixed to the stress relaxation metal layer. A bonded surface between the semiconductor device and the stress relaxation metal layer are integrated to each other by means of diffusion bonding or solid phase diffusion bonding.

15 Claims, 51 Drawing Sheets

(51) Int. Cl.
  *H01L 23/12* (2006.01)
  *H01L 23/373* (2006.01)
  *H01L 23/00* (2006.01)
  *H01L 29/12* (2006.01)
  *H01L 29/739* (2006.01)
  *H01L 29/78* (2006.01)
  *H05K 3/34* (2006.01)

(52) U.S. Cl.
  CPC .......... *H01L 23/3735* (2013.01); *H01L 24/32* (2013.01); *H01L 24/48* (2013.01); *H01L 29/12* (2013.01); *H01L 29/739* (2013.01); *H01L 29/78* (2013.01); *H05K 3/341* (2013.01); *H01L 2224/32225* (2013.01); *H01L 2224/48091* (2013.01)

(58) Field of Classification Search
  CPC ....... H01L 29/12; H01L 29/739; H01L 29/78; H01L 2224/32225; H01L 2224/48091; H01L 2224/73265; H01L 24/08; H01L 2224/08245; H01L 2224/49175; H01L 2224/49109; H01L 2224/49113; H01L 24/83; H01L 24/80; H01L 2224/4823; H01L 2924/3512; H01L 2224/83439; H01L 2224/83444; H01L 2224/83464; H01L 2224/80439; H01L 2224/80444; H01L 2224/80464; H01L 2224/80424; H01L 2224/29006; H01L 2224/29139; H01L 2224/27505; H01L 2224/8083; H01L 2224/8383; H01L 2224/80203; H01L 2224/83203; H01L 2924/15159; H01L 29/41741; H01L 29/417; H01L 29/7397; H01L 29/7395; H01L 25/072; H01L 23/562; H01L 23/5386; H01L 29/7813; H01L 29/1608; H01L 29/7802; H05K 3/341
  USPC .......................................................... 257/712
  See application file for complete search history.

(56) References Cited

U.S. PATENT DOCUMENTS

| | | | |
|---|---|---|---|
| 10,037,928 B2* | 7/2018 | Ogawa | H01L 23/367 |
| 10,418,295 B2* | 9/2019 | Yokoyama | H01L 23/36 |
| 2018/0366383 A1 | 12/2018 | Yokoyama et al. | |

FOREIGN PATENT DOCUMENTS

| | | |
|---|---|---|
| DE | 10 2009 033 029 | 1/2011 |
| DE | 10 2009 045 181 | 4/2011 |
| DE | 10 2013 219 356 | 5/2014 |
| EP | 3 048 640 | 7/2016 |
| JP | 2013-191640 | 9/2013 |
| JP | 2015-195415 | 11/2015 |
| JP | 2016-103526 | 6/2016 |
| WO | 2017/130512 | 8/2017 |

OTHER PUBLICATIONS

International Search Report of PCT/JP2018/012634, dated May 29, 2018, 3 pages including English translation.

Office Action issued in the counterpart German Patent Application No. 11 2018 001 769.9, dated Nov. 26, 2020, 20 pages including English translation.

* cited by examiner 100.00 μm

POWER MODULE AND FABRICATION METHOD OF THE POWER MODULE

CROSS REFERENCE TO RELATED APPLICATIONS

This is a continuation application (CA) of PCT Application No. PCT/JP2018/12634, filed on Mar. 28, 2018, which claims priority to Japan Patent Application No. P2017-071880 filed on Mar. 31, 2017 and is based upon and claims the benefit of priority from prior Japanese Patent Application No. P2017-071880 filed on Mar. 31, 2017 and PCT Application No. PCT/JP2018/12634, filed on Mar. 28, 2018, the entire contents of each of which are incorporated herein by reference.

FIELD

The embodiments described herein relate to a power module and a fabrication method of such a power module.

BACKGROUND

Conventionally, as one of the power modules, there have been known power modules in which a perimeter of semiconductor device(s) including a power element(s) (chip(s)) such as Insulated Gate Bipolar Transistor (IGBT) is molded with resin.

In the operating state, it is general to make the heat radiators, e.g. the heat sink and the fin, arrange and radiate the heat to the back surface side of the substrate, and to cool the semiconductor device to the semiconductor device generates heat.

Particularly, in recent years, making such a substrate portion as a thick copper substrate has progressed in order to reduce a thermal resistance.

SUMMARY

However, in the case of making such a substrate portion as a thick copper substrate, there is a concern of reliability of bonding of the substrate portion.

The embodiments provide a power module capable of improving the reliability of the bonding thereof without increasing the thermal resistance, and a fabrication method of such a power module.

According to one aspect of the embodiments, there is provided a power module comprising: a plate-shaped thick copper substrate; a conductive stress relaxation metal layer disposed on the thick copper substrate; and a semiconductor device disposed on the stress relaxation metal layer, wherein the semiconductor device is bonded to the stress relaxation metal layer.

According to another aspect of the embodiments, there is provided a power module comprising: a plate-shaped first thick copper layer; an insulating sheet layer disposed on the first thick copper layer; a second thick copper layer disposed on the insulating sheet layer, the second thick copper layer being pattern-formed; a first aluminum relaxation layer disposed on the second thick copper layer; and a semiconductor device disposed on the first aluminum relaxation layer, wherein the semiconductor device is bonded to the first aluminum relaxation layer.

According to still another aspect of the embodiments, there is provided a fabrication method of a power module, the fabrication method comprising: forming a first aluminum relaxation layer on a second thick copper layer; disposing the second thick copper layer via an insulating sheet layer on the first thick copper layer; disposing a semiconductor device on the first aluminum relaxation layer and then bonding the semiconductor device to the first aluminum relaxation layer by a heating and pressurizing process that applies pressure while heating; and connecting an electrode of the semiconductor device to an external terminal.

According to yet another aspect of the embodiments, there is provided a fabrication method of a power module, the fabrication method comprising: forming a first aluminum relaxation layer on a second thick copper layer; disposing a semiconductor device on the first aluminum relaxation layer and then bonding the semiconductor device to the first aluminum relaxation layer by a heating and pressurizing process that applies pressure while heating; disposing the second thick copper layer via an insulating sheet layer on the first thick copper layer; and connecting an electrode of the semiconductor device to an external terminal.

According to the embodiments, there can be provided the power module capable of improving the reliability of the bonding thereof without increasing the thermal resistance, and the fabrication method of such a power module.

DESCRIPTION OF EMBODIMENTS

Figure 1A:
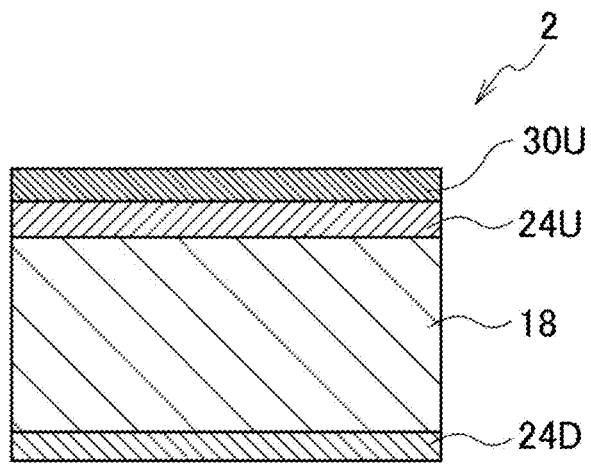
FIG. 1A is a schematic cross-sectional structure diagram showing a thick copper substrate applicable to a power module according to the embodiments.

Next, the embodiments will be described with reference to drawings. In the description of the following drawings, the identical or similar reference numeral is attached to the identical or similar part. However, it should be noted that the drawings are schematic and therefore the relation between thickness and the plane size and the ratio of the thickness differs from an actual thing. Therefore, detailed thickness and size should be determined in consideration of the following explanation. Of course, the part from which the relation and ratio of a mutual size differ also in mutually drawings is included.

Moreover, the embodiments shown hereinafter exemplify the apparatus and method for materializing the technical idea; and the embodiments do not specify the material, shape, structure, placement, etc. of each component part as the following. The embodiments may be changed without departing from the spirit or scope of claims.

EMBODIMENTS

Examples of Thick Copper Substrate

Figure 1B:
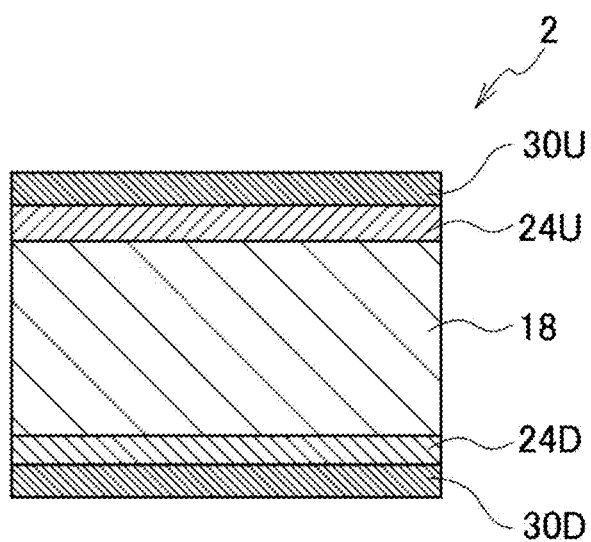
FIG. 1B is a schematic cross-sectional structure diagram showing an alternative thick copper substrate applicable to the power module according to the embodiments.

FIG. 1A shows a schematic cross-sectional structure of a thick copper substrate 2 applicable to a power module 1 according to the embodiments, and FIG. 1B shows a schematic cross-sectional structure of an alternative thick copper substrate 2 applicable to the power module 1 according to the embodiment.

As shown in FIG. 1A, the thick copper substrate 2 applicable to the power module 1 according to the embodiments includes: a second thick copper layer 18; and a first aluminum relaxation layer 24U disposed on the second thick copper layer 18. Furthermore, the thick copper substrate 2 may include a second aluminum relaxation layer 24D disposed on the back surface of the second thick copper layer 18 so as to be opposed to the first aluminum relaxation layer 24U and to sandwich the second thick copper layer 18 therebetween. Furthermore, the thick copper substrate 2 may include a first plated layer 30U on the first aluminum relaxation layer 24U.

As shown in FIG. 1B, a schematic cross-sectional structure of an alternative thick copper substrate 2 applicable to the power module 1 according to the embodiments may further include a second plated layer 30D disposed on a back side surface of the second aluminum relaxation layer 24D so as to be opposite to the first plated layer 30U and to sandwich the second thick copper layer 18 therebetween.

An annealed copper plate etc. are applicable to the second thick copper layer 18. The second thick copper layer 18 and the first aluminum relaxation layer 24U are rolled to be bonded to each other. Similarly, the second thick copper layer 18 and the second aluminum relaxation layer 24D are rolled to be bonded to each other. A thickness of the second thick copper layer 18 is equal to or greater than approximately 2 mm, for example. Moreover, a thickness of the first aluminum relaxation layer 24U and the second aluminum relaxation layer 24D may be equal to or less than approximately 0.1 mm, for example.

Moreover, as a typical example, a thickness of the first aluminum relaxation layer 24U and the second aluminum relaxation layer 24D may be within a range of approximately 0.01 mm to 0.5 mm, for example, and a thickness of the second thick copper layer 18 may be within a range of approximately 1 mm to 3 mm, for example.

Moreover, plating materials mainly composed of silver (Ag), gold (Au), palladium (Pd), or the like are applicable to the first plated layer 30U and the second plated layer 30D, for example. A thickness of the first plated layer 30U and the second plated layer 30D is within a range of approximately 0.1 μm to approximately 5 μm, for example.

In addition, bonding by means of a sputtering technology, a cold spraying technology, or a thermal spraying technology may be used, instead of the bonding by means of the above-mentioned rolling technology.

Figure 27:
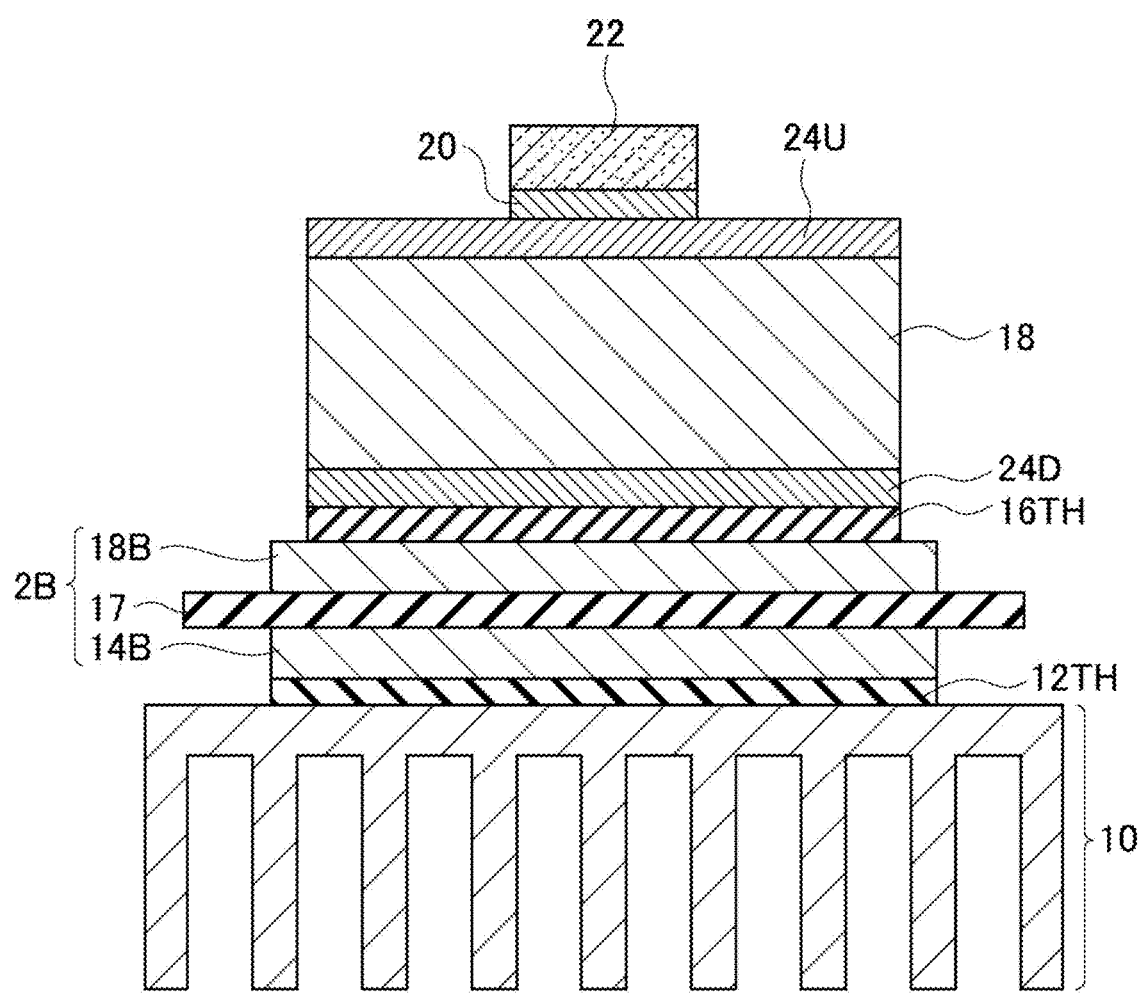
FIG. 27 is a schematic cross-sectional structure diagram showing a power module (configuration example 4) according to the embodiments which can be mounted on the cooling apparatus.

In addition, the configuration of the thick copper substrate 2 is not limited to the configuration shown in FIG. 1A or 1B, the second thick copper layer 18 may be disposed on the first thick copper layer 14, as shown in FIGS. 2 and 3 mentioned below, or the second thick copper layer 18 may be disposed on an insulating substrate (refer to FIG. 25), as shown in FIG. 27, for example.

First Embodiment

Figure 2A:
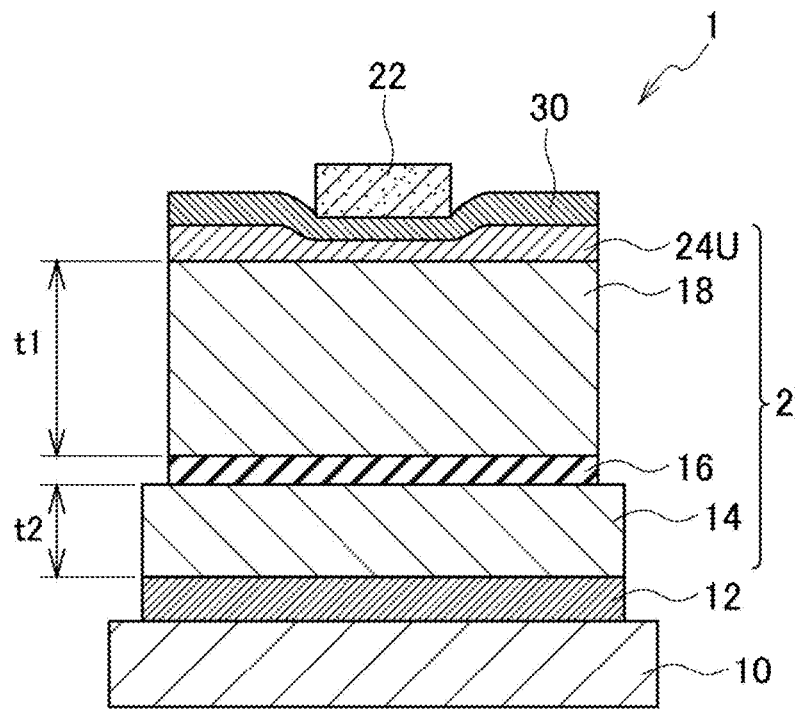
FIG. 2A is a schematic cross-sectional structure diagram showing a power module according to a first embodiment.
Figure 2B:
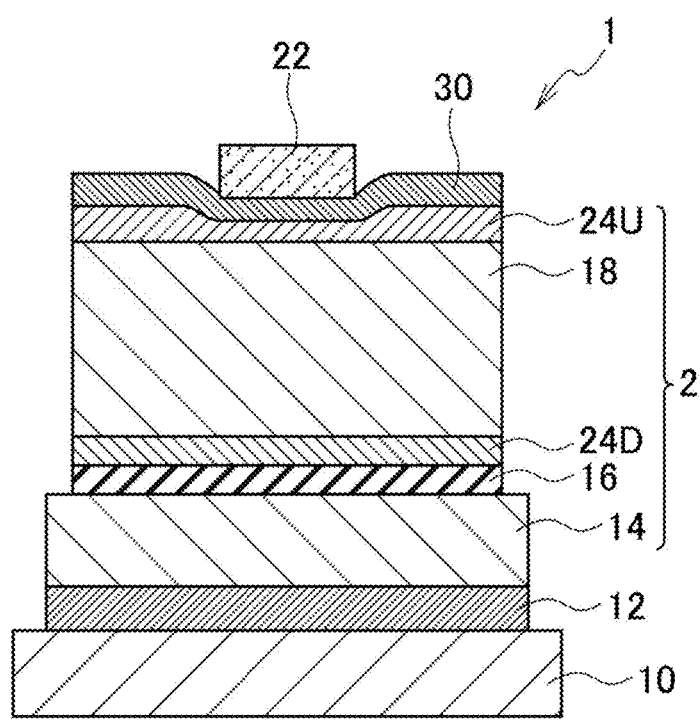
FIG. 2B is a schematic cross-sectional structure diagram showing a power module according to a modified example of the first embodiment.

FIG. 2A shows a schematic cross-sectional structure of a power module 1 according to a first embodiment, and FIG. 2B shows a schematic cross-sectional structure of a power module 1 according to a modified example of the first embodiment.

As shown in FIG. 2A, the power module 1 according to the first embodiment includes: a plate-shaped thick copper substrate 2; a conductive stress relaxation metal layer 24U disposed on the thick copper substrate 2; and a semiconductor device 22 disposed on the stress relaxation metal layer 24U. In this embodiment, the semiconductor device 22 is bonded to the stress relaxation metal layer 24U.

Moreover, as shown in FIG. 2A, the power module 1 according to the first embodiment includes a plated layer 30 disposed on the stress relaxation metal layer 24U, and the semiconductor device 22 is bonded to the stress relaxation metal layer 24U via the plated layer 30.

Moreover, in the power module 1 according to the first embodiment, a part of the semiconductor devices 22 is thrust to be fixed to (is embedded in) the stress relaxation metal layer 24U, as shown in FIG. 2A.

In the power module 1 according to the first embodiment, a bonded surface between the semiconductor device 22 and the stress relaxation metal layer 24U may be integrated to each other. More specifically, the semiconductor device 22 and the stress relaxation metal layer 24U may be bonded to each other by means of a diffusion bonding or solid phase diffusion bonding.

Moreover, the semiconductor device 22 is bonded by being thrust into (embedded in) the stress relaxation metal layer 24U by approximately 0 to 100 µm, for example, by means of heating and pressurizing bonding. Alternatively, the semiconductor device 22 may be bonded by being thrust into (embedded in) the stress relaxation metal layer 24U by approximately ⅓ to ½ of the thickness of the semiconductor device 22.

Moreover, an aluminum layer (first aluminum relaxation layer) can be used as the stress relaxation metal layer 24U.

Moreover, as shown in FIG. 2A, in the power module 1 according to the first embodiment, the thick copper substrate 2 includes a first thick copper layer 14, and a second thick copper layer 18 disposed on the first thick copper layer 14, and the stress relaxation metal layer 24U may be disposed on the second thick copper layer 18.

Moreover, as shown in FIG. 2A, in the power module 1 according to the first embodiment, the thick copper substrate 2 may include an insulating sheet layer 16 disposed on the first thick copper layer 14, and the second thick copper layer 18 may be disposed on the insulating sheet layer 16. Although a size of the insulating sheet layer 16 has the same size as the thick copper layer 18 as shown in FIG. 2, a possibility of a short circuit therein can be reduced by forming the insulating sheet layer 16 larger than the thick copper layer 18.

The semiconductor device 22 and the stress relaxation metal layer 24U can be bonded by means of the diffusion bonding or the solid phase diffusion bonding.

Moreover, the semiconductor device 22 can be bonded on the stress relaxation metal layer 24U by pressurized and heated by means of a heating and pressurizing process.

In the power module 1 according to the first embodiment, from a simulation result of a thermal resistance mentioned below (FIG. 18), a thickness of the first aluminum relaxation layer 24U is preferable to be equal to or less than 0.1 an, and a thickness of the second thick copper layer 18 is preferable to be equal to or greater than 2 mm.

As a method of forming the first aluminum relaxation layer 24U on the second thick copper layer 18, bonding by rolling (cladding material) or the like can be used. A structure formed of the bonding by rolling or the like is called the cladding material. In addition, bonding by mans of the sputtering technology, the cold spraying technology, or the thermal spraying technology may be used, instead of the bonding by means of the rolling technology.

The reason for forming the plated layer 30 on the first aluminum relaxation layer 24U is for satisfactorily bonding the semiconductor device 22 to the first aluminum relaxation layer 24U. Moreover, a formed film by means of thermal spraying may be applied thereto, for example, instead of using the plated layer 30.

As the insulation layer 16, a semi-cured material sheet layer including an epoxy based resin, polyimide based resin, or the like, as a base resin, can be applied, for example. A coefficient of thermal conductivity (CTE) of the insulating sheet layer 16 is equal to or greater than 10 W/mK, and the thickness thereof is 0.1 mm to 0.2 mm, for example. The reason for using the insulating sheet layer 16 is to reduce a cost as compared with the ceramic substrate.

The power module 1 according to the first embodiment may further include a cooling apparatus 10 as shown in FIG. 2A, and the first thick copper layer 14 may be disposed via a soldering layer 12 on the cooling apparatus 10. As a material of the soldering layer 12, Sn based soldering layer can be applied. Alternatively, an Ag fired layer or a Cu fired layer may be applied thereas. Alternatively, a thermal compound may be applied thereas. Moreover, the cooling apparatus 10 is water-cooling type or air-cooling type, in the power module 1 according to the embodiment Modified Example As shown in FIG. 2B, the power module 1 according to a modified example of the first embodiment includes a second aluminum relaxation layer 24D disposed on the insulating sheet layer 16. The second thick copper layer 18 can be bonded on the second aluminum relaxation layer 24D by means of the bonding by rolling or the like. Other configurations are the same as those of the power module 1 according to the first embodiment.

According to the first embodiment and the modified example thereof, there can be provided the power module capable of improving the reliability of the bonding thereof without increasing the thermal resistance, and the fabrication method of such a power module.

Second Embodiment

Figure 3A:
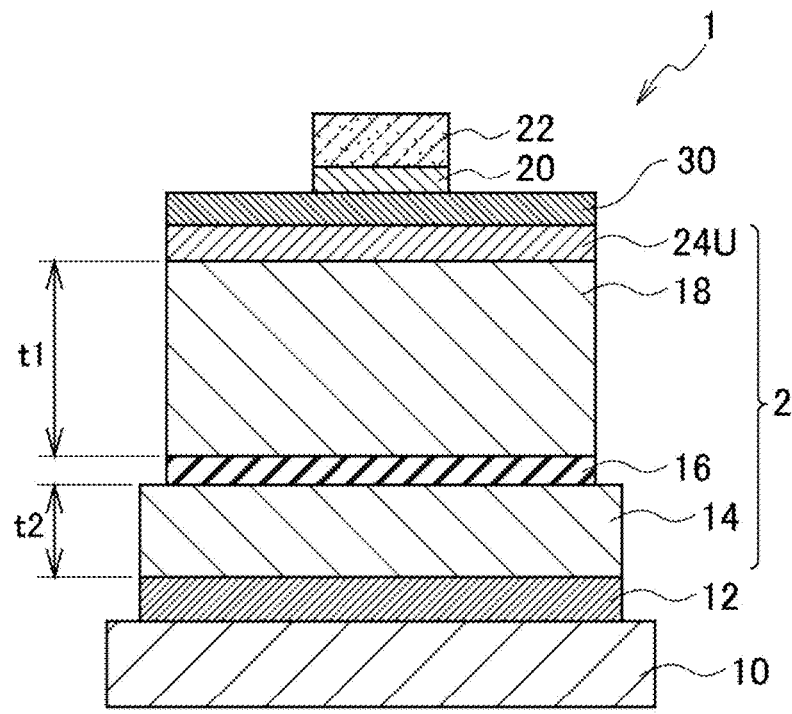
FIG. 3A is a schematic cross-sectional structure diagram showing a power module according to a second embodiment.
Figure 3B:
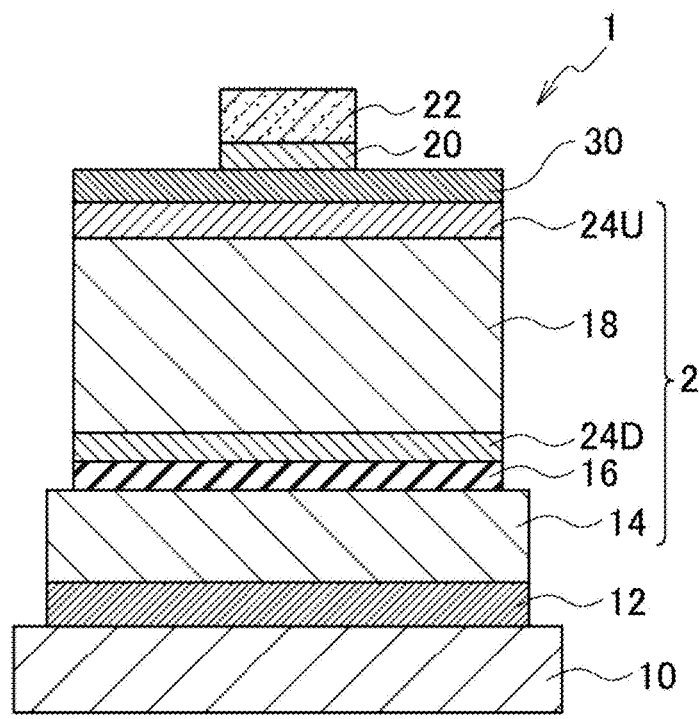
FIG. 3B is a schematic cross-sectional structure diagram showing a power module according to a modified example of the second embodiment.

FIG. 3A shows a schematic cross-sectional structure of a power module 1 according to a second embodiment, and FIG. 3B shows a schematic cross-sectional structure of a power module 1 according to a modified example of the second embodiment.

As shown in FIG. 3A, the power module 1 according to the second embodiment includes an Ag fired layer 20 disposed on the plated layer 30, and the semiconductor device 22 is bonded to the stress relaxation metal layer 24U via the Ag fired layer 20 and the plated layer 30.

In the power module 1 according to the second embodiment, the semiconductor device 22 can be bonded to the plated layer 30 and the stress relaxation metal layer 24U via the Ag fired layer 20. Other configurations are the same as those of the power module 1 according to the first embodiment. Although a size of the Ag fired layer 20 has the same size as the semiconductor device 22 in FIG. 3, the size of the Ag fired layer 20 may be larger than that of the semiconductor device 22.

Modified Example

The power module 1 according to the modified example of the second embodiment includes a second aluminum relaxation layer 24D disposed on the insulating sheet layer 16, as shown in FIG. 3B. The second thick copper layer 18 can be bonded on the second aluminum relaxation layer 24U by means of the bonding by rolling or the like. Other configurations are the same as those of the power module 1 according to the second embodiment.

According to the second embodiment and the modified example thereof, there can be provided the power module capable of improving the reliability of the bonding thereof without increasing the thermal resistance, and the fabrication method of such a power module.

Third Embodiment

Figure 4A:
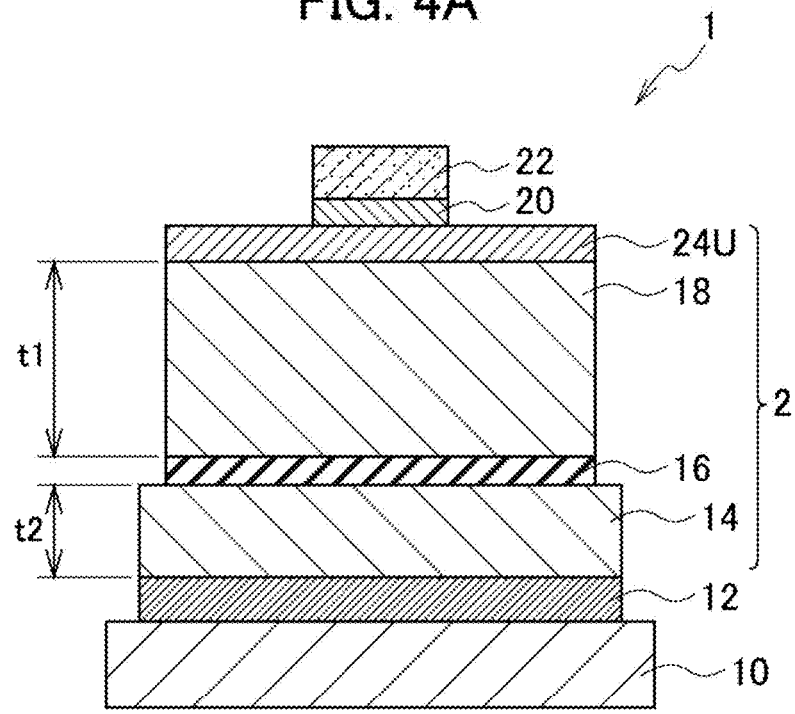
FIG. 4A is a schematic cross-sectional structure diagram showing a power module according to a third embodiment.
Figure 4B:
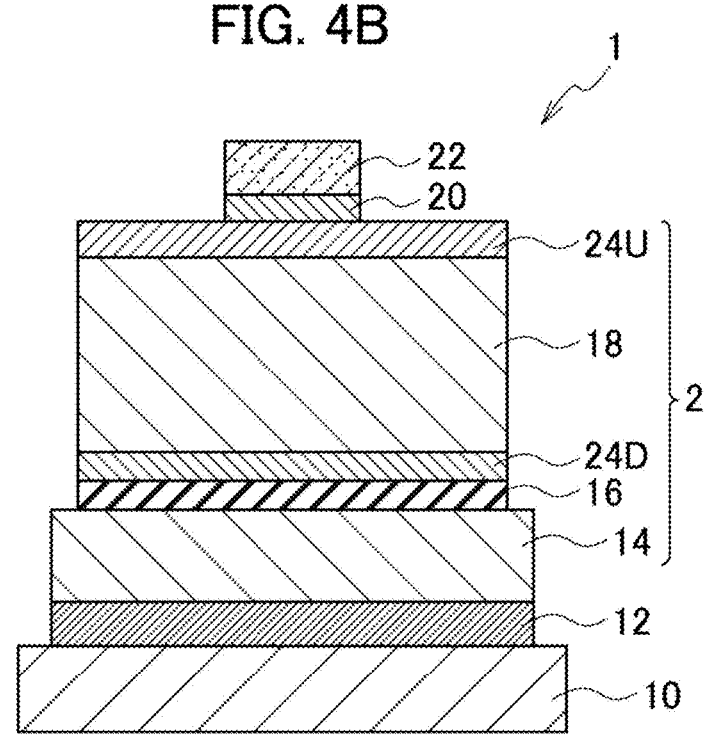
FIG. 4B is a schematic cross-sectional structure diagram showing a power module according to a modified example of the third embodiment.

FIG. 4A shows a schematic cross-sectional structure of a power module 1 according to a third embodiment, and FIG. 4B shows a schematic cross-sectional structure of a power module 1 according to a modified example of the third embodiment.

As shown in FIG. 4A, the power module 1 according to the third embodiment includes an Ag fired layer 20 disposed on the stress relaxation metal layer 24U, and the semiconductor device 22 is bonded to the stress relaxation metal layer 24U via the Ag fired layer 20.

In the power module 1 according to the third embodiment, the semiconductor device 22 and the stress relaxation metal layer 24U can be bonded to each other by means of solid phase diffusion via the Ag fired layer 20.

Moreover, the semiconductor device 22 can be bonded on the stress relaxation metal layer 24U via the Ag fired layer by pressurized and heated by means of a heating and pressurizing process.

Modified Example

The power module 1 according to the modified example of the third embodiment includes a second aluminum relaxation layer 24D disposed on the insulating sheet layer 16, as shown in FIG. 4B. The second thick copper layer 18 can be bonded on the second aluminum relaxation layer 24D by means of the bonding by rolling or the like. Other configurations are the same as those of the power module 1 according to the third embodiment.

According to the third embodiment and the modified example thereof, there can be provided the power module capable of improving the reliability of the bonding thereof without increasing the thermal resistance, and the fabrication method of such a power module.

Comparative Examples

Figure 5A:
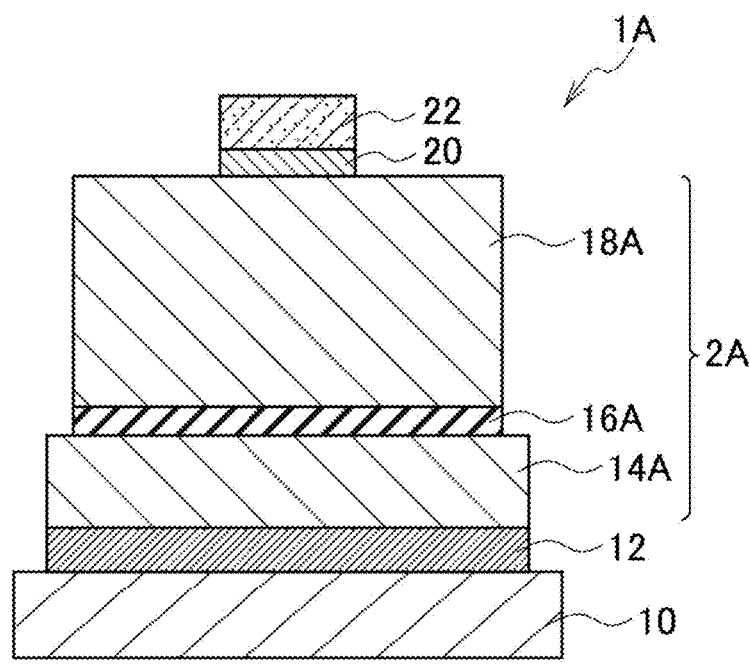
FIG. 5A is a schematic cross-sectional structure diagram showing a power module according to a comparative example 1 (structure example of thick copper layers+an insulation layer).

FIG. 5A shows a schematic cross-sectional structure of a power module 1A according to a comparative example 1 (structure example of a thick copper layer+an insulation layer).

As shown in FIG. 5A, the power module 1A according to the comparative example 1 includes: a thick copper substrate 2A; an Ag fired layer 20 disposed on the thick copper substrate 2A; and a semiconductor device 22 disposed on the Ag fired layer 20.

Furthermore, as shown in FIG. 5A, the thick copper substrate 2A includes a first thick copper layer 14A, and a second thick copper layer 18A disposed on the first thick copper layer 14A. In this example, the Ag fired layer 20 is disposed on the second thick copper layer 18A.

Moreover, as shown in FIG. 5A, the thick copper substrate 2A includes an insulating sheet layer 16A disposed on the first thick copper layer 14A. The second thick copper layer 18A is disposed on the insulating sheet layer 16A.

The semiconductor device 22 is connected to the second thick copper layer 18A via the Ag fired layer 20.

The power module 1A according to the comparative example 1 further includes a cooling apparatus 10 as shown in FIG. 5A, and the first thick copper layer 14A is disposed on the cooling apparatus 10 via the soldering layer 12.

Since the power module 1A according to the comparative example 1 is connected to the thick copper substrate 2A and the semiconductor device 22 via the Ag fired layer 20, there is a concern that the reliability may be reduced due to deterioration of the bonding layer, as explained later in FIGS. 9-11.

Figure 5B:
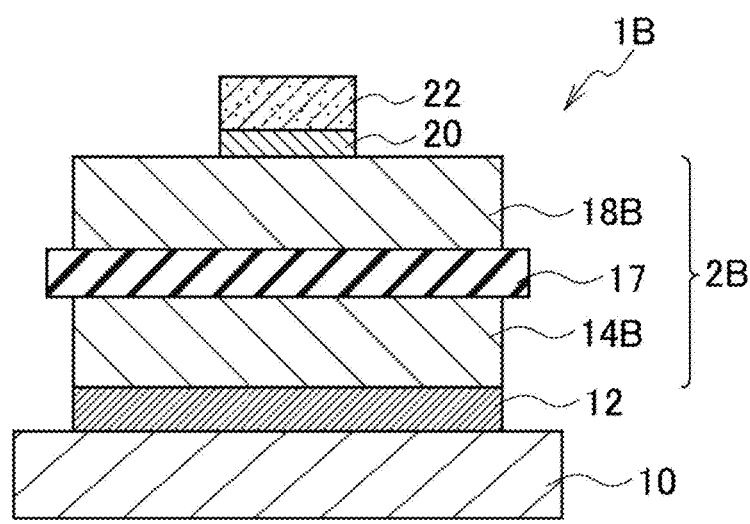
FIG. 5B is a schematic cross-sectional structure diagram showing a power module according to a comparative example 2 (structure example of thick copper layers+a ceramics substrate).

FIG. 5B shows a schematic cross-sectional structure of a power module 1B according to a comparative example 2 (structure example of a thick copper layer+a ceramics substrate).

As shown in FIG. 5B, the power module 1B according to the comparative example 2 includes: an insulating substrate 2B; an Ag fired layer 20 disposed on insulating substrate 2B; and a semiconductor device 22 disposed on the Ag fired layer 20.

Furthermore, as shown in FIG. 53, the insulating substrate 23 includes a first thick copper layer 14B, and a second thick copper layer 18B disposed on the first thick copper layer 14B via the ceramics substrate 17. In this example, the Ag fired layer 20 is disposed on the second thick copper layer 18B.

The semiconductor device 22 is connected to the second thick copper layer 18A via the Ag fired layer 20.

The power module 1B according to the comparative example 2 further includes a cooling apparatus 10 as shown in FIG. 5B, and the first thick copper layer 143 is disposed on the cooling apparatus 10 via the soldering layer 12.

Since the power module 1B according to the comparative example 2 is also connected to the insulating substrate 2B and the semiconductor device 22 via the Ag fired layer 20, there is a concern that the reliability may be reduced. Since the power module 1B according to the comparative example 2 is provided with the structure of the thick copper and the ceramics substrate, the cost is increased.

In the power module 1 according to embodiments and the modified examples thereof, it is possible to improve the reliability, without increasing a thermal resistance, by introducing the aluminum relaxation layer 24U as the stress relaxation metal layer 24U on the thick copper substrate 2, for example. Since it becomes possible to realize the bonding by means of the diffusion bonding or the solid phase diffusion bonding, the number of processes is also reduced.

(Pressing Process)

Figure 6A:
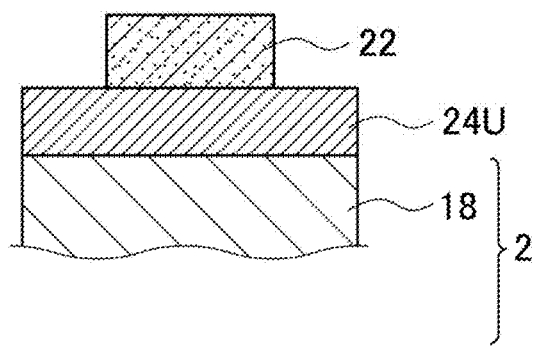
FIG. 6A is a process chart of mounting a semiconductor device on an aluminum relaxation layer, in an explanatory diagram of a pressing process of the power module according to the embodiments.
Figure 6B:
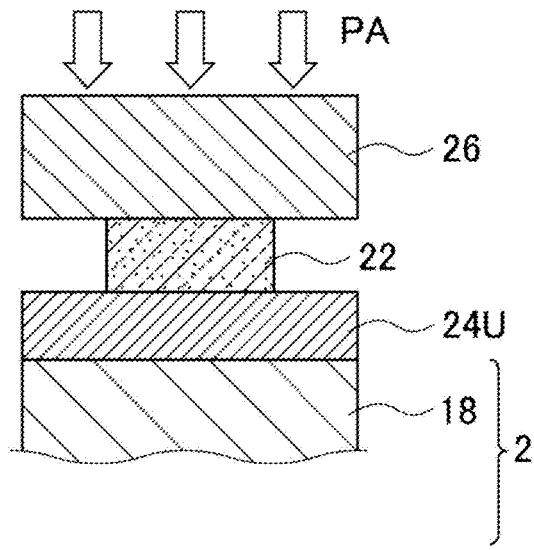
FIG. 6B is a diagram of a heating and pressurizing process, in the explanatory diagram of the pressing process of the power module according to the embodiments.
Figure 6C:
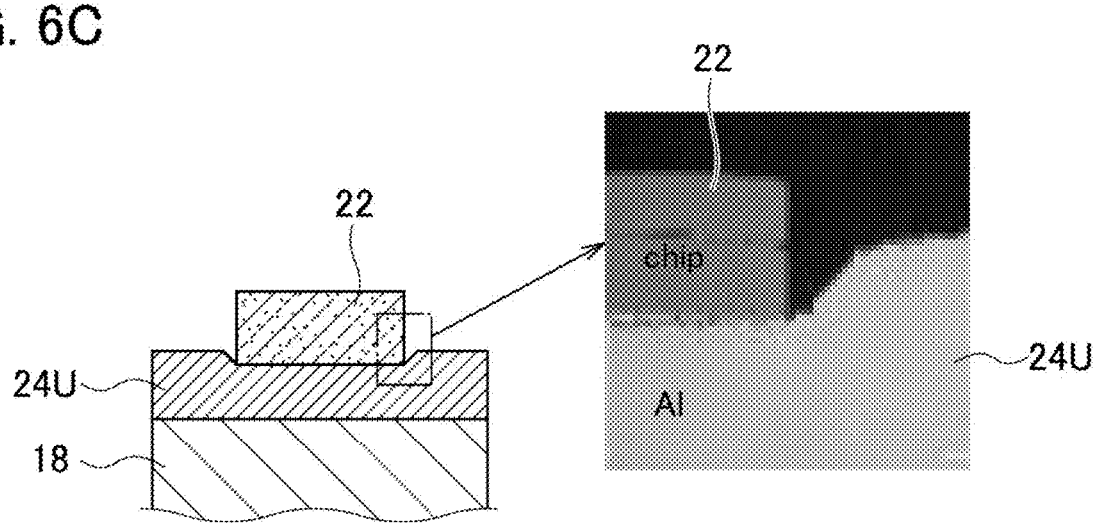
FIG. 6C is an explanatory diagram of a shape of the power module after the heating and pressurizing process, in which the semiconductor device is partly embedded in the aluminum relaxation layer.

FIG. 6A shows a process of mounting the semiconductor device 22 on the aluminum relaxation layer 24U, and FIG. 6B shows a heating and pressurizing process, in an explanatory diagram of a pressing process of the power module according to the embodiments. Moreover, FIG. 6C shows an explanatory diagram of a shape of the power module after the heating and pressurizing process, in which the semiconductor device 22 is partly embedded in the aluminum relaxation layer 24U. FIG. 6 explains a structure where the semiconductor device 22 is partly embedded in the aluminum relaxation layer 24U by performing the heating and pressurizing process in the first embodiment or the third embodiment, the plated layer 30 and the Ag fired layer 20 is omitted in FIG. 6.

(A) Firstly, as shown in FIG. 6A, the semiconductor device 22 is mounted on the aluminum relaxation layer 24U, as a chip mounting process. In this example, the aluminum relaxation layer 24U is formed on the second thick copper layer 18 of the thick copper substrate 2 by means of the bonding by rolling or the like. In addition, bonding by mans of the sputtering technology, the cold spraying technology, or the thermal spraying technology may be used, instead of the bonding by means of the above-mentioned rolling technology.

(B) Next, as shown in FIG. 6B, the above-mentioned structure is disposed on a heating apparatus (not illustrated), e.g. a heater, and the heating and pressurizing process is performed using a pressing plate 26. A heating processing temperature is approximately 300° C. to approximately 350° C., for example, and an applied pressure PA is approximately 10 MPa to pressure 80 MPa, for example.

(C) As shown in FIG. 6C, the shape after the heating and pressurizing process is a shape in which the semiconductor device 22 partly embedded in the aluminum relaxation layer 24U. Since aluminum is deformed by heating and pressurizing after the heating and pressurizing process due to rigidity (flexibility) of the material of the aluminum relaxation layer 24U, the semiconductor device including SiC has the shape of being partly embedded in the aluminum relaxation layer 24U, as shown in FIG. 6C.

Figure 7:
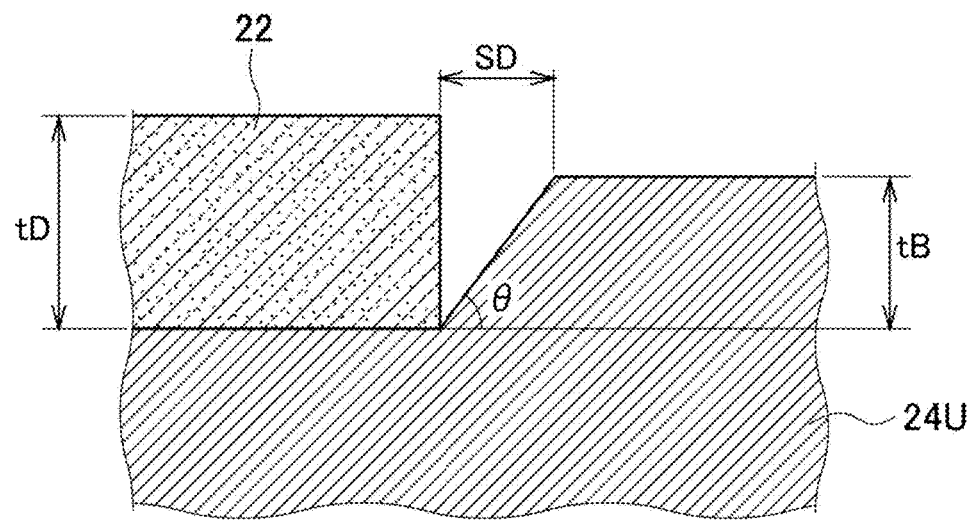
FIG. 7 is a detailed explanatory diagram of a shape in which the semiconductor device is partly embedded in the aluminum relaxation layer, in the power module according to the embodiments.

FIG. 7 shows a detailed explanatory diagram of the shape in which the semiconductor device 22 is partly embedded in the aluminum relaxation layer 24U, in the power module 1 according to the first or third embodiment. The semiconductor device 22 is embedded in the aluminum relaxation layer 24U by a pressurizing thickness tB of the first aluminum relaxation layer, with respect to a thickness tD of the semiconductor device 22. Moreover, as shown in FIG. 6C, a distance SD between a sidewall portion of the semiconductor device 22 and a trapezoidal-shaped front side surface of the aluminum mitigation layer 24U (separation distance between a front side surface of the first aluminum relaxation layer and the semiconductor device) is preferable to be approximately a creepage distance with respect to electric field intensity applied between a front side surface of the semiconductor device 22 and the aluminum relaxation layer 24U. Moreover, a taper angle θ of the trapezoidal shape portion of the aluminum relaxation layer 24U is approximately 30 degrees to approximately 60 degrees, for example.

In a fabrication method of the power modules 1A and 1B according to the comparative examples 1 and 2 formed by using the Ag fired layer 20, the bonding process is performed by a coating process of the Ag paste material on the thick copper substrate 2A and the insulating substrate 2B, a chip mounting process, a preliminary drying process, and a heating and pressurizing process. In contrast, in the fabrication method of the power module 1 according to the first or third embodiment, the bonding can be realized by the chip mounting process on thick copper substrate 2 provided with the aluminum relaxation layer 24U, and the heating and pressurizing process.

Degradation of the bonding layer is confirmed in the power modules 1A and 1B according to the comparative examples 1 and 2 formed by using the Ag fired layer 20. The degradation of the bonding layer used herein means degradation of the Ag fired layer 20. Since the coefficient of linear thermal expansion of Cu (rate of expansion of the material with respect to a temperature change) is different from that of SiC (i.e., CTE of SiC is 3 ppm/K and CTE of Cu is 16.5 ppm/K), a thermal stress is applied to the Ag fired layer 20 due to environmental temperature or heat generated from a device, and thereby degradation of the Ag fired layer 20 is observed.

In the power module according to the first to third embodiments, the thermal stress between Cu and SiC can be relaxed by the softness aluminum relaxation layer 24U. Furthermore, a structure may be accepted in which the Ag fired layer 20 is previously disposed on the aluminum relaxation layer 24U, as shown in the third embodiment.

(Thermal Cycle Test)

Figure 8:
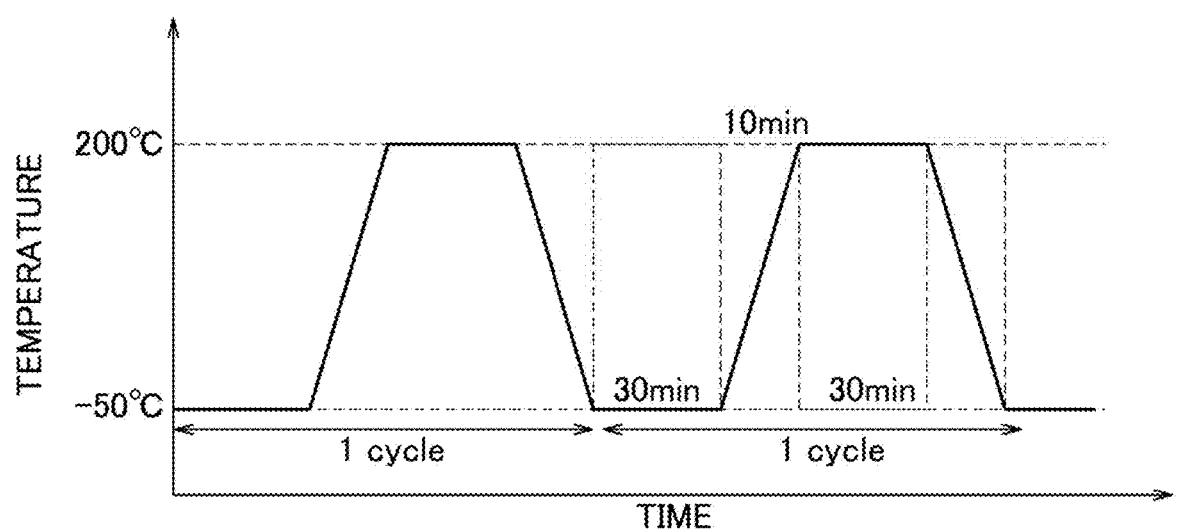
FIG. 8 shows an example of a temperature profile in a thermal cycle test, in the power module according to the embodiments.

FIG. 8 shows an example of a temperature profile in a thermal cycle test, in the power module according to the first to third embodiments. More specifically, as shown in FIG. 8, the thermal cycle test is conducted within a range from −50° C. to 200° C. The period of 1 cycle of the thermal cycle is 80 minutes, and the breakdown is as follows: 30 minutes at −50° C.; 10 minutes (heating time) from −50° C. to +200° C.; 30 minutes at +200° C.; and 10 minutes (cooling time) from +200° C. to −50° C. (refer to FIG. 8).

(Internal Observation by Means of Scanning Acoustic Tomography)

Figure 9A:
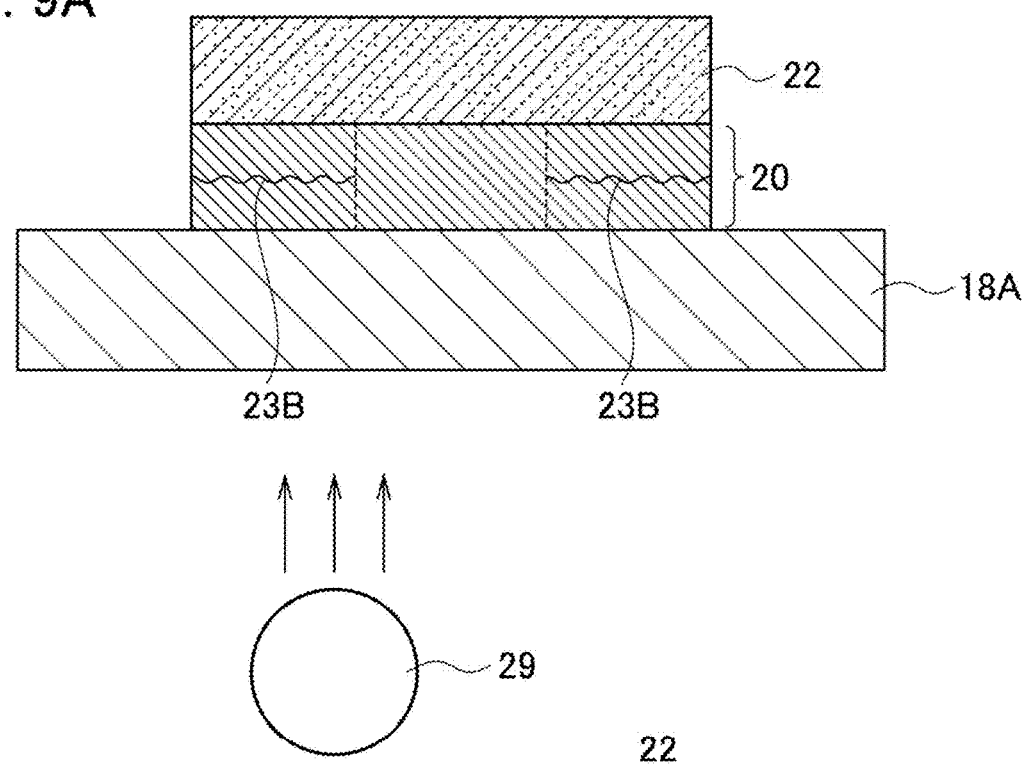
FIG. 9A is a schematic explanatory diagram showing an experimental system for internal observation by means of Scanning Acoustic Tomography (SAT).
Figure 9B:
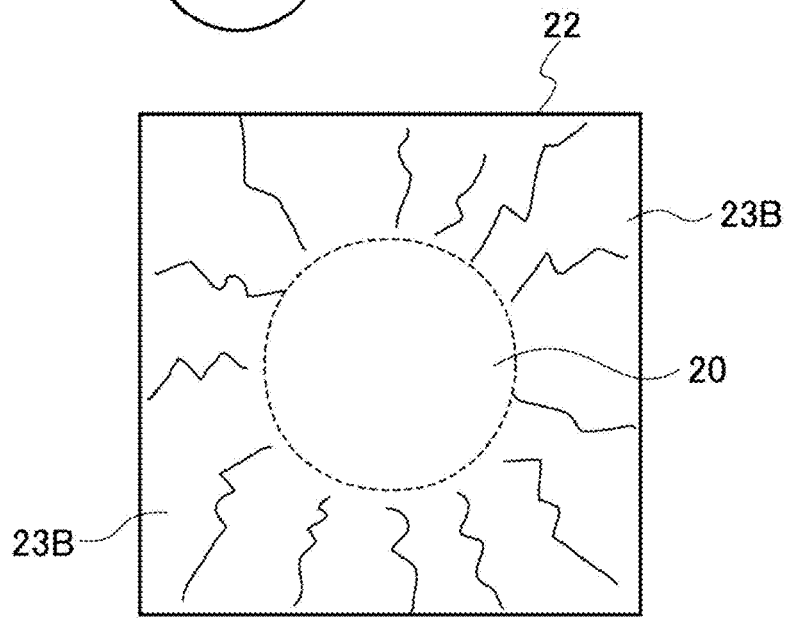
FIG. 9B is a schematic diagram of an image internally observed by means of the SAT.
Figure 9C:
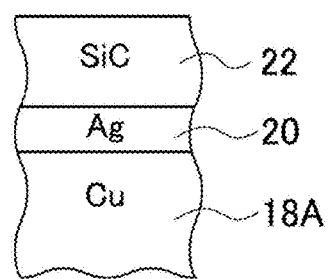
FIG. 9C is a schematic cross-sectional structure diagram showing a sample.

FIG. 9A shows a schematic explanatory diagram of an experimental system for the internal observation by means of a Scanning Acoustic Tomography (SAT), FIG. 9B shows a schematic diagram of an image internally observed, and FIG. 9C shows a schematic cross-sectional structure of a sample. FIG. 9A shows a schematic structure of the SAT experimental system for scanning the ultrasonic probe 29 to internally observe the power module according to the comparative example, the power module according to the comparative example including the thick copper layer 18A and the semiconductor device 22 formed on the thick copper layer 18A via the Ag fired layer 20 as a bonding layer.

In the power module according to the comparative example, the thermal stress is applied to the Ag fired layer 20 due to environmental temperature or heat generated from a device as shown in FIGS. 9A and 9B, a crack 23B is formed in the Ag fired layer 20, and therefore the Ag fired layer 20 is easily deteriorated.

Thick Copper Substrate: Comparative Example 1

Figure 10A:
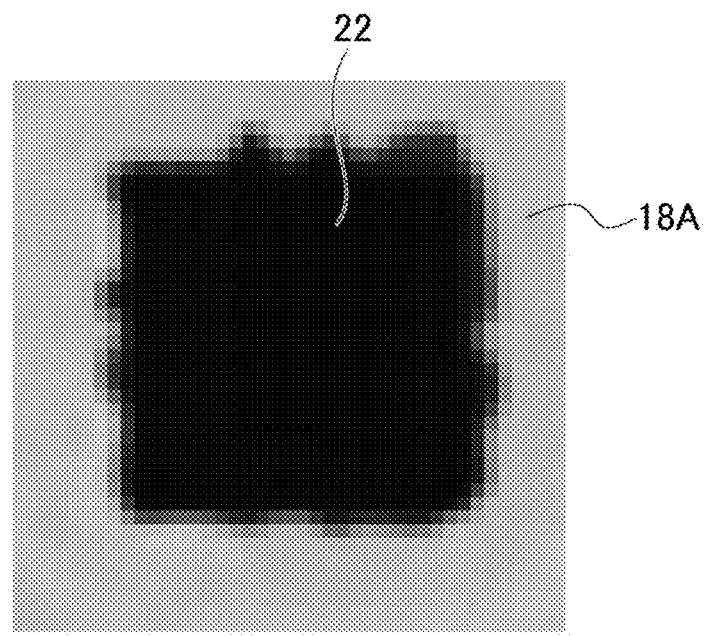
FIG. 10A shows an example of an SAT image in an initial state of a power module according a comparative example 1 in which a semiconductor device is mounted on a thick copper substrate by Ag firing.
Figure 10B:
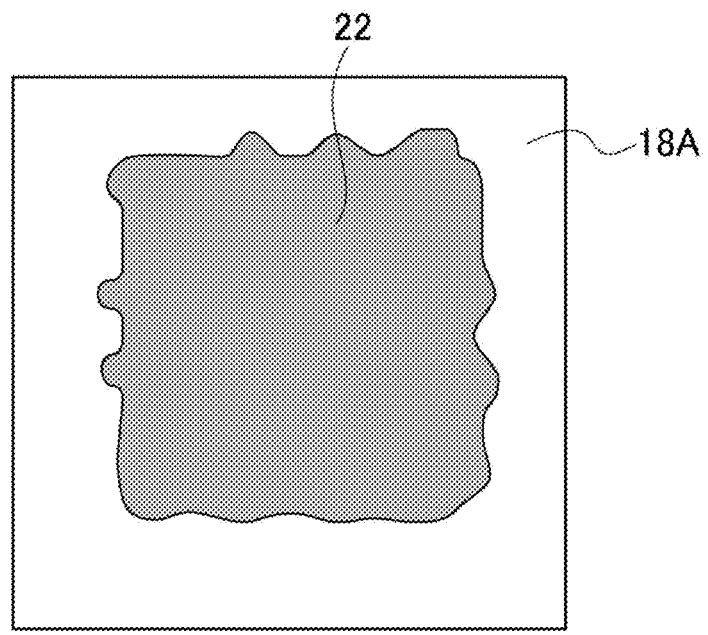
FIG. 10B is a diagram for explaining FIG. 10A.
Figure 10C:
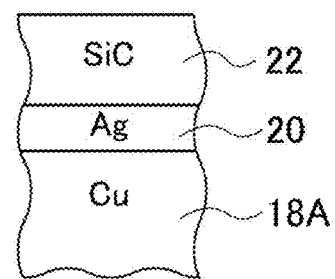
FIG. 10C is a schematic cross-sectional structure diagram showing a sample.

FIG. 10A shows an example of an SAT image in an initial state of the power module according to the comparative example 1 in which the semiconductor device 22 is mounted on the thick copper layer 18A via the Ag fired layer 20 as a bonding layer, and FIG. 10B shows a diagram for explaining FIG. 10A. Moreover, FIG. 10C shows a schematic cross-sectional structure of a sample.

Figure 11A:
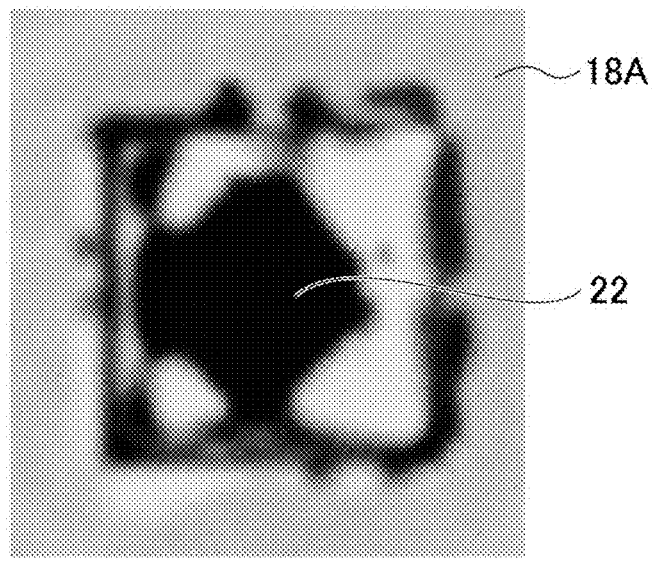
FIG. 11A shows an example of an SAT image showing degradation of a bonding layer after 200 cycles (from −50° C. to +300° C. for 30 minutes), in a diagram showing a thermal cycle test result of the power module according to the comparative example 1.
Figure 11B:
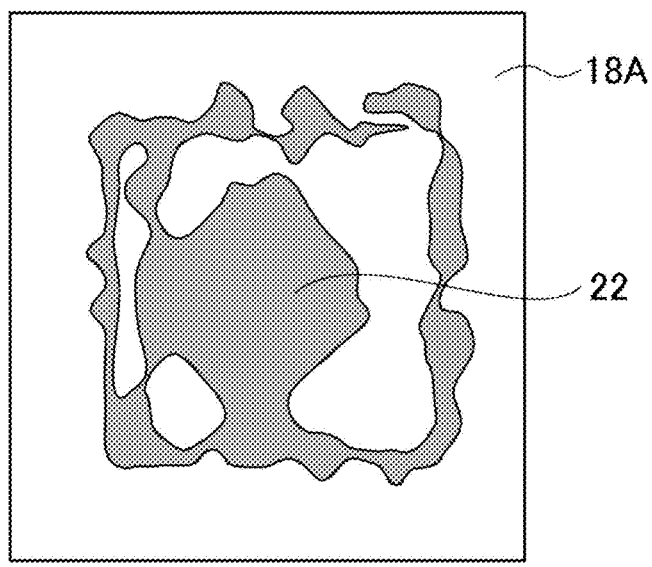
FIG. 11B is a diagram for explaining FIG. 11A.
Figure 11C:
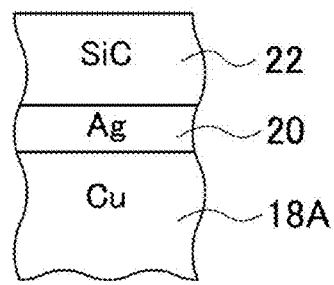
FIG. 11C is a schematic cross-sectional structure diagram showing a sample.

FIG. 11A shows an example of an SAT image showing degradation of a bonding layer after 200 cycles (from −50° C. to +300° C. for 30 minutes), in a diagram showing a thermal cycle test result of the power module according to the comparative example 1, and FIG. 11B shows a diagram for explaining FIG. 11A. FIG. 11C shows a schematic cross-sectional structure of a sample. As shown in FIGS. 11A and 11B, degradation of the bonding layer is remarkable in the thick copper substrate, as a result of the thermal cycle test after 200 cycles (from −50° C. to +300° C. for 30 minutes).

(DBA Substrate)

Figure 12A:
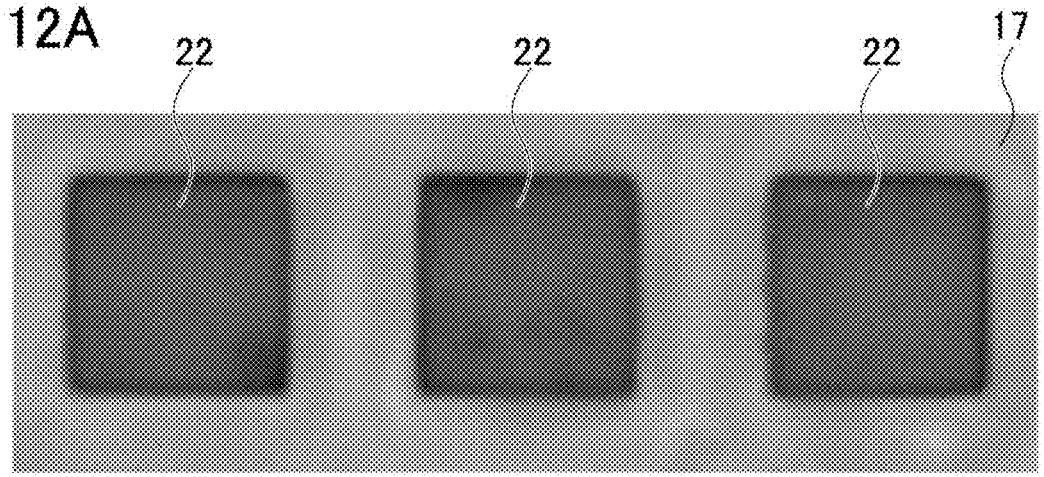
FIG. 12A shows an example of an SAT image in an initial state of the power module according to the embodiments in which a semiconductor device is mounted on a DBA substrate.
Figure 12B:
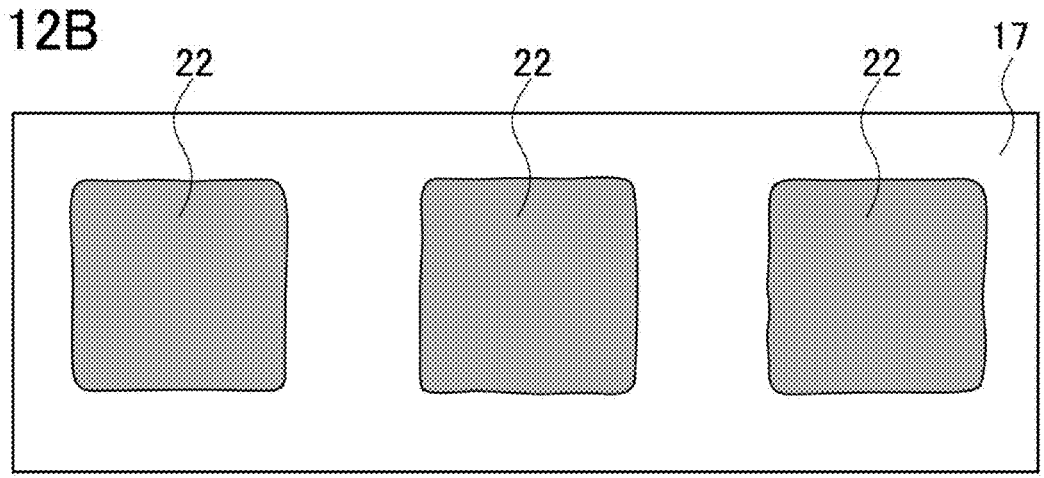
FIG. 12B is a diagram for explaining FIG. 12A.
Figure 12C:
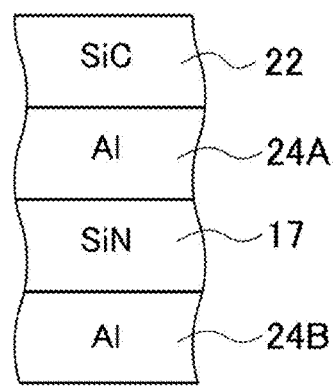
FIG. 12C is a schematic cross-sectional structure diagram showing a sample.

FIG. 12A shows an example of an SAT image in an initial state of a power module formed by using a Direct Bonded Aluminum (DBA) substrate including a ceramics substrate 17 and aluminum layers 24A and 24B respectively formed on upper and lower sides of the ceramics substrate 17 in which the semiconductor device 22 is mounted on the DBA substrate. FIG. 12B shows a diagram for explaining FIG. 12A. FIG. 12C shows a schematic cross-sectional structure of a sample. The power module structure in which the semiconductor device 22 is mounted on the DBA substrate uses the ceramics substrate 17 including the aluminum layers 24A and 24B, and a similar relaxation effect to the power module according to the embodiments is observed.

Figure 13A:
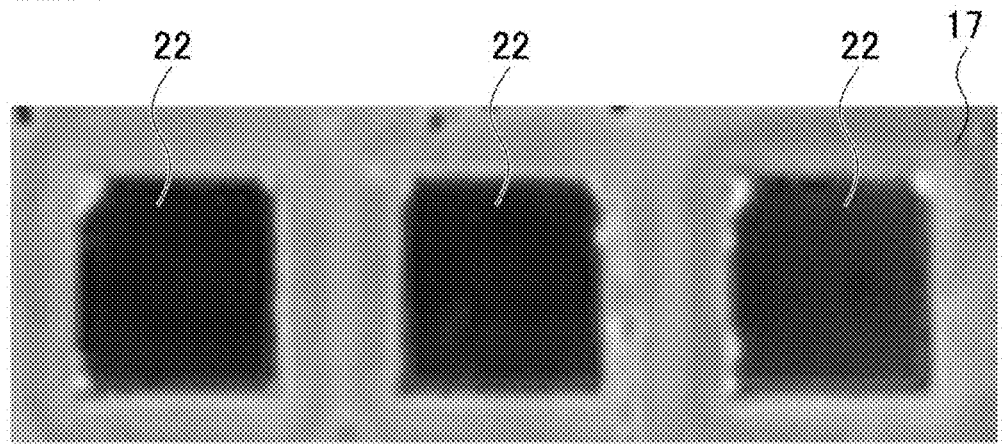
FIG. 13A shows an example of an SAT image of the power module after 200 cycles (from −50° C. to +300° C. for 30 minutes), in a diagram showing a result of the thermal cycle test of the power module according to the embodiments in which the semiconductor device is mounted on the DBA substrate.
Figure 13B:
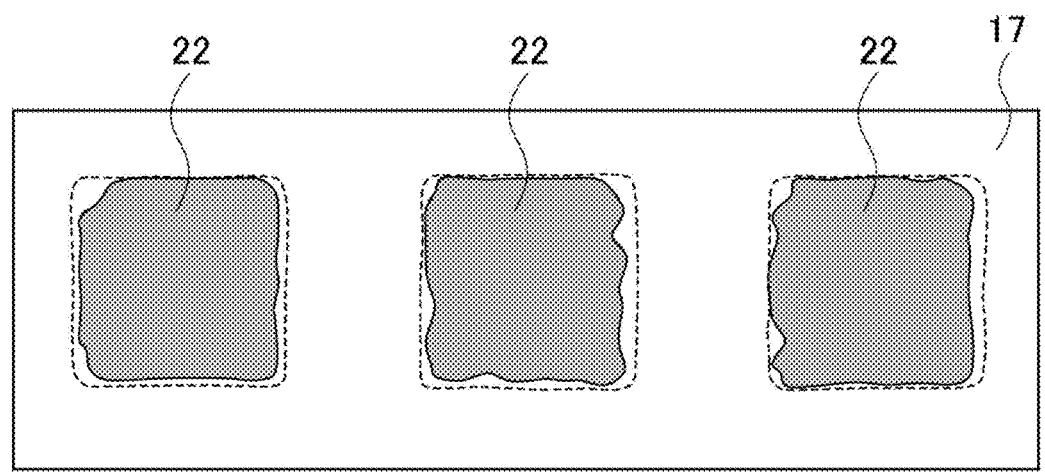
FIG. 13B is a diagram for explaining FIG. 13A.
Figure 13C:
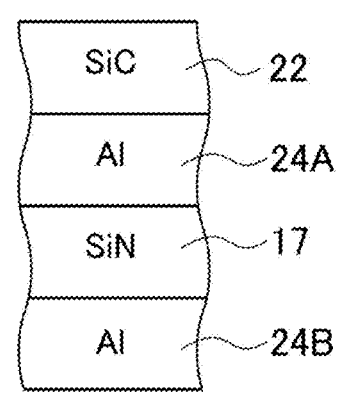
FIG. 13C is a schematic cross-sectional structure diagram showing a sample.

FIG. 13A shows an example of an SAT image of the power module after 200 cycles (from −50° C. to +300° C. for 30 minutes), in a diagram showing a result of the thermal cycle test of the power module in which the semiconductor device 22 is mounted on the DBA substrate. FIG. 13B shows a diagram for explaining FIG. 13A. FIG. 13C shows a schematic cross-sectional structure of a sample. In this case, a thickness of the aluminum layers 24A and 24B of the DBA substrate used for the experiment is approximately 0.4 mm, and a thickness of the ceramics substrate 17 thereof is approximately 0.635 mm.

As shown in FIGS. 13A and 13B, the aluminum layer 24A at the upper side of the DBA substrate functions in a similar manner as the aluminum relaxation layer 24U in the power module 1 according to the embodiments, as a result of the thermal cycle test after 200 cycles (from −50° C. to +300° C. for 30 minutes). More specifically, a similar relaxation effect to the relaxation effect by the aluminum relaxation layer 24U are observed.

Ceramics Substrate with Thick Coppers: Comparative Example 2

Figure 14A:
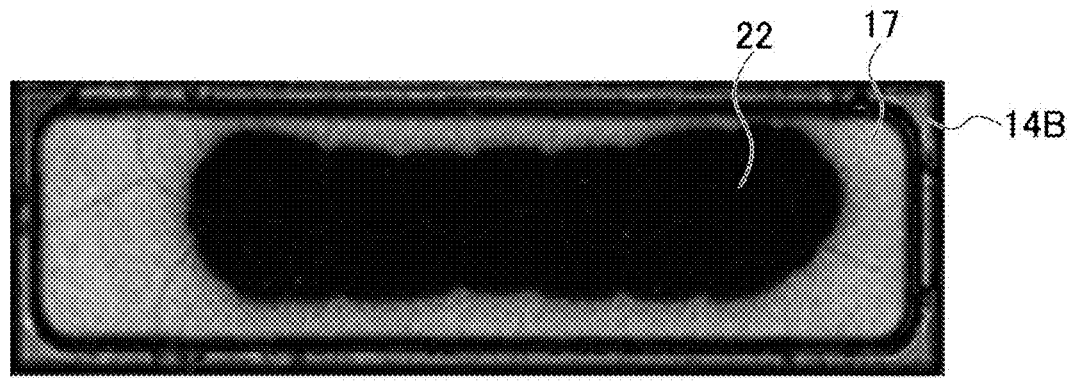
FIG. 14A shows an example of an SAT image showing degradation between Cu and SiN ceramics after 50 cycles (from −50° C. to +200° C.) of the thermal cycle test, in a power module according to a comparative example 2 formed so as to be sandwiched between thick copper layers and to mount the semiconductor device thereon.
Figure 14B:
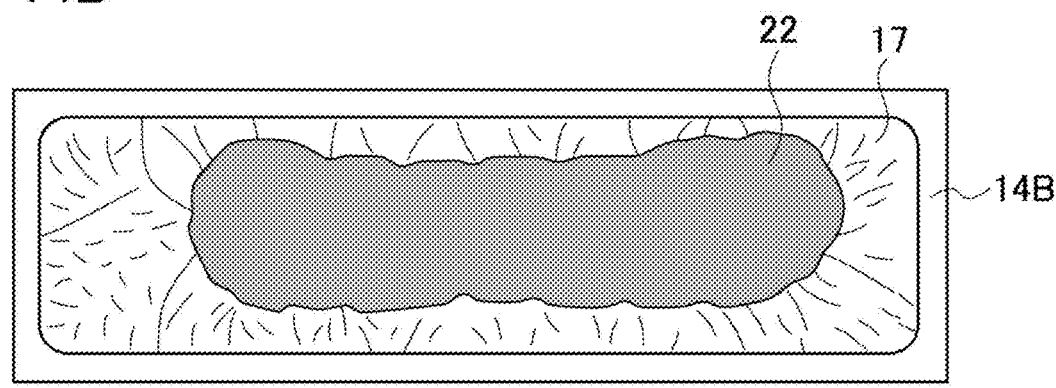
FIG. 14B is a diagram for explaining FIG. 14A.
Figure 14C:
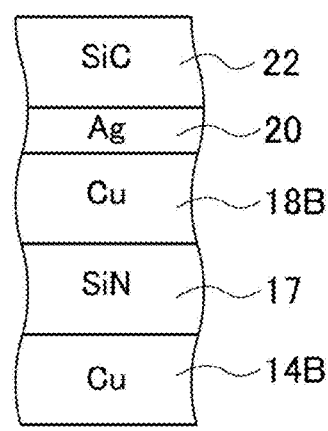
FIG. 14C is a schematic cross-sectional structure diagram showing a sample.

FIG. 14A shows an example of an SAT image showing degradation between the Cu and SiN ceramics after 50 cycles (from −50° C. to +200° C.), in the power module according to the comparative example 2 using a ceramics substrate with thick coppers including a ceramics substrate 17 and thick copper layers 14B and 18B respectively formed on upper and lower sides of the ceramics substrate 17 in which the semiconductor device 22 is mounted on the thick copper layer 18B via the Ag fired layer 20. FIG. 14B shows a diagram for explaining FIG. 14A. FIG. 14C shows a schematic cross-sectional structure of a sample.

Figure 15A:
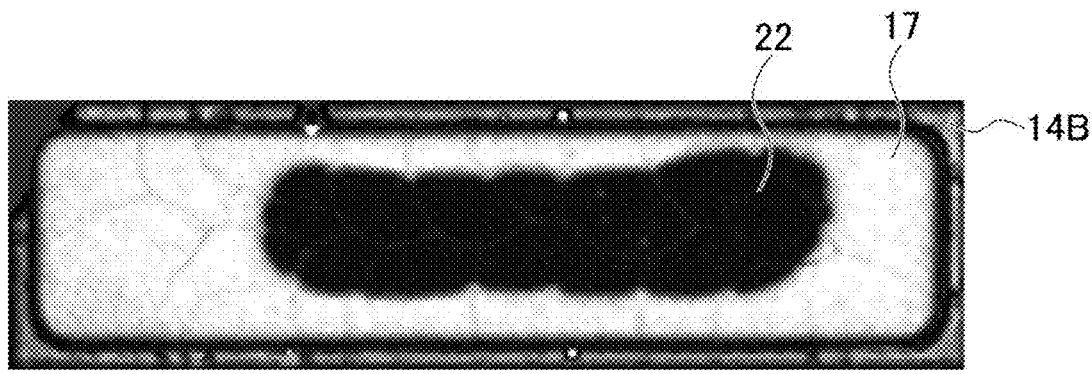
FIG. 15A shows an example of an SAT image showing degradation between the Cu and the SiN ceramics after 100 cycles (from −50° C. to +200° C.) of the thermal cycle test, in a power module according to a comparative example 2 formed so as to be sandwiched between thick copper layers and to mount the semiconductor device thereon.
Figure 15B:
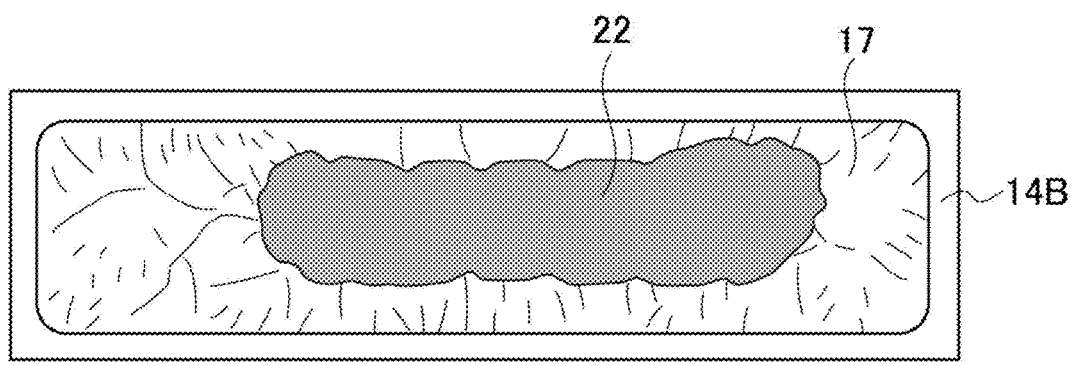
FIG. 15B is a diagram for explaining FIG. 15A.
Figure 15C:
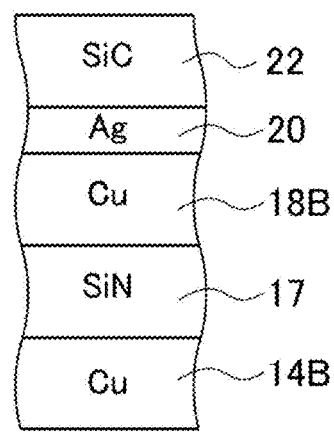
FIG. 15C is a schematic cross-sectional structure diagram showing a sample.

Moreover, FIG. 15A shows an example of an SAT image showing degradation between the Cu and SiN ceramics after 100 cycles (from −50° C. to +200° C.), in the power module according to the comparative example 2. FIG. 15B Shows a diagram for explaining FIG. 15A. FIG. 15C shows a schematic cross-sectional structure of a sample.

As shown in FIGS. 14A and 14B, and FIGS. 15A and 15B, if the ceramics substrate is formed to be sandwiched between the thick copper layers, it is observed that reliability of the ceramics substrate is reduced due to a ceramics cohesive failure, as a result of the thermal shock test (from −50° C. to +200° C.). The cohesive failure means a phenomenon in which the substance itself is broken away rather than the interface between the substance and the substance. The ceramics cohesive failure shows that the inside of SiN which is ceramics is broken.

Figure 16A:
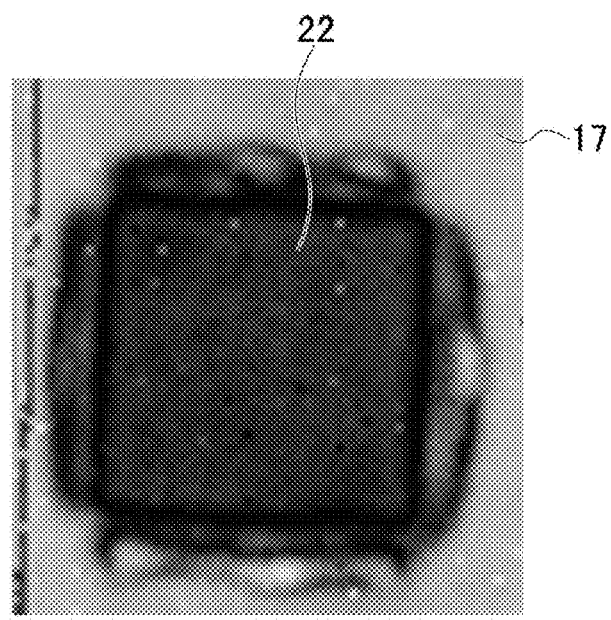
FIG. 16A shows an example of an SAT image in an initial state of the power module according to the comparative example 2 formed so as to be sandwiched between thick copper layers and to mount the semiconductor device thereon.
Figure 16B:
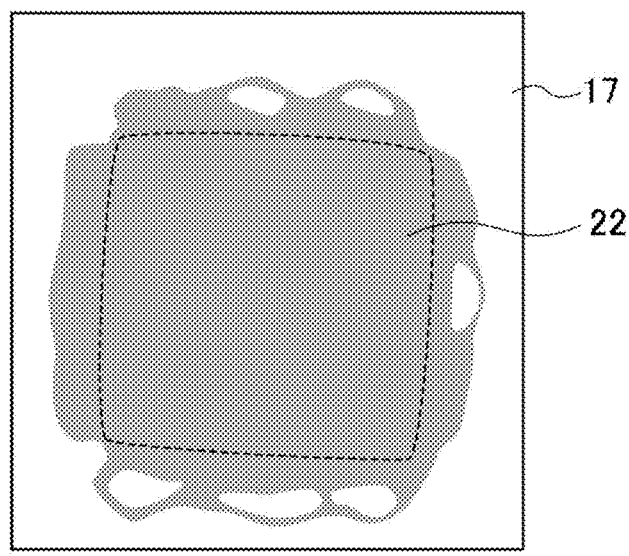
FIG. 16B is a diagram for explaining FIG. 16A.
Figure 16C:
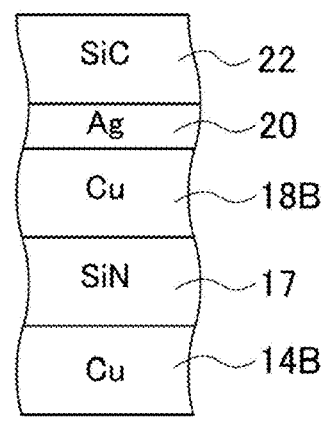
FIG. 16C is a schematic cross-sectional structure diagram showing a sample.

FIG. 16A shows an example of an SAT image in an initial state of the power module according to the comparative example 2 the power module according to the comparative example 2 formed so as to be sandwiched between the thick copper layers and to mount the semiconductor device thereon. FIG. 16B shows a diagram for explaining FIG. 16A. FIG. 16C shows a schematic cross-sectional structure of a sample.

Figure 17A:
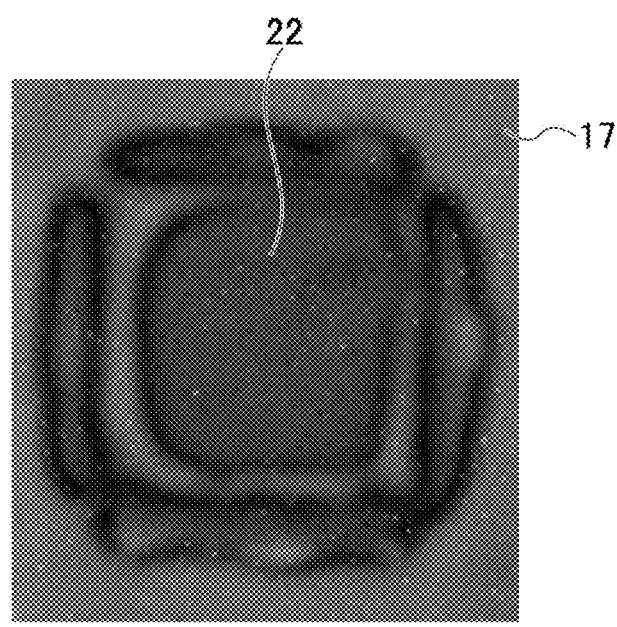
FIG. 17A shows an example of an SAT image showing degradation of a bonding layer after 200 cycles (from −50° C. to +300° C. for 30 minutes) of the thermal cycle test, in the power module according to a comparative example 2 formed so as to be sandwiched between thick copper layers and to mount the semiconductor device thereon.
Figure 17B:
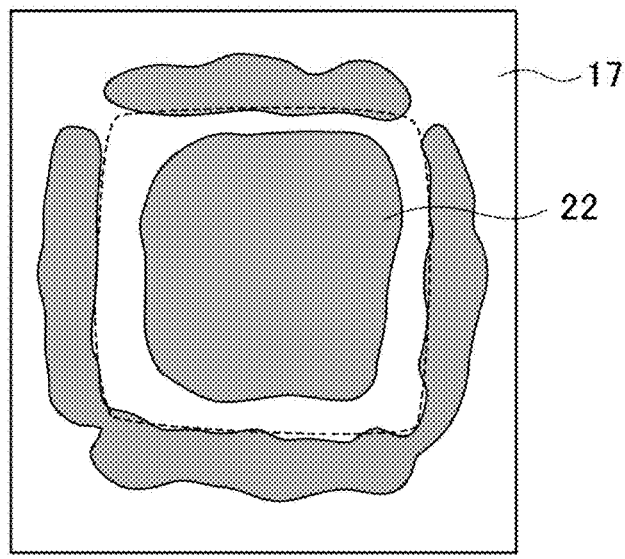
FIG. 17B is a diagram for explaining FIG. 17A.
Figure 17C:
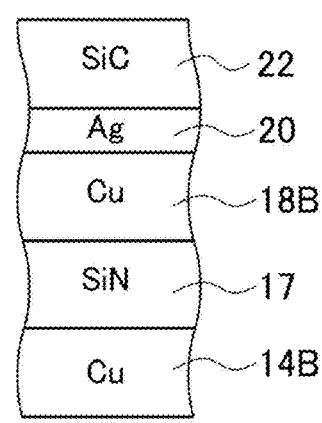
FIG. 17C is a schematic cross-sectional structure diagram showing a sample.

FIG. 17A shows an example of an SAT image showing degradation of a bonding layer after 200 cycles (from −50° C. to +300° C. for 30 minutes) of the thermal cycle test, in the power module according to a comparative example 2 formed so as to be sandwiched between the thick copper layers and to mount the semiconductor device thereon. FIG. 17B shows a diagram for explaining FIG. 17A. FIG. 17C shows a schematic cross-sectional structure of a sample.

As shown in FIGS. 16A and 16B, and FIGS. 17A and 17S, degradation of the bonding layer becomes remarkable by forming also the ceramics substrate so as to be sandwiched between the thick copper layers, as a result of 200 cycles (from −50° C. to +300° C. for 30 minutes).

The degradation of the bonding layer used herein means degradation of the Ag fired layer 20. Since the coefficient of linear thermal expansion of Cu (rate of expansion of the material with respect to a temperature change) is different from that of SiC (i.e., CTE of SiC is 3 ppm/K and CTE of Cu is 16.5 ppm/K), a thermal stress is applied to the Ag fired layer 20 due to environmental temperature or heat generated from a device, and thereby degradation of the Ag fired layer 20 is observed.

In the power module according to the first to third embodiments, the thermal stress between Cu and SiC can be relaxed by the softness aluminum relaxation layer 24U.

(Thermal Resistance Simulation)

Figure 18:
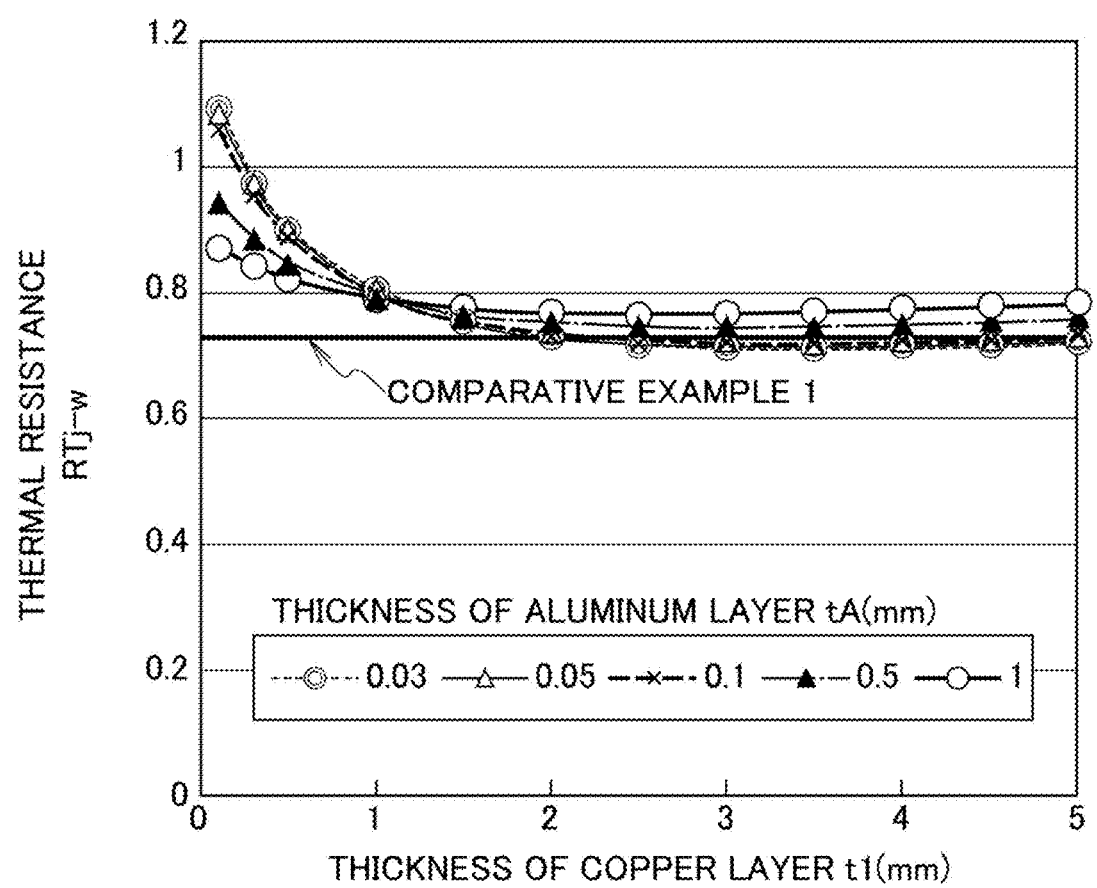
FIG. 18 shows a simulation result of a relationship between a thermal resistance RTj-w and a thickness t1 of a copper layer, using a thickness tA of an aluminum relaxation layer as a parameter, in the power module according to the embodiments.
Figure 19:
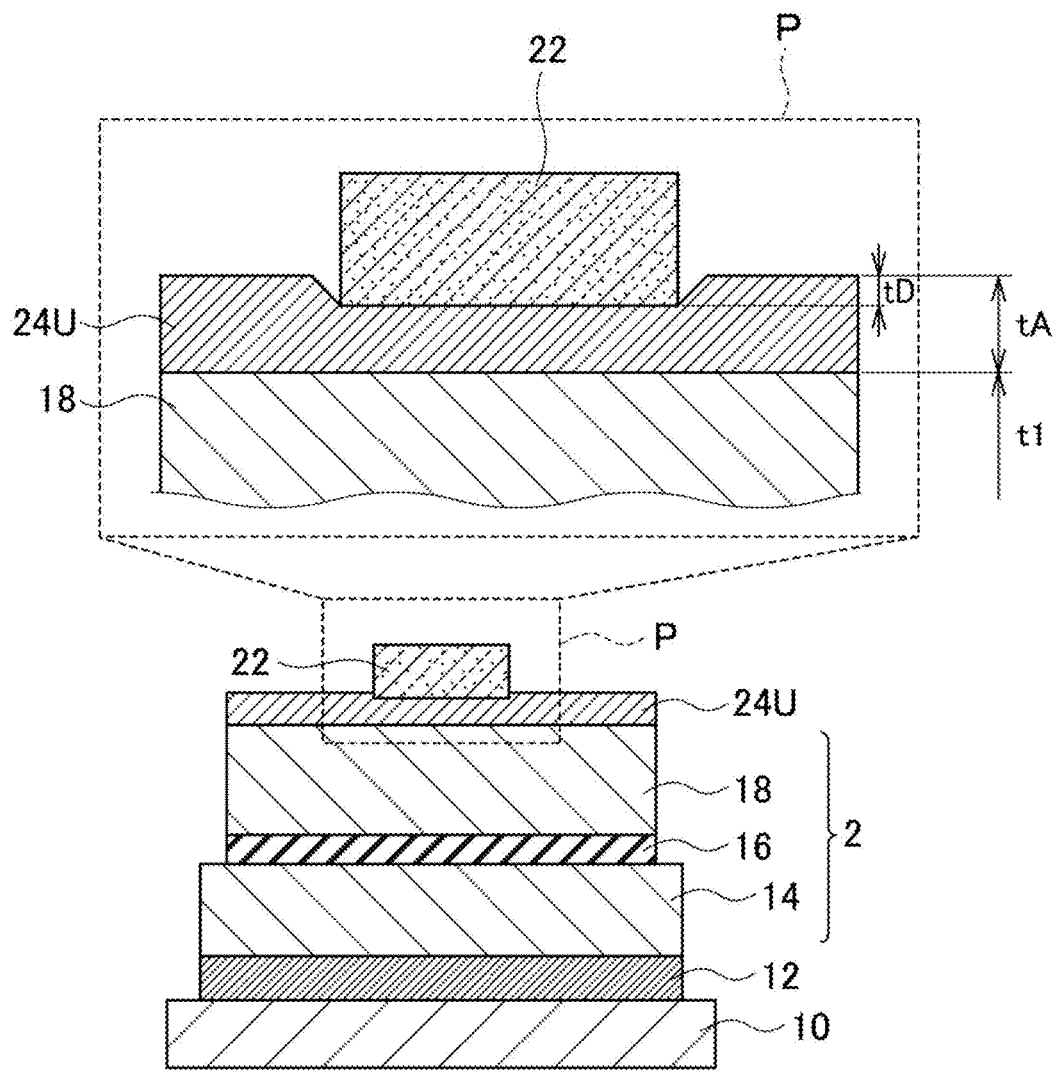
FIG. 19 is a diagram for explaining simulation conditions of the thickness tA of the aluminum relaxation layer and the thickness t1 of the copper layer, in the power module according to the embodiments.
Figure 20:
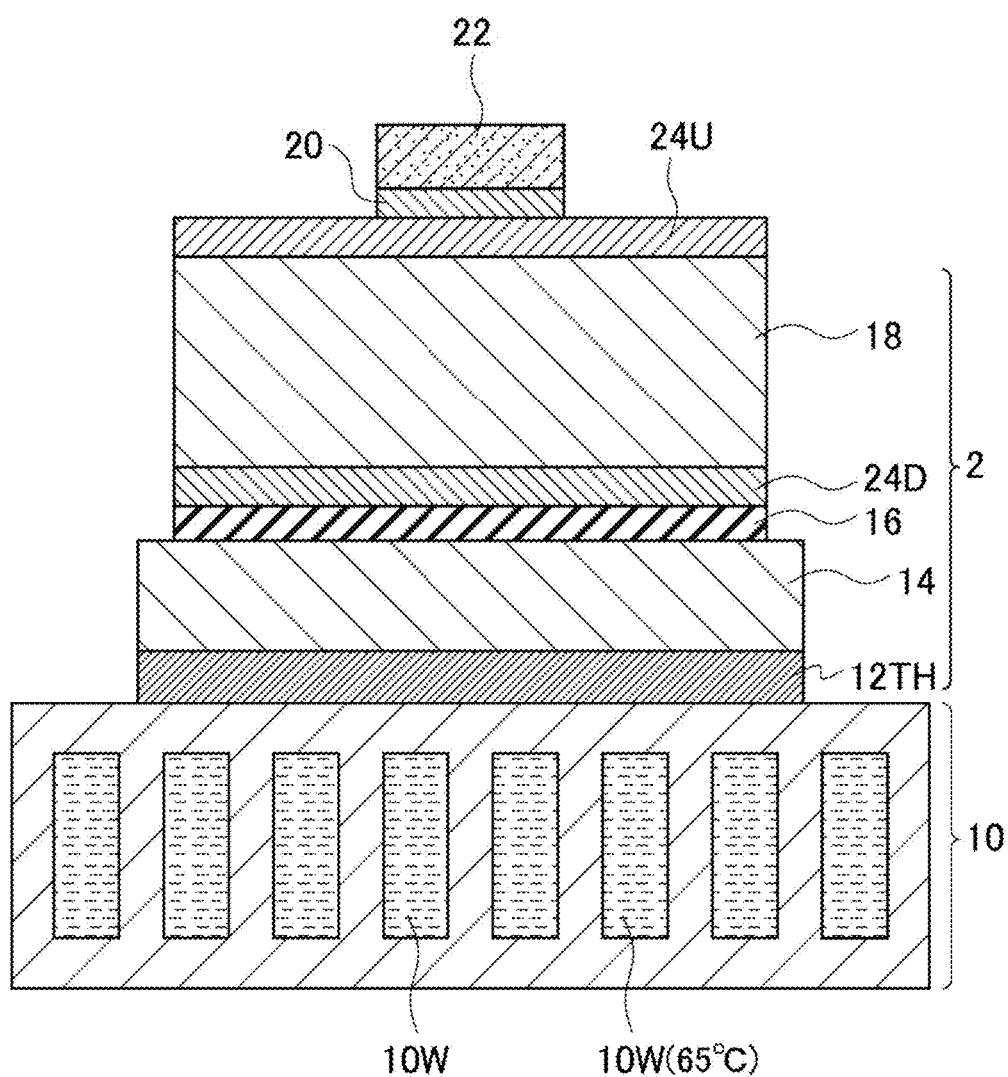
FIG. 20 is a diagram for explaining the simulation conditions of the thermal resistance RTj-w in the power module according to the embodiments, showing a schematic cross-sectional structure diagram of the power module according to the embodiments which can be mounted on a cooling apparatus (configuration example 1).

FIG. 18 shows a simulation result of a relationship between a thermal resistance RTj-w and a thickness t1 of the second thick copper layer 18, using a thickness tA of the aluminum relaxation layer 24U as a parameter, in the power module according to the first embodiment. FIG. 19 shows a diagram for explaining simulation conditions of the thickness tA of the aluminum relaxation layer 24U and the thickness t1 of the second thick copper layer 18, in the power module according to the first embodiment, and FIG. 20 shows a diagram for explaining simulation conditions of thermal resistance RTj-w. The plated layer 30 is not illustrated in FIG. 19. Moreover, although FIG. 20 illustrates an example of mounting the power module 1 according to the third embodiment on a water-cooling type cooling apparatus 10, the power module 1 according to the first to second embodiments can also be mounted on the water-cooling type cooling apparatus 10 in the same manner as FIG. 20.

In the thermal resistance simulation result, as boundary conditions, a back-side surface temperature is 65° C., coefficient of heat transfer is 5000 (W/m²K), and the thickness tA of the aluminum relaxation layer 24U is 0.03 mm, 0.05 mm, 0.1 mm, 0.5 mm, and 1 mm.

It is assumed that the back-side surface temperature of 65° C. is to be kept at 65° C. with respect to a lower-layer surface of a cooling apparatus 10, as the boundary conditions. Since it is a water cooled type, the coefficient of heat transfer is set as 5000 (W/m²K). More specifically, as shown in FIG. 20, as coolant water 10 W used in the cooling apparatus 10 made by aluminum, a temperature of the coolant water 10 W is fixed to 65° C. The coefficient of heat transfer is ease of being transferred of heat which passes through a contact surface between two substances, and the coefficient of heat transfer is different from a thermal conductivity.

In the thermal resistance simulation, for the structure including the SiC semiconductor device 22/the aluminum relaxation layer 24U/the second thick copper layer 18/the insulating sheet layer 16/the first thick copper layer 14/the SnAgCu soldering layer 12/the aluminum cooling apparatus 10; it is calculated as the thickness of the SiC semiconductor device 22=at 350 μm/the thickness to of the aluminum relaxation layer 24U is set from the parameter/the thickness t1 of the second thick copper layer 18 is set from the parameter/the thickness of the insulating sheet layer 16=0.1 mm/the thickness t2 of the first thick copper layer 14=0.3 mm/the thickness of the SnAgCu soldering layer 12=0.2 mm/the thickness of the aluminum cooling apparatus 10=1 mm.

In the comparative example 1, for the structure including the SiC semiconductor device 22/the Ag fired layer 20/the second thick copper layer 18A/the insulating sheet layer 16/the first thick copper layer 14A/the SnAgCu soldering layer 12/the aluminum cooling apparatus 10; it is calculated as the thickness of the SiC semiconductor device 22=at 350 μm/the thickness of the Ag fired layer 20=60 μm/the thickness of the second thick copper layer 18A=3 mm/the thickness of the insulating sheet layer 16A=0.1 mm/the thickness of the first thick copper layer 14=0.3 mm/the thickness of the SnAgCu soldering layer 12=0.2 mm/the thickness of the aluminum cooling apparatus 10=1 mm.

Thermal resistance RTj-w (° C./W) indicates a thermal resistance between Tj (junction temperature) of the SiC semiconductor device 22 and Tw (temperature of cooling water).

In the power module according to the first embodiment, the thermal resistance equivalent to that of the comparative example 1 can be obtained by adjusting the thickness to of the aluminum relaxation layer 24U and the thickness t1 of the second thick copper layer 18. In this case, the structure of the comparative example 1 corresponds to the structure including the thick copper and the insulation layer as shown in FIG. 5A.

In the power module according to the first embodiment, the thickness t1 of the second thick copper layer 18 is preferably within a range of 1 mm to 3 mm, as a result of the thermal resistance simulation.

Moreover, in the power module according to the first embodiment, the thickness of the aluminum relaxation layer 24U is preferably within a range of 0.01 mm to 0.5 mm, as the result of the thermal resistance simulation.

In the simulation, although the thickness of the first thick copper layer 14 is calculated so as to be fixed to approximately 0.3 mm, for example, the optimum value thereof is within a range of 1 mm to 2 mm.

Example of Embedding after Solid Phase Diffusion Bonding

With regard to the embedding of the semiconductor device 22 in the aluminum relaxation layer 24 after forming the solid phase diffusion bonding, a sample of being bonded on the DEA substrate by changing an applied pressure in the case of the process will now be explained as an example.

Figure 21A:
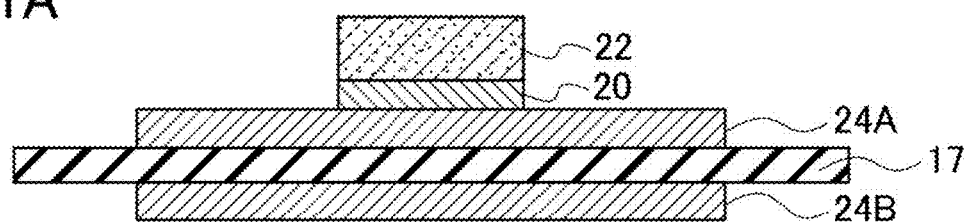
FIG. 21A is a schematic cross-sectional structure diagram of a power module in which a semiconductor device is formed on a DBA substrate via an Ag fired layer.
Figure 21B:
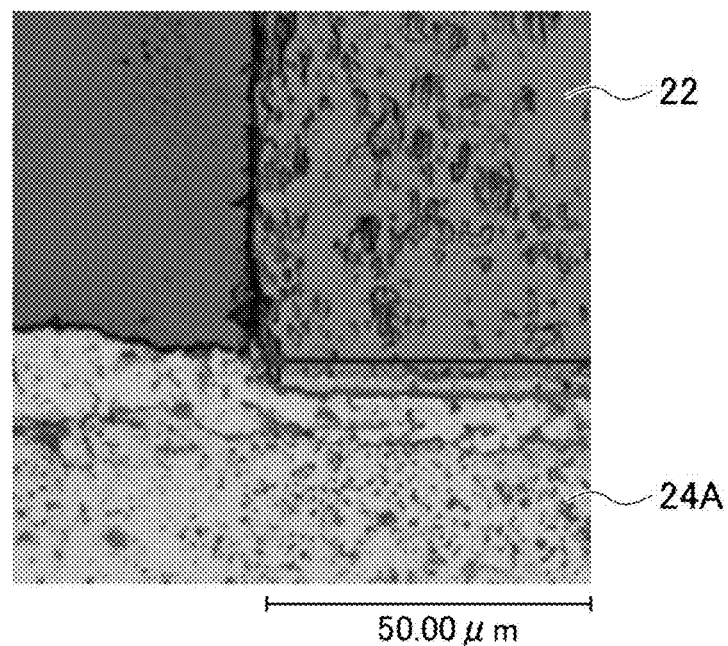
FIG. 21B shows an example of a cross-sectional microphotograph of a bonded portion between the semiconductor device/the Ag fired layer/the Al layer (applied pressure is 22 MPa).
Figure 21C:
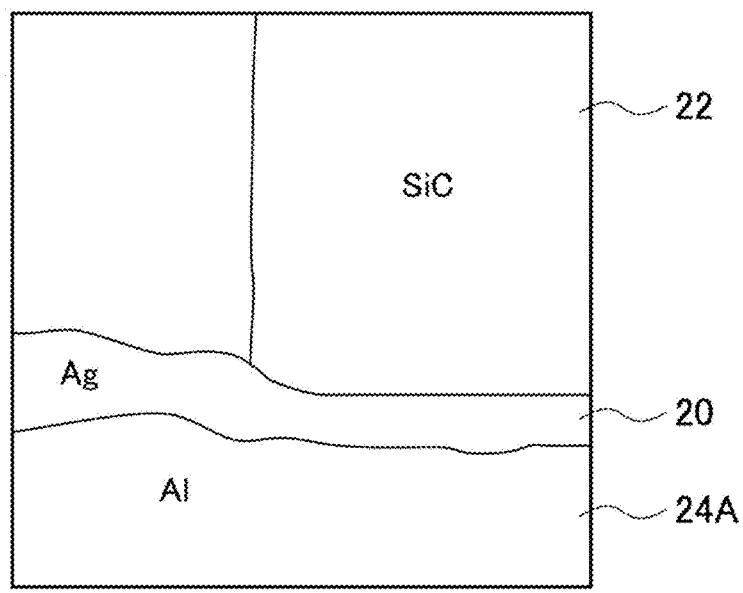
FIG. 21C is a diagram for explaining FIG. 21B.

FIG. 21A shows a schematic cross-sectional structure of a power module in which the semiconductor device 22 is formed on the DBA substrate (Al/SiN/Al) via the Ag fired layer 20, FIG. 21B shows an example of a cross-sectional microphotograph of a bonded portion between the semiconductor device 22/the Ag fired layer 20/Al layer 24A (applied pressure is 22 MPa), and FIG. 21C shows a diagram for explaining FIG. 21B.

Figure 22A:
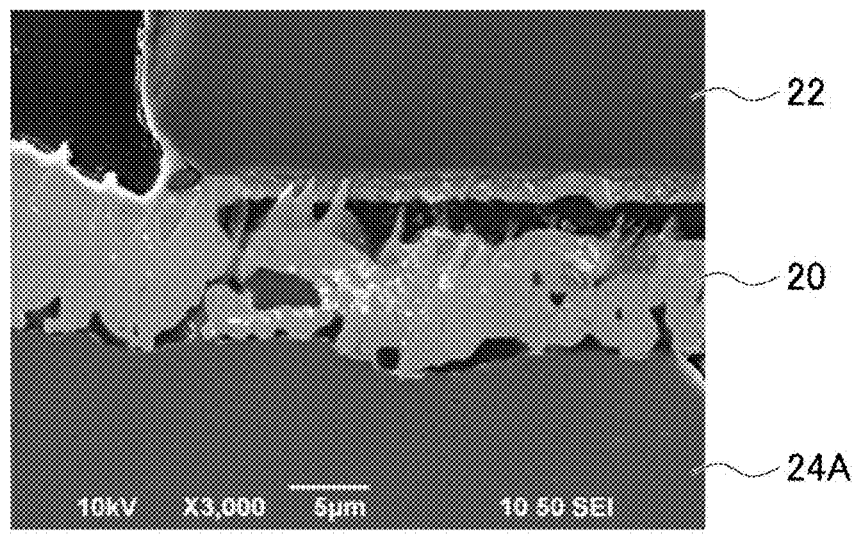
FIG. 22A shows an example of a cross-sectional SEM photograph of the bonded portion between the semiconductor device/the Ag fired layer/the Al layer (applied pressure is 22 MPa), in the power module corresponding to FIG. 21.
Figure 22B:
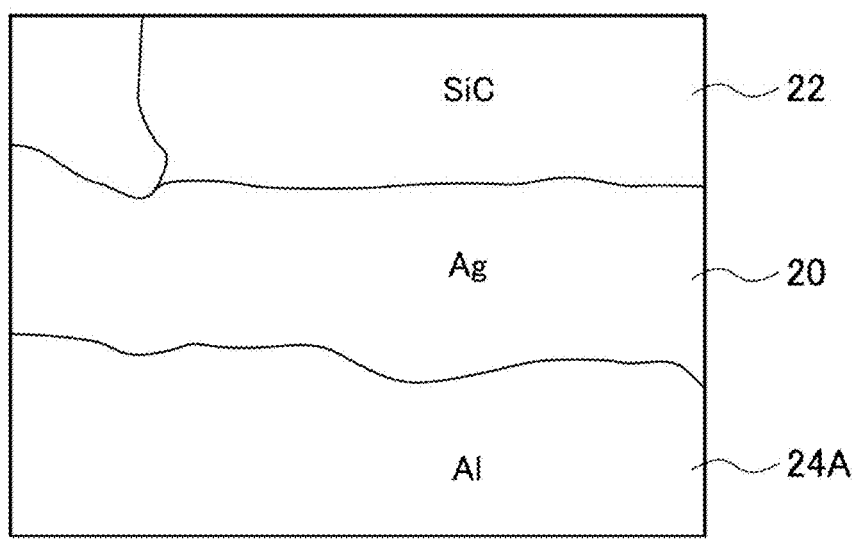
FIG. 22B is a diagram for explaining FIG. 22A.

Moreover, FIG. 22A shows an example of a cross-sectional SEM photograph of the bonded portion between the semiconductor device 22/the Ag fired layer 20/the Al layer 24A (applied pressure is 22 MPa), in the power module corresponding to FIG. 21, and FIG. 22B shows a diagram for explaining FIG. 22A. In the examples shown in FIGS. 21 and 22, the applied pressure is 22 MPa and the amount of embedding equal to or less than approximately 10 μm is observed.

Figure 23A:
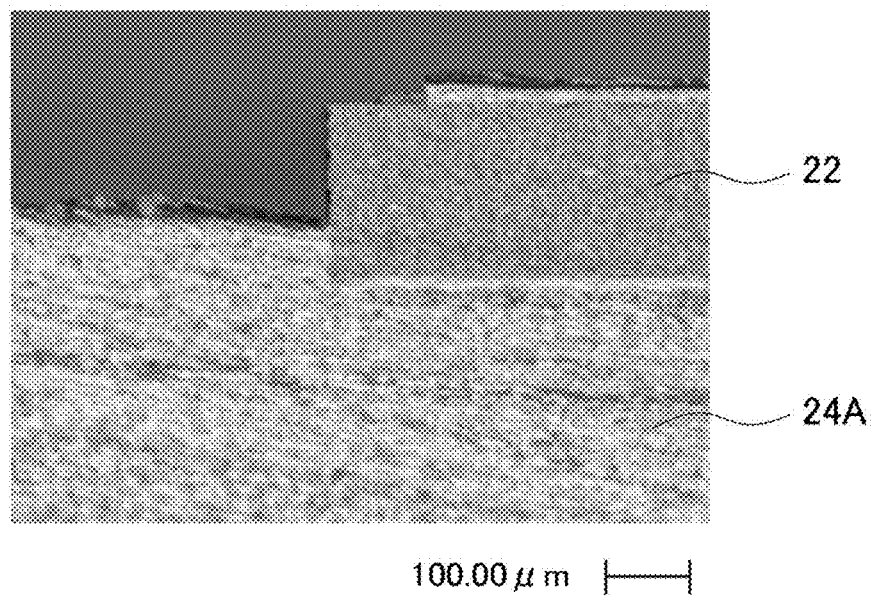
FIG. 23A shows an example of a cross-sectional microphotograph of the bonded portion between the semiconductor device/the Ag fired layer/the Al layer (applied pressure is 38 MPa), in the power module in which the semiconductor device is formed on the DEA substrate via the Ag fired layer.
Figure 23B:
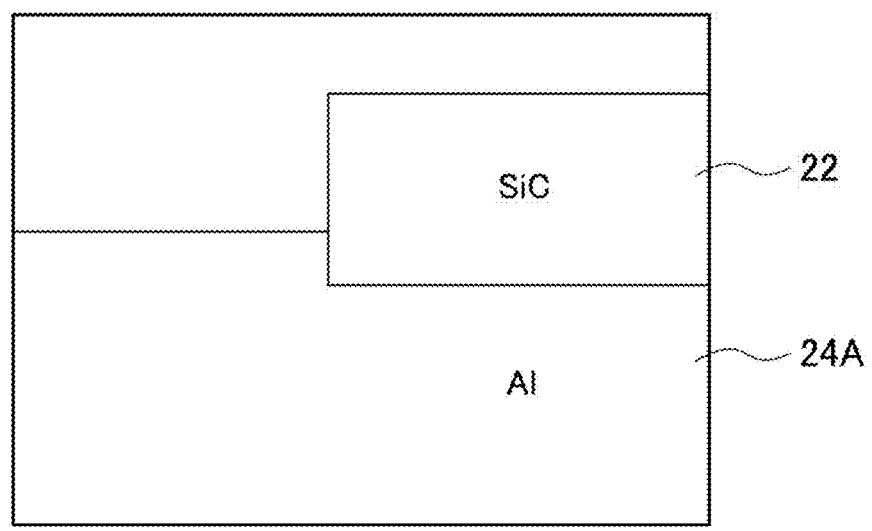
FIG. 23B is a diagram for explaining FIG. 23A.

FIG. 23A shows an example of a cross-sectional microphotograph of a bonded portion between the semiconductor device 22/the Ag fired layer 20/the Al layer 24A (applied pressure is 38 MPa), in a power module in which the semiconductor device 22 is formed on the DBA substrate (Al/SiN/Al) via the Ag fired layer 20. FIG. 23B shows a diagram for explaining FIG. 23A. In the example shown in FIG. 23, the applied pressure is 38 MPa and the amount of embedding of approximately 50 μm to approximately 60 μm is observed.

Figure 24A:
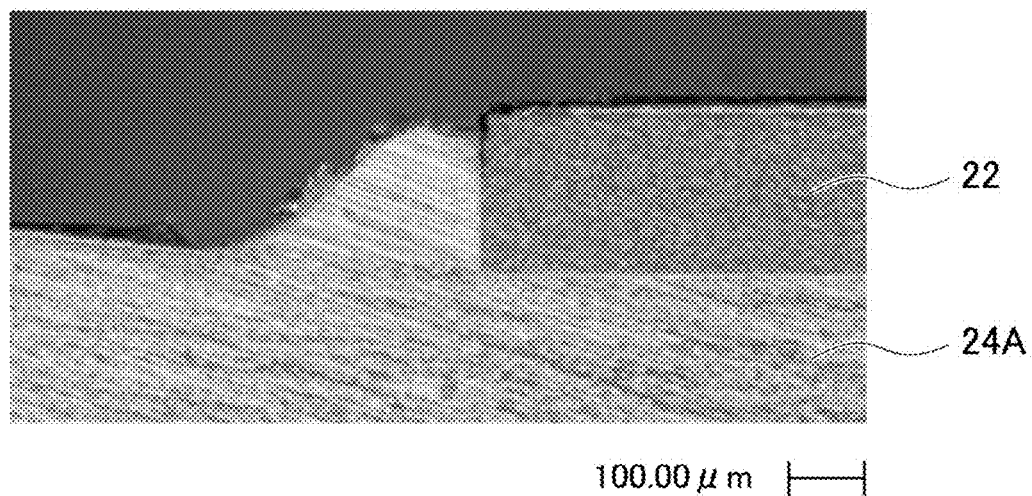
FIG. 24A shows an example of a cross-sectional microphotograph of the bonded portion between the semiconductor device/the Ag fired layer/the Al layer (applied pressure is 86 MPa), in the power module in which the semiconductor device is formed on the DBA substrate via the Ag fired layer.
Figure 24B:
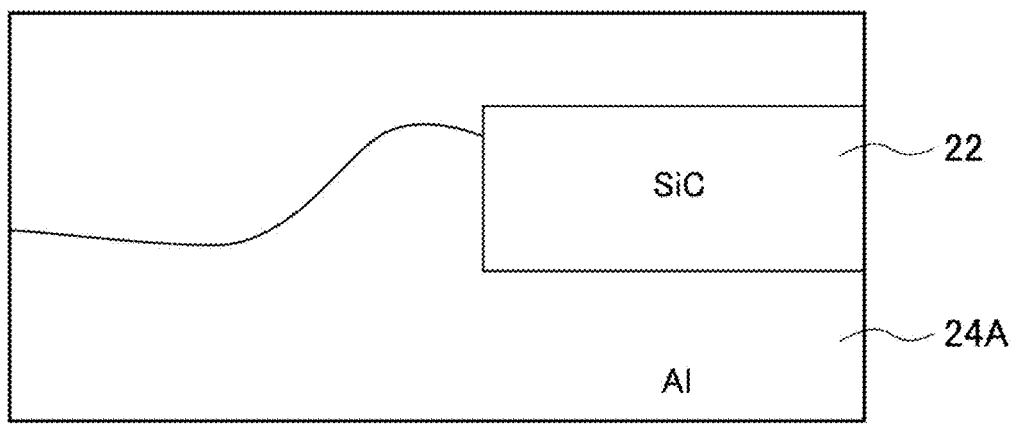
FIG. 24B is a diagram for explaining FIG. 24A.

FIG. 24A shows an example of a cross-sectional microphotograph of a bonded portion between the semiconductor device 22/the Ag fired layer 20/the Al layer 24A (applied pressure is 86 MPa), in a power module in which the semiconductor device 22 is formed on the DBA substrate (Al/SiN/Al) via the Ag fired layer 20. FIG. 24B shows a diagram for explaining FIG. 24A. In the example shown in FIG. 24, the applied pressure is 86 MPa and the amount of embedding of approximately 50 μm to approximately 60 μm is observed. Although the raised structure of Al layer 24A is observed at a sidewall portion of the semiconductor device 22 in the example shown in FIG. 24, the amount of the embedding in comparison with the flat portion is approximately 50 μm to about 60 μm Examples of Mounting of Cooling Apparatus Configuration Example 1

A shown in FIG. 20, a power module according to the third embodiment (configuration example 1) which can be mounted on a cooling apparatus 10 includes the cooling apparatus 10, and a first thermal compound layer 12TH disposed on the cooling apparatus 10. In this case, the thick copper substrate 2 is disposed the on the cooling apparatus 10 via the first thermal compound layer 12TH. Other configurations are the same as those of the power module according to the third embodiment shown in FIG. 4A. Alternatively, the power module may include a soldering layer, an Ag fired layer, or a diffusion bonding layer instead of the first thermal compound layer 12TH, and the thick copper substrate 2 may be disposed on the cooling apparatus 10 via any one of the soldering layer, the Ag fired layer or the diffusion bonding layer.

The power module according to the third embodiment (configuration example 1) which can be mounted on the cooling apparatus 10 may further include a second aluminum relaxation layer 24D disposed so as to be opposed to the first aluminum relaxation layer 24U and to sandwich the second thick copper layer 18 therebetween, as shown in FIG. 20. In addition, although the configuration example 1 discloses the example of the water-cooling type, an air-cooling type may be adopted thereinto. Moreover, also in the configuration example 1, the power module to be mounted thereon may be the power module according to the modified example of the third embodiment. Moreover, in the configuration example 1, the power module to be mounted on the cooling apparatus 10 may be the power module according to first or second embodiment or the modified example thereof.

Configuration Example 2

Figure 25:
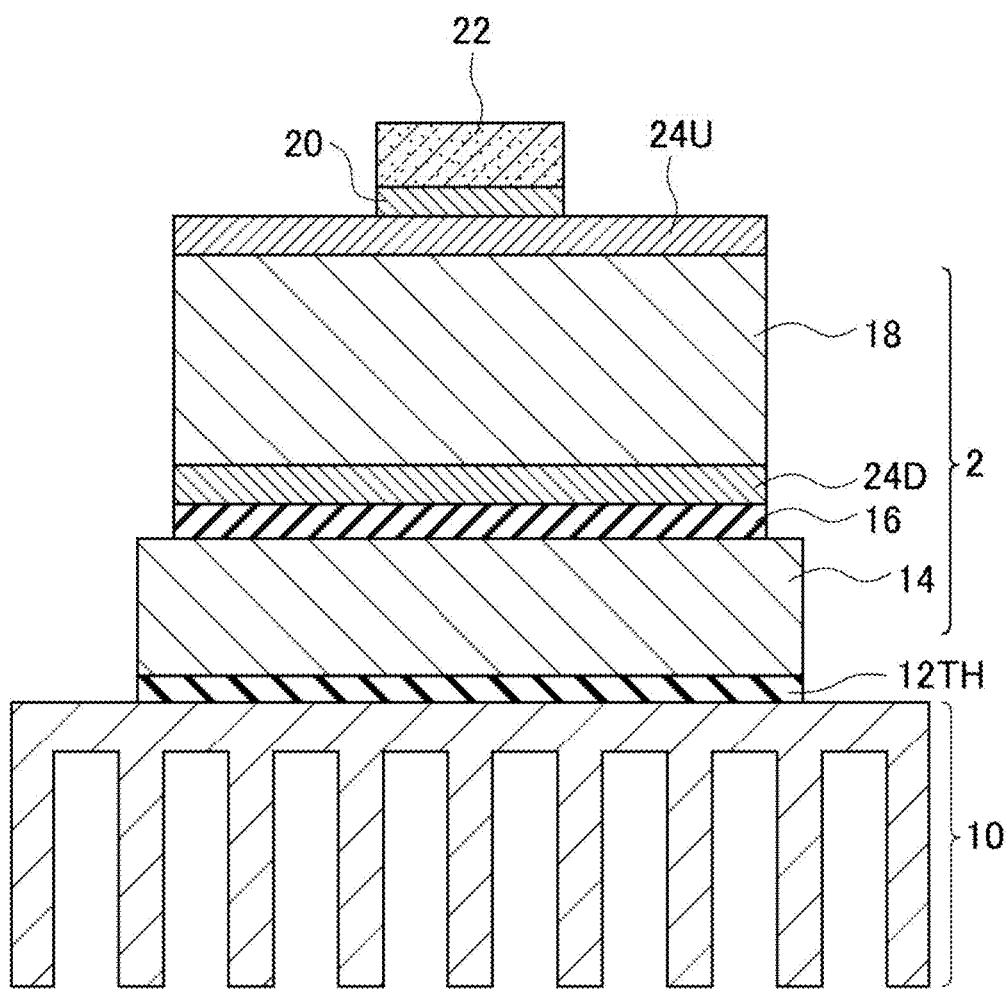
FIG. 25 is a schematic cross-sectional structure diagram showing a power module (configuration example 2) according to the embodiments which can be mounted on a cooling apparatus.

A shown in FIG. 25, a power module according to the third embodiment (configuration example 2) which can be mounted on a cooling apparatus 10 includes the cooling apparatus 10, and a first thermal compound layer 12TH disposed on the cooling apparatus 10. In this case, the thick copper substrate 2 is disposed the on the cooling apparatus 10 via the first thermal compound layer 12TH. Other configurations are the same as those of the power module according to the third embodiment shown in FIG. 4A.

The power module according to the third embodiment (configuration example 2) which can be mounted on the cooling apparatus 10 may further include a second aluminum relaxation layer 24U disposed so as to be opposed to the first aluminum relaxation layer 24U and to sandwich the second thick copper layer 18 therebetween, as shown in FIG.

25. In addition, although the configuration example 2 discloses the example of the air-cooling type, a water-cooling type may be adopted thereinto. Moreover, also in the configuration example 2, the power module to be mounted thereon may be the power module according to the modified example of the third embodiment. Moreover, in the configuration example 2, the power module to be mounted on the cooling apparatus 10 may be the power module according to first or second embodiment or the modified example thereof.

Configuration Example 3

Figure 26:
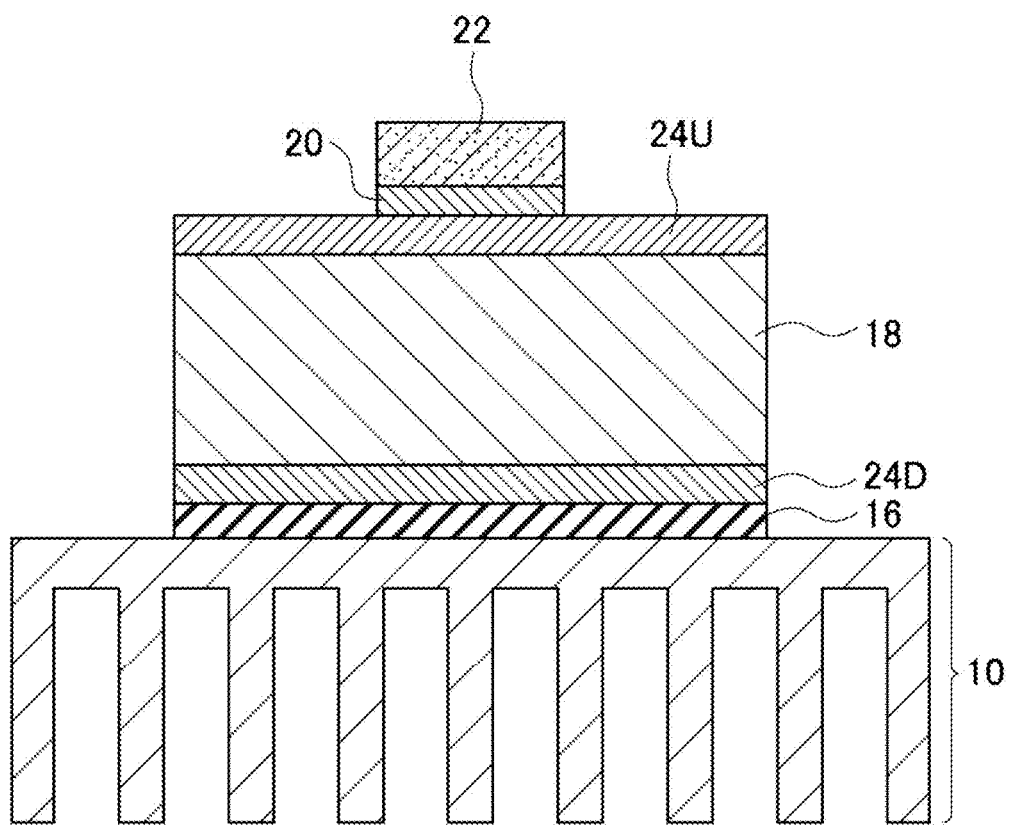
FIG. 26 is a schematic cross-sectional structure diagram showing a power module (configuration example 3) according to the embodiments which can be mounted on the cooling apparatus.

As shown in FIG. 26, a power module according to the embodiments (configuration example 3) which can be mounted on a cooling apparatus 10 include the cooling apparatus 10, and an insulating sheet 16 disposed on the cooling apparatus 10. In this case, the second thick copper layer 18 is disposed on the cooling apparatus 10 via the insulating sheet 16. In this case, the configuration example 3 corresponds to an example of using the second thick copper layer 18 as the thick copper substrate 2 the, as shown in FIG. 26. Other configurations are the same as those of the power module according to the third embodiment shown in FIG. 4A.

The power module according to the embodiments (configuration example 3) which can be mounted on the cooling apparatus 10 may further include a second aluminum relaxation layer 24D disposed so as to be opposed to the first aluminum relaxation layer 24U and to sandwich the second thick copper layer 18 therebetween, as shown in FIG. 26. In addition, although the configuration example 3 discloses the example of the air-cooling type, a water-cooling type may be adopted thereinto. Moreover, also in the configuration example 3, the power module to be mounted thereon may be the power module according to the modified example of the third embodiment. Moreover, in the configuration example 3, the power module to be mounted on the cooling apparatus 10 may be the power module according to first or second embodiment or the modified example thereof.

Configuration Example 4

As shown in FIG. 27, a power module according to the embodiments (configuration example 4) which can be mounted on a cooling apparatus 10 include the cooling apparatus 10, and an insulating substrate 2B disposed on the cooling apparatus 10. In this case, the insulating substrate 2B is disposed on the cooling apparatus 10 via the first thermal compound layer 12TH.

In this case, the configuration example 4 corresponds to an example of using the second thick copper layer 18 as the thick copper substrate 2 the, as shown in FIG. 27. Furthermore, the configuration example 4 may include a second thermal compound layer 16TH disposed on the insulating substrate 2B, and the thick copper substrate 2 may be disposed on the second thermal compound layer 16TH.

The insulating substrate 2B may includes a Direct Bonding Copper (DBC) substrate including: a ceramics substrate 17, a Cu layer 18B disposed on a front side surface of the ceramics substrate 17, and a Cu layer 14B disposed on a back side surface of the ceramics substrate 17, for example. In addition, an Active Metal Brazed, Active Metal Bond (AMB) substrate or a DBA substrate can be applied to the insulating substrate 2B. Moreover, the insulating substrate 2B may includes a Direct Bonding Copper (DBC) substrate including: a ceramics substrate 17, a Cu layer 18B disposed on a front side surface of the ceramics substrate 17, and a Cu layer 14B disposed on a back side surface of the ceramics substrate 17. Alternatively, the insulating substrate 2B may include a ceramics plate 17 (on which copper foils or the like are not bonded on the upper and lower surfaces). Other configurations are the same as those of the power module according to the third embodiment shown in FIG. 4A.

The power module according to the embodiments (configuration example 4) which can be mounted on the cooling apparatus 10 may further include a second aluminum relaxation layer 24D disposed so as to be opposed to the first aluminum relaxation layer 24U and to sandwich the second thick copper layer 18 therebetween, as shown in FIG. 27. In addition, although the configuration example 4 discloses the example of the air-cooling type, a water-cooling type may be adopted thereinto. Moreover, also in the configuration example 4, the power module to be mounted thereon may be the power module according to the modified example of the third embodiment. Moreover, in the configuration example 4, the power module to be mounted on the cooling apparatus 10 may be the power module according to first or second embodiment or the modified example thereof.

In the above-mentioned configuration examples 1-4, the cooling apparatus 10 is a water-cooling type or air-cooling type, and is used for an in-vehicle device.

(Fabrication Method of Power Module)

Figure 28A:
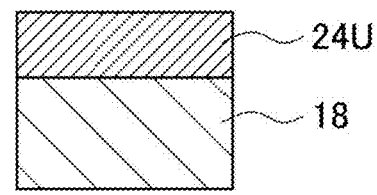
FIG. 28A is a diagram showing a fabricating process of Al/Cu material, in a fabrication method of the power module according to the embodiments.
Figure 28B:
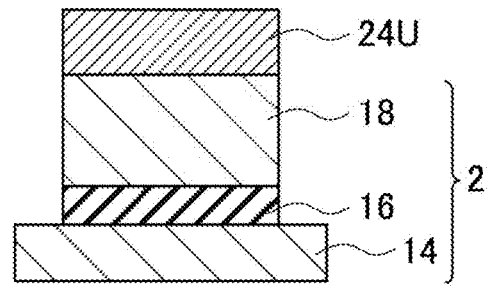
FIG. 28B is a diagram showing a bonding process of an insulating sheet, in the fabrication method of the power module according to the embodiments.
Figure 28C:
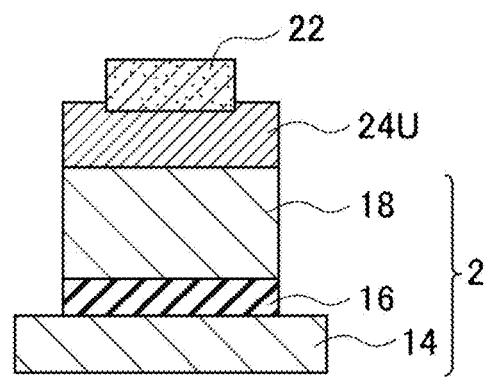
FIG. 28C is a diagram showing a bonding process of a semiconductor device, in the fabrication method of the power module according to the embodiments.
Figure 28D:
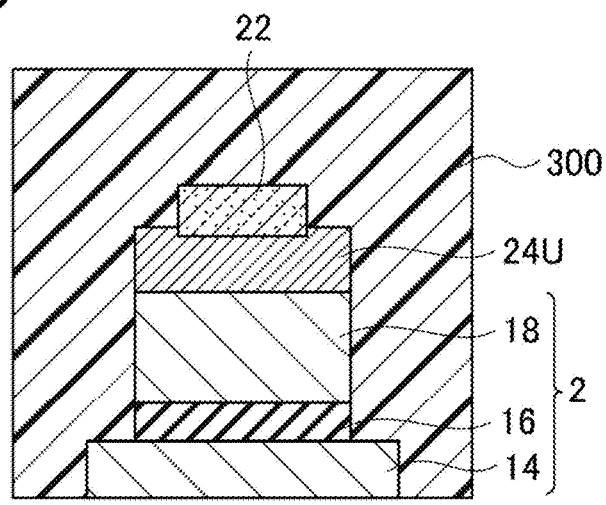
FIG. 28D is a diagram showing a formation process of a resin mold, in the fabrication method of the power module according to the embodiments.

FIG. 28A shows a fabricating process of the Al/Cu material, in a fabrication method of the power module according to the embodiments, FIG. 28B shows a bonding process of the insulating sheet, FIG. 28C shows a bonding process of the semiconductor device, and FIG. 28D shows a formation process of a resin mold. FIG. 28 explains a structure where the semiconductor device 22 is partly embedded in the aluminum relaxation layer 24U by performing the heating and pressurizing process in the first embodiment or the third embodiment, and the plated layer 30 and the Ag fired layer 20 is omitted in FIG. 6.

As shown in FIGS. 28A-28C, the fabrication method of the power module according to the embodiments includes: forming the first aluminum relaxation layer 24U on the second thick copper layer 18; disposing the second thick copper layer 18 on the first thick copper layer 14 via the insulating sheet layer 16; disposing the semiconductor device 22 on the first aluminum relaxation layer 24U and then bonding the semiconductor device 22 to the first aluminum relaxation layer 24U by the heating and pressurizing process that applies pressure while heating; and connecting an electrode of the semiconductor device 22 to an external terminal.

Although illustration is omitted, the fabrication method further includes formation process of wire bonding and terminal bonding to the semiconductor device 22. As shown in FIG. 28D, the fabrication method further includes performing resin sealing of the whole power module except for a part of the external terminals of the power module with a resin layer 300. A heating processing temperature of the heating and pressurizing process may be approximately 300° C. to approximately 350° C., for example, and an applied pressure may be approximately 10 MPa to approximately 80 MPa, for example.

Figure 29A:
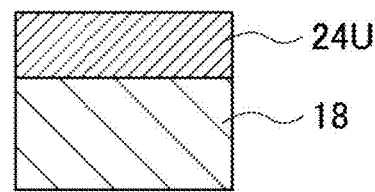
FIG. 29A is a diagram showing a fabricating process of Al/Cu material, in an alternative fabrication method of the power module according to the embodiments.
Figure 29B:
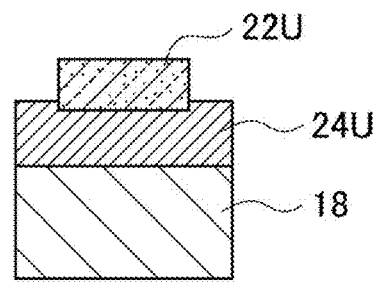
FIG. 29B is a diagram showing a bonding process of a semiconductor device, in the alternative fabrication method of the power module according to the embodiments.
Figure 29C:
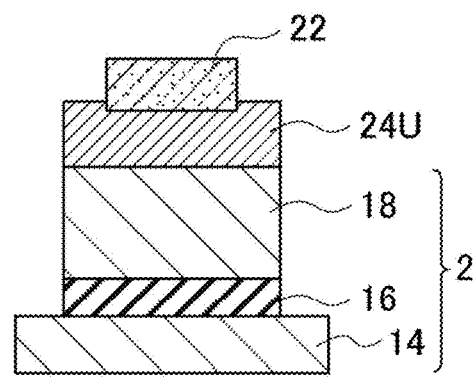
FIG. 29C is a diagram showing a bonding process of an insulating sheet, in the alternative fabrication method of the power module according to the embodiments.
Figure 29D:
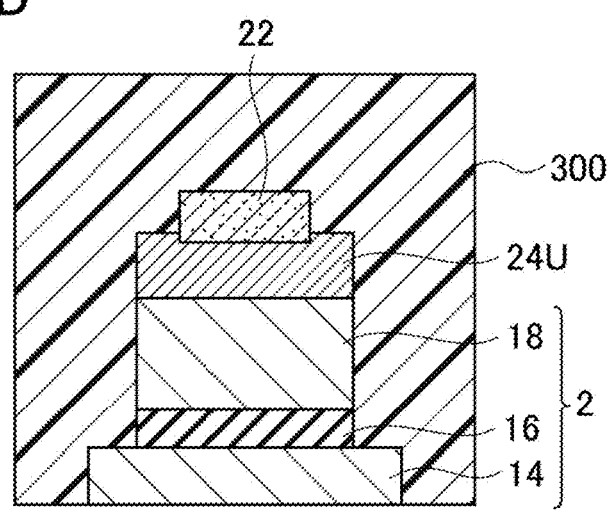
FIG. 29D is a diagram showing a formation process of a resin mold, in the alternative fabrication method of the power module according to the embodiments.

FIG. 29A shows a fabricating process of the Al/Cu material, in an alternative fabrication method of the power module according to the embodiments, FIG. 29B shows a bonding process of the semiconductor device, FIG. 29C shows a bonding process of the insulating sheet, and FIG. 29D shows a formation process of the resin mold. FIG. 29 also explains a structure where the semiconductor device 22 is partly embedded in the aluminum relaxation layer 24U by performing the heating and pressurizing process in the first embodiment or the third embodiment, and the plated layer 30 and the Ag fired layer 20 is omitted in FIG. 6.

As shown in FIGS. 29A-29C, the alternative fabrication method of the power module according to the embodiments includes: forming the first aluminum relaxation layer 24U on the second thick copper layer 18; disposing the semiconductor device 22 on the first aluminum relaxation layer 24U and then bonding the semiconductor device 22 to the first aluminum relaxation layer 24U by the heating and pressurizing process that applies pressure while heating; disposing the second thick copper layer 18 on the first thick copper layer 14 via the insulating sheet layer 16; and connecting an electrode of the semiconductor device 22 to an external terminal.

Although illustration is omitted, the fabrication method further includes formation process of wire bonding and terminal bonding to the semiconductor device 22. As shown in FIG. 29D, the fabrication method further includes performing resin sealing of the whole power module except for a part of the external terminals of the power module with a resin layer 300. A heating processing temperature of the heating and pressurizing process may be approximately 300° C. to approximately 350° C., for example, and an applied pressure may be approximately 10 MPa to approximately 80 MPa, for example.

Moreover, transfermold resins, thermosetting resins, etc. applicable to the SiC based semiconductor device can be used as the resin layer 300. Moreover, silicone based resins, e.g. silicone gel, may partially be applied thereto, or case type power modules may be adopted to be applied to the whole thereof.

Illustrative Examples of Power Modules (1-in-1 Configuration)

Figure 30A:
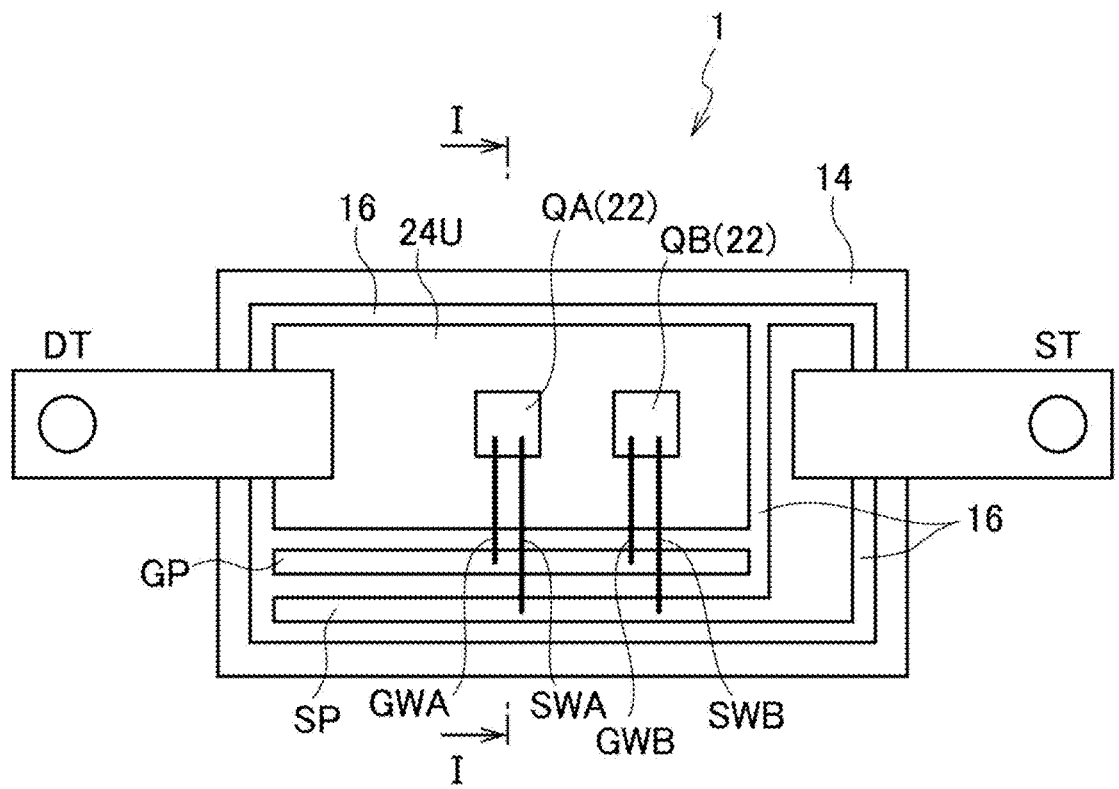
FIG. 30A is a schematic planar pattern configuration diagram showing a 1-in-1 module, which is a power module according to the embodiments.
Figure 30B:
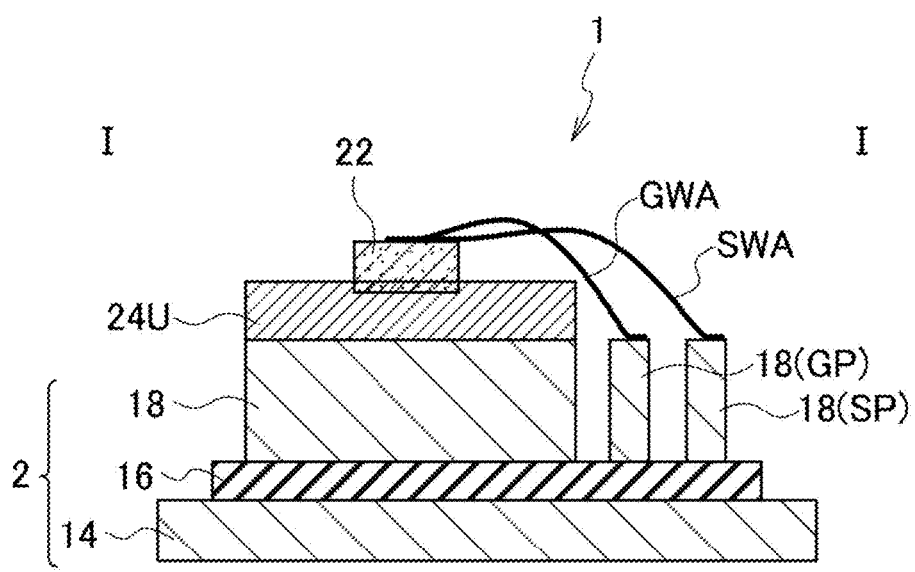
FIG. 30B is a schematic cross-sectional structure diagram taken in the line I-I of FIG. 30A.
Figure 31:
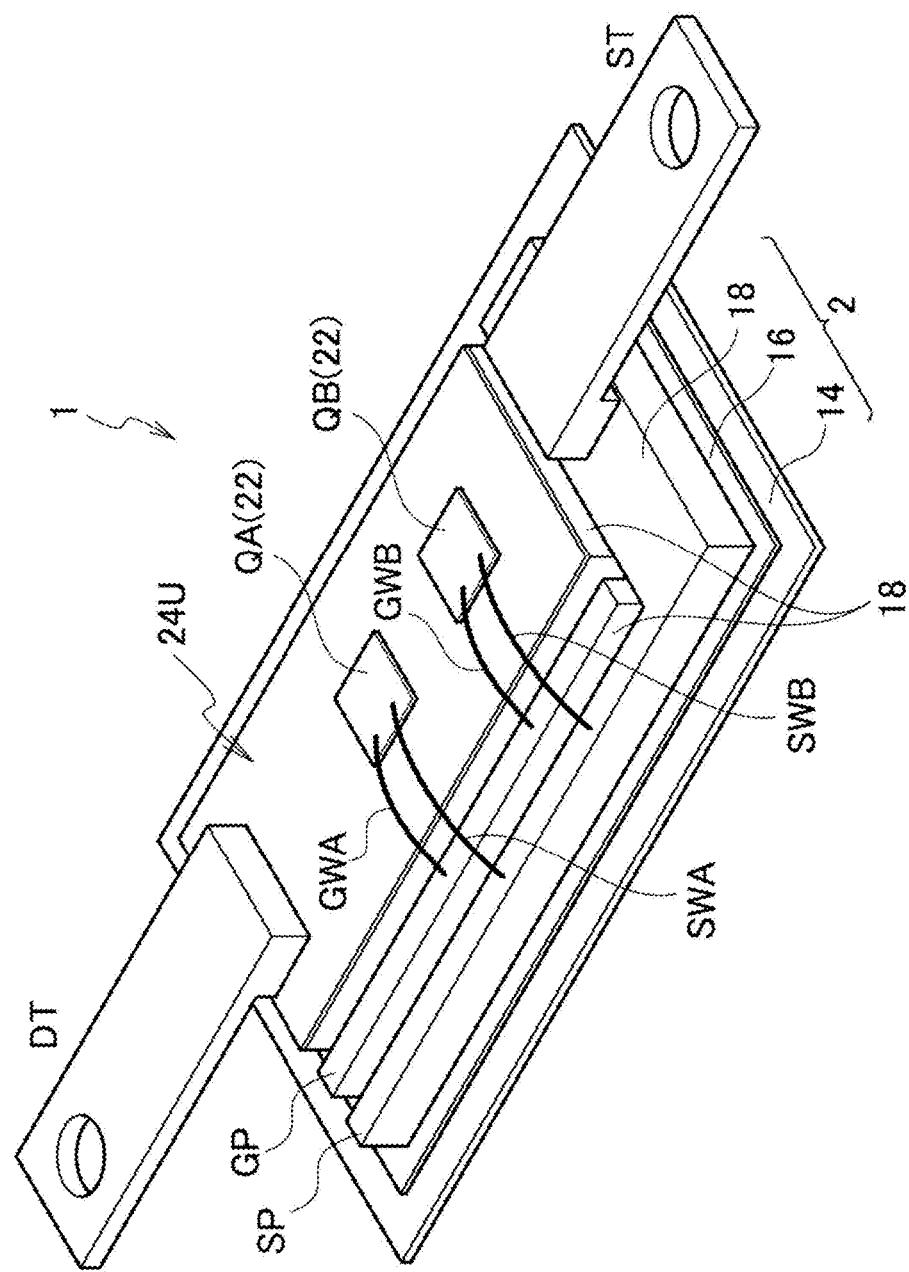
FIG. 31 is a schematic bird's-eye view showing the 1-in-1 module, which is the power module according to the embodiments.

FIG. 30A shows a schematic planar pattern configuration of a 1-in-1 module, which is the power module 1 according to the embodiments, and FIG. 30B shows a schematic cross-sectional structure taken in the line I-I of FIG. 30A. FIG. 31 shows a schematic bird's-eye view configuration of the 1-in-1 module corresponding to FIGS. 30A and 30B, which is the power module according to the embodiments.

As shown in FIGS. 30A, 30B, and 31, the power module 1 according to the embodiments includes: a plate-shaped first thick copper layer 14; an insulating sheet layer 16 disposed on the first thick copper layer 14; a second thick copper layer 18 disposed on the insulating sheet layer 16 and pattern-formed; a first aluminum relaxation layer 24U disposed on the second thick copper layer 18; and semiconductor devices QA (22) and QB (22) disposed on the first aluminum relaxation layer 24U. Moreover, the semiconductor devices QA (22) and QB (22) are bonded to the first aluminum relaxation layer 24U.

Moreover, the power module 1 may include a plated layer 30 (not illustrated) disposed on the first aluminum relaxation layer 24U, and the semiconductor device 22 may be bonded to the first aluminum relaxation layer 24U via the plated layer 30.

Alternatively, the power module 1 may include an Ag fired layer 20 (not illustrated) disposed on the first aluminum relaxation layer 24U, and the semiconductor devices QA (22) and QB (22) may be bonded to the first aluminum relaxation layer 24U via the Ag fired layer 20.

Alternatively, the power module 1 may include an Ag fired layer 20 (not illustrated) disposed on a plated layer (not illustrated), and the semiconductor devices QA (22) and QB (22) may be bonded to the first aluminum relaxation layer 24U via the Ag fired layer 20 and the plated layer 30.

A part of the semiconductor devices QA (22) and QB (22) may thrust to be fixed to (may be embedded in) the first aluminum relaxation layer 24U.

Moreover, a bonded surface between the semiconductor devices QA (22) and QB (22) and the first aluminum relaxation layer 24U may be integrated to each other. More specifically, the semiconductor device 22 and the stress relaxation metal layer 24U may be bonded to each other by means of a diffusion bonding or solid phase diffusion bonding.

Moreover, the semiconductor devices QA (22) and QB (22) may be embedded therein by approximately 0 µm to approximately 100 µm to be bonded thereto, for example. Alternatively, the semiconductor devices QA (22) and QB (22) may be bonded by being embedded in the first aluminum relaxation layer 24U by approximately ⅓ to ½ of the thickness of the semiconductor devices.

The power module 1 may include a second aluminum relaxation layer 24D (not illustrated) disposed on the insulating sheet layer 16, and the second thick copper layer 18 may be rolled to be bonded on the second aluminum relaxation layer 24D. In addition, bonding by mans of the sputtering technology, the cold spraying technology, or the thermal spraying technology may be used, instead of the bonding by means of the above-mentioned rolling technology.

The semiconductor devices QA (22) and QB (22) may be FET or IGBT of which a source electrode or an emitter electrode are formed on an upper surface thereof and a gate electrode and a drain or collector electrode are formed on a lower surface thereof; and may include a gate signal wiring pattern electrically connected to the gate electrode and a source or emitter signal wiring pattern electrically connected to the source or emitter electrode, which are disposed on the insulating sheet layer 16 and pattern-formed with an identical material to the second thick copper layer 18.

The semiconductor devices QA (22) and QB (22) may respectively include a plurality of chips.

As shown in FIGS. 30A, 30B, and 31, the power module 1 according to the embodiments may include a gate signal wiring pattern 18 (GP) and a source signal wiring pattern 18 (SP) which are disposed on the insulating sheet layer 16 and are pattern-formed with an identical material to the second thick copper layer 18.

In the power module 1 according to the first embodiment, as shown in FIGS. 30A, 30B, and 31, the semiconductor devices QA (22) and QB (22) are disposed on the first aluminum relaxation layer 24U, and the drain electrode of each of the semiconductor devices QA (22) and QB (22) is bonded to the first aluminum relaxation layer 24U by means of the diffusion bonding or solid phase diffusion bonding in the heating and pressurizing process.

In this case, the gate signal wiring pattern GP is connected to the gate electrodes of the semiconductor devices QA (22) and QB (22) via gate bonding wires GWA and GLIB, and the source signal wiring pattern SP is connected to the source electrodes of the semiconductor devices QA (22) and QB (22) via source bonding wires SWA and SWB. In addition, although illustration is omitted therein, a combination structure of a plate-shaped electrode and a pillar electrode, a leadframe, or the like may be used therefor instead of these bonding wires.

Furthermore, a drain terminal DT is bonded with soldering or the like to the first aluminum relaxation layer 24U to which the drain electrodes of the semiconductor devices QA

(22) and QB (22) are connected, and a source terminal ST is bonded with soldering or the like to the source signal wiring pattern SP connected to the source electrodes of the semiconductor devices QA (22) and QB (22) via the source bonding wires SWA and SWB. Moreover, although illustration is omitted, a gate terminal GT1 is bonded with soldering or the like to the gate signal wiring pattern GP.

In this case, as the semiconductor device 22, it may include any one of a Si based IGBT, a Si based MOSFET, a SiC based MOSFET, a SiC based IGBT, or a GaN based FET, or a plurality of the above-mentioned different devices.

Figure 32A:
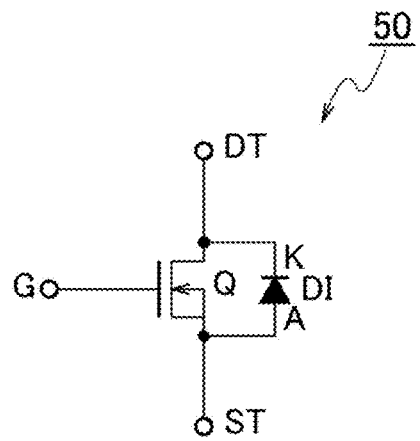
FIG. 32A is a schematic circuit representative diagram of a SiC MOSFET of the 1-in-1 module, which is the power module according to the embodiments.
Figure 32B:
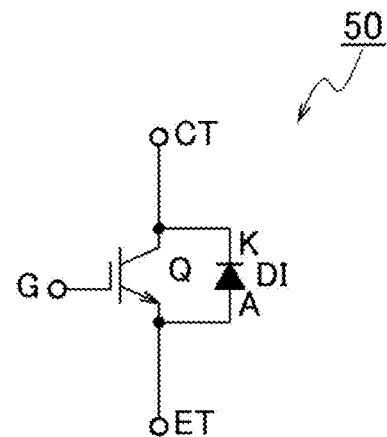
FIG. 32B is a schematic circuit representative diagram showing an IGBT of the 1-in-1 module.

As the power module according to the embodiments, FIG. 32A shows a schematic circuit representative of a SiC MOSFET of the 1-in-1 module 50, and FIG. 32B shows a schematic circuit representation of IGBT of the 1-in-1 module 50. A diode DI connected in reversely parallel to the MOSFET is shown in FIG. 32A. A main electrode of the MOSFET is expressed with a drain terminal DT and a source terminal ST. Similarly, a diode DI connected in reversely parallel to the IGBT is shown in FIG. 32B. A main electrode of the IGBT is expressed with a collector terminal CT and an emitter terminal ET.

Figure 33:
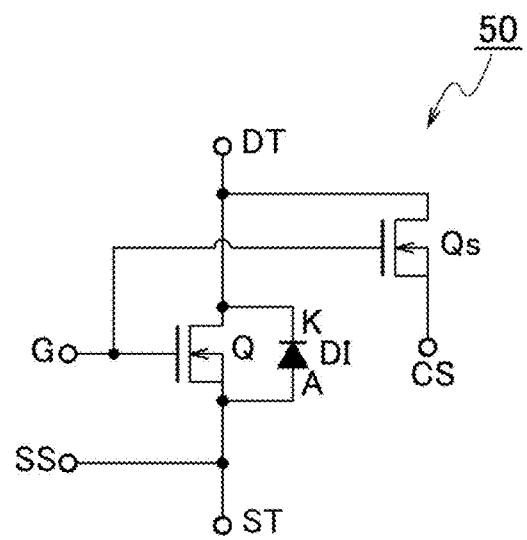
FIG. 33 is a detail circuit representative diagram of the SiC MOSFET of the 1-in-1 module, which is the power module according to the embodiments.

Moreover, FIG. 33 shows a detailed circuit representative of the SiC MOSFET of the 1-in-1 module 50, as the power module according to the embodiments.

In the 1-in-1 module 50, one MOSFET is included in one module, for example. As an example, five chips (MOSFET× 5) can be mounted thereon, and a maximum of five pieces of the MOSFETs respectively can be connected to one another in parallel. Note that it is also possible to mount a part of five pieces of the chips for the diode DI thereon.

More particularly, as shown in FIG. 33, a sense MOSFET Qs is connected to the MOSFETQ in parallel. The sense MOSFET Qs is formed as a minuteness transistor in the same chip as the MOSFET Q. In FIG. 33, reference sign SS denotes a source sense terminal, reference sign CS denotes a current sense terminal, and reference sign G denotes a gate signal terminal. Also in the power module according to the embodiments, the sense MOSFET Qs may be formed as a minuteness transistor in the same chip, in the MOSFET Q.

(2-in-1 Configuration)

Figure 34:
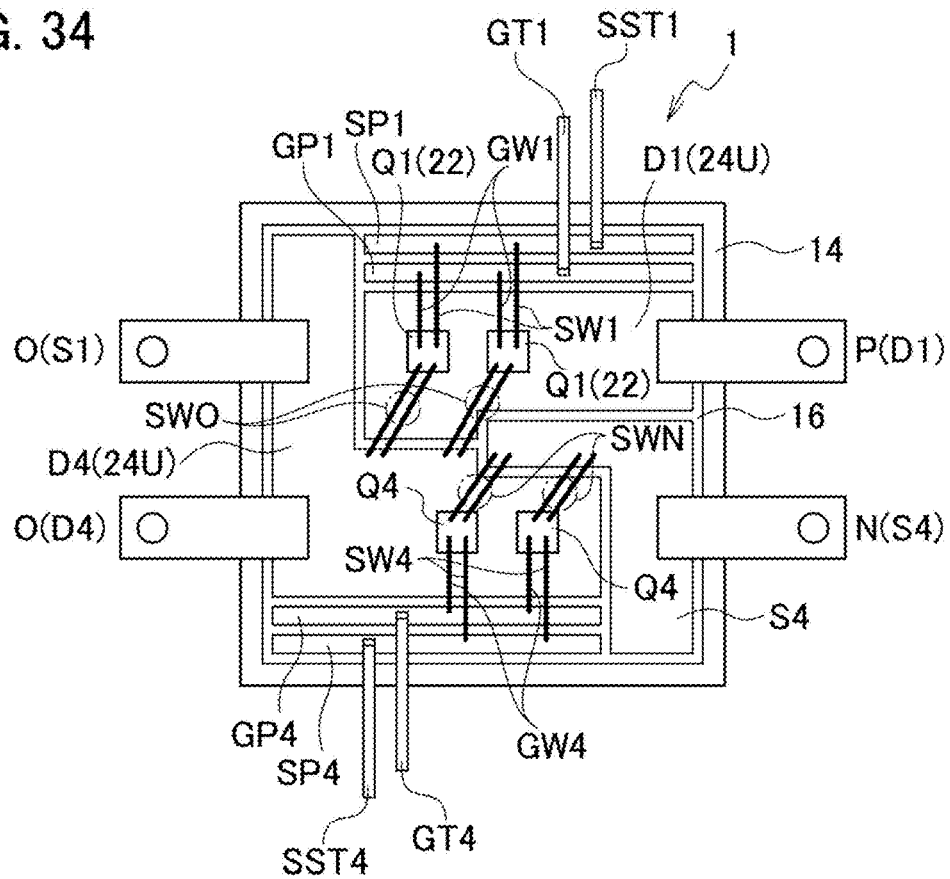
FIG. 34 is a schematic planar pattern configuration diagram showing a 2-in-1 module, which is a power module according to the embodiments.
Figure 35:
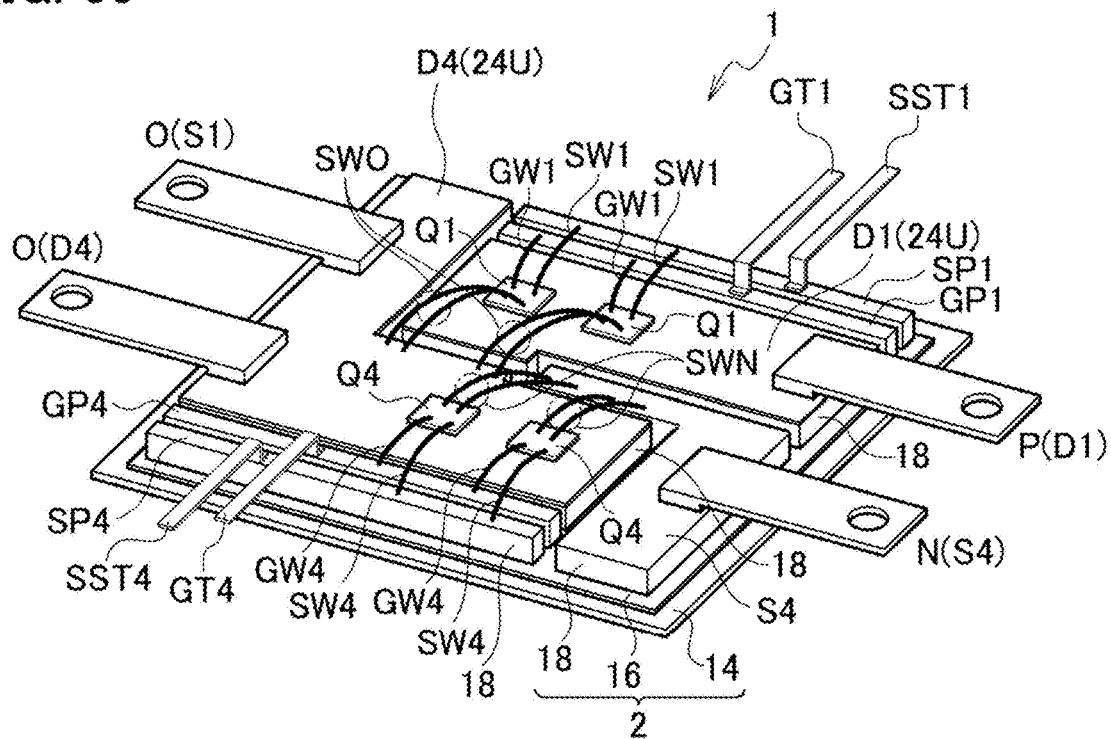
FIG. 35 is a schematic bird's-eye view showing the 2-in-1 module, which is the power module according to the embodiments.

FIG. 34 shows a schematic planar pattern configuration of a 2-in-1 module, which is the power module according to the embodiments, and FIG. 35 shows a schematic bird's-eye view configuration thereof.

FIG. 34 shows a schematic planar pattern configuration before forming a resin layer in a module with the built-in half-bridge, as the power module 1 according to the first embodiment. The power module 1 according to the embodiments includes a configuration of a module with the built-in half-bridge, and two SiC MOSFET Q1 and Q4 are included in one module. FIG. 34 shows an example of two chips of the SiC-MOSFETs Q1 and Q4 respectively arranged in parallel.

As shown in FIGS. 34 and 35, the power module 1 according to the embodiments includes: a positive-side power terminal P and a negative-side power terminal N disposed at a first side of the thick copper substrate 2 (18, 16, 14); a gate terminal GT1 and a source sense terminal SST1 disposed at a second side adjacent to the first side; output terminals O (D4) and O (S1) disposed at a third side opposite to the first side; and a gate terminal GT4 and a source sense terminal SST4 disposed at a fourth side opposite to the second side.

As shown in FIGS. 34 and 35, the power module 1 according to the embodiments includes: first thick copper layer 14; an insulating sheet layer 16 disposed on the plate-shaped first thick copper layer 14; a second thick copper layer 18 disposed on the insulating sheet layer 16 and pattern-formed; a first aluminum relaxation layer 24U disposed on the second thick copper layer 18; and semiconductor devices Q1 (22) and Q4 (22) disposed on the first aluminum relaxation layer 24U. In this case, the semiconductor devices Q1 (22) and Q4 (22) are bonded to the first aluminum relaxation layer 24U.

Alternatively, the power module 1 may include a plated layer 30 (not illustrated) disposed on the first aluminum relaxation layer 24U, and the semiconductor devices Q1 (22) and Q4 (22) may be bonded to the first aluminum relaxation layer 24U via the plated layer 30.

Alternatively, the power module 1 may include an Ag fired layer 20 (not illustrated) disposed on the first aluminum relaxation layer 24U, and the semiconductor devices Q1 (22) and Q4 (22) may be bonded to the first aluminum relaxation layer 24U via the Ag fired layer 20.

Alternatively, the power module 1 may include an Ag fired layer 20 (not illustrated) disposed on a plated layer (not illustrated), and the semiconductor devices Q1 (22) and Q4 (22) may be bonded to the first aluminum relaxation layer 24U via the Ag fired layer 20 and the plated layer 30.

A part of the semiconductor devices Q1 (22) and Q4 (22) may embedded in the first aluminum relaxation layer 24U.

Moreover, a bonded surface between the semiconductor devices Q1 (22) and Q4 (22) and the first aluminum relaxation layer 24U may be integrated to each other. More specifically, the semiconductor device 22 and the stress relaxation metal layer 24U may be bonded to each other by means of a diffusion bonding or solid phase diffusion bonding.

Moreover, the semiconductor devices Q1 (22) and Q4 (22) may be embedded therein by approximately 0 µm to approximately 100 µm to be bonded thereto, for example. Alternatively, the semiconductor devices Q1 (22) and Q4 (22) may be bonded by being embedded in the first aluminum relaxation layer 24U by approximately ⅓ to ½ of the thickness of the semiconductor devices.

The power module 1 may include a second aluminum relaxation layer 24D (not illustrated) disposed on the insulating sheet layer 16, and the second thick copper layer 18 may be rolled to be bonded on the second aluminum relaxation layer 24D. In addition, bonding by mans of the sputtering technology, the cold spraying technology, or the thermal spraying technology may be used, instead of the bonding by means of the above-mentioned rolling technology.

Moreover, the semiconductor devices Q1 (22) and Q4 (22) may be FET or IGBT of which a source electrode or an emitter electrode are formed on an upper surface thereof and a gate electrode and a drain or collector electrode are formed on a lower surface thereof; and may include a gate signal wiring pattern electrically connected to the gate electrode and a source or emitter signal wiring pattern electrically connected to the source or emitter electrode, which are disposed on the insulating sheet layer 16 and pattern-formed with an identical material to the second thick copper layer 18.

The semiconductor devices Q1 (22) and Q4 (22) may respectively include a plurality of chips.

As shown in FIGS. 34 and 35, the power module 1 according to the embodiments may include gate signal wiring patterns GP1 and GP4 and source signal wiring patterns SP1 and SP4 which are disposed on the insulating sheet layer 16 and are pattern-formed with an identical material to the second thick copper layer 18.

In the power module 1 according to the first embodiment, as shown in FIGS. 34 and 35, the semiconductor devices Q1 (22) and Q4 (22) are disposed on the first aluminum relaxation layer 24U, and the drain electrode of each of the semiconductor devices Q1 (22) and Q4 (22) is bonded to the first aluminum relaxation layer 24U by means of the diffusion bonding or solid phase diffusion bonding in the heating and pressurizing process.

Moreover, the semiconductor devices Q1 and Q4 are disposed face up on the drain patterns D1 (24U) and D4 (24U) disposed on the second thick copper layer 18.

In this case, the gate terminal GT1 and the source sense terminal SST1 are respectively connected to a gate signal wiring pattern GP1 and a source signal wiring pattern SP1 in the semiconductor device Q1; and the gate terminal GT4 and the source sense terminal SST4 are respectively connected to a gate signal wiring pattern GP4 and a source signal wiring pattern SP4 in the semiconductor device Q4.

As shown in FIGS. 34 and 35, from the SiC MOSFETs Q1 and Q4, source bonding Wires SWO and SWN are respectively connected toward the drain pattern D4 (24U) and the source pattern S4 disposed on the second thick copper layer 18, gate bonding wires GW1 and GW4 are respectively connected toward the gate signal wiring patterns GP1 and GP4, and source bonding wires SW1, and SW4 are respectively connected toward the source signal wiring patterns SP1 and SP4.

Moreover, gate terminals GT1 and GT4 for external extraction are respectively connected to the gate signal wiring patterns GP1 and GP4 by soldering or the like, and the source sense terminals SST1 and SST4 for external extraction are respectively connected to the source signal wiring patterns SP1 and SP4 by soldering or the like.

Moreover, the positive-side power terminal P is connected to the drain pattern D1 (24U) by soldering or the like, the negative-side power terminal N is connected to the source pattern S4 by soldering or the like, and the output terminals O (S1) and O (D4) are connected to the drain pattern D4 (24U) by soldering or the like.

The positive-side power terminal P, the negative-side power terminal N, the output terminals O (S1) and O (D4), the gate terminals GT1 and GT4, and the source sense terminals SST1 and SST4 can be formed by including Cu, for example.

The source bonding wires SWO, SWN, SW1, and SW4 and the gate bonding wires GW1 and GW4 can be formed by including Al, AlCu, or the like, for example.

In this case, as the semiconductor device 22, it may include any one of a Si based IGBT, a Si based MOSFET, a SiC based MOSFET, a SiC based IGBT, or a GaN based FET, or a plurality of the above-mentioned different devices.

Moreover, it is also possible to configure an inverter circuit device or a converter circuit by connecting the semiconductor devices in series between a first power source and a second power source, by using a plurality of switching circuits using a connecting point between the semiconductor devices connected in series as an output, and by individually controlling each gate of the semiconductor devices.

In addition, although it has been explained that it is possible to mainly configure the 1-in-1 module or the 2-in-1 module using the semiconductor device, in the power module according to the embodiments 1, it is not limited to this example. For example, it is possible to configure any one of a 4-in-1 module, a 6-in-1 module, a 7-in-1 module in which a snubber capacitor etc. is provided in the 6-in-1 module, an 8-in-1 module, a 12-in-1 module, a 14-in-1 module, or the like.

(Circuit Configuration)

Figure 36A:
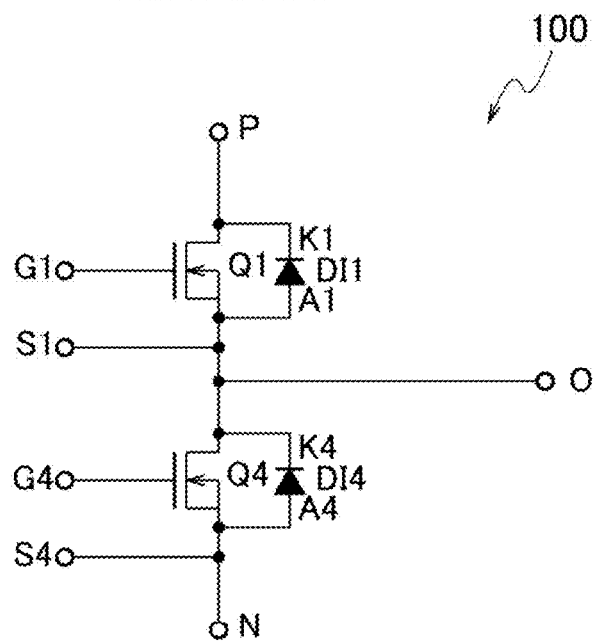
FIG. 36A is a schematic circuit representative diagram of a SiC MOSFET of the 2-in-1 module, which is the power module according to the embodiments.
Figure 36B:
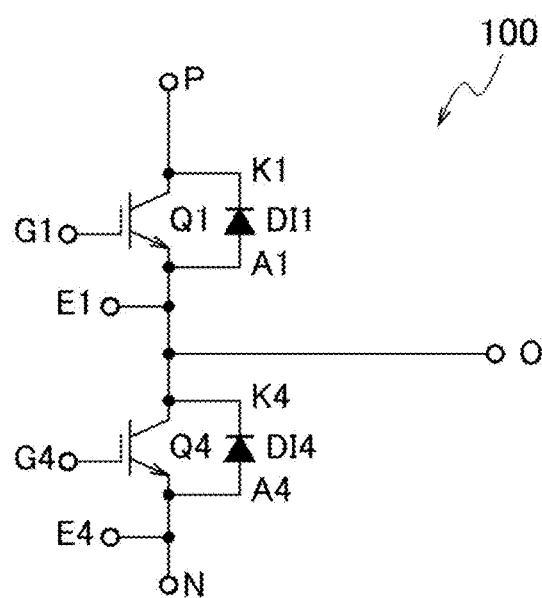
FIG. 36B is a schematic circuit representative diagram showing an IGBT of the 2-in-1 module.

As the power module according to the embodiments, FIG. 36A shows a schematic circuit representative of a SiC MOSFET of the 2-in-1 module 100, and FIG. 36B shows a schematic circuit representation of IGBT of the 2-in-1 module 100.

As the power module according to the embodiments, there will now be explained a 2-in-1 type module in which two semiconductor devices Q1 and Q4 sealed by one mold resin.

The 2-in-1 module 100 to which SiC MOSFETs are applied as the semiconductor devices Q1 and Q4 includes a half bridge configuration in which two SiC MOSFETs Q1 and Q4 are built, as shown in FIG. 36A.

In this case, although the module can be considered as one large transistor, one chip or a plurality of chips may be contained therein. More specifically, although the modules include 1-in-1 module, 2-in-1 module, 4-in-1 module, 6-in-1 module, etc. For example, a module containing two pieces of transistors (chips) on one module is called the 2-in-1 module, a module containing two pieces of 2-in-1 modules on one module is called the 4-in-1 module, and a module containing three pieces of 2-in-1 modules on one module is called the 6-in-1 module.

As shown in FIG. 36A, the 2-in-1 module 100 includes two SiC MOSFETs Q1 and Q4, and diodes DI1 and DI4 connected in reversely parallel to the SiC MOSFETs Q1 and Q4, as one module. In FIG. 36A, reference numeral G1 denotes a lead terminal for gate signal of the MOSFET Q1, and reference numeral S1 denotes a lead terminal for source signal of the MOSFET Q1. Similarly, reference numeral G4 denotes a lead terminal for gate signal of the MOSFET Q4, and reference numeral S4 denotes a lead terminal for source signal of the MOSFET Q4. Reference numeral P denotes a positive side power terminal, reference numeral N denotes a negative side power terminal, and reference numeral O denotes an output terminal electrode.

Moreover, the 2-in-1 module 100 to which IGBTs are applied as the semiconductor devices Q1 and Q4 includes two IGBTs Q1 and Q4, and diodes DI1 and DI4 connected in reversely parallel to the IGBTs Q1 and Q4, as shown in FIG. 36B. In FIG. 36B, reference numeral G1 denotes a gate signal lead terminal of the IGBT Q1, and reference numeral E1 denotes an emitter signal lead terminal of the IGBT Q1. Similarly, G4 denotes a gate signal lead terminal of the IGBT Q4, and E4 denotes an emitter signal lead terminal of the IGBT Q4.

The semiconductor devices Q2 and Q5 and semiconductor devices Q3 and Q6 applicable to the power module according to the embodiments can also be similarly realized.

(Device Structure)

Figure 37:
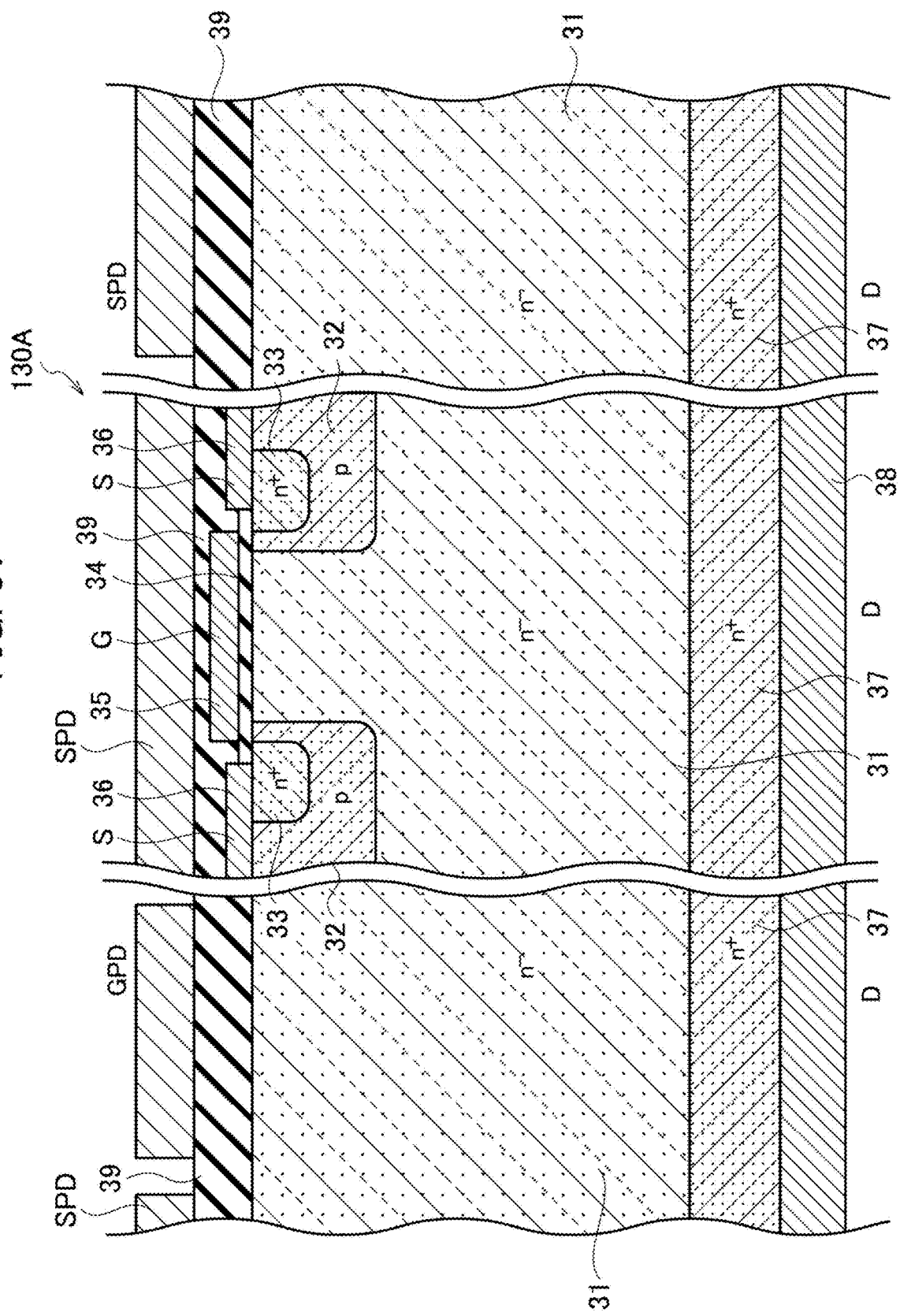
FIG. 37 is a schematic cross-sectional structure diagram showing a SiC MOSFET including a source pad electrode SPD and a gate pad electrode GPD, which is an example of the semiconductor device which can be applied to the power module according to the embodiments.

FIG. 37 shows a schematic cross-sectional structure of a SiC MOSFET 130A including a source pad electrode SPD and a gate pad electrode GPD, which is an example of the semiconductor devices Q1 and Q4 applicable to the power module according to the embodiments.

As shown in FIG. 37, the SiC MOSFET 130A includes: a semiconductor layer 31 composed by including an $n^-$ type high resistivity layer; a p body region 32 formed on a front surface side of the semiconductor layer 31; a source region 33 formed on a front side surface of the p body region 32; a gate insulating film 34 disposed on a front side surface of the semiconductor layer 31 between the p body regions 32B; a gate electrode 35 disposed on the gate insulating film 34; a source electrode 36 connected to the source region 33 and the p body region 32; an $n^+$ drain region 37 disposed on a back side surface opposite to the surface of the semiconductor layer 31; and a drain electrode 38 connected to the n+ type drain area 37.

The gate pad electrode GPD is connected to the gate electrode 35 disposed on the gate insulating film 34, and the source pad electrode SPD is connected to the source electrode 36 connected to the source region 33 and the p body region 32. Moreover, as shown in FIG. 37, the gate pad electrode GPD and the source pad electrode SPD are disposed on an interlayer insulating film 39 for passivation which covers the surface of the SiC MOSFET 130A.

In addition, a microstructural transistor structure (not illustrated) may be formed in the semiconductor layer 31 below the gate pad electrode GPD and the source pad electrode. SPD.

Furthermore, as shown in FIG. 37, the source pad electrode SPD may be disposed to be extended onto the interlayer insulating film 39 for passivation, also in the transistor structure of the center portion.

Although the SiC MOSFET 130A is composed by including a planar-gate-type n channel vertical SiC-MOSFET in FIG. 37, the SiC MOSFET 130A may be composed by including a trench-gate type n channel vertical SiC-TMOSFET 130D, or the like, shown in FIG. 40 mentioned below.

Alternatively, a GaN-based FET etc. instead of the SiC MOSFET 130A can also be adopted to the semiconductor devices Q1 and Q4 which can be applied to the power module according to the embodiments.

The semiconductor devices Q2 and Q5 and semiconductor devices Q3 and Q6 applicable to the power module according to the embodiments can also be similarly realized.

Furthermore, a wide-bandgap type semiconductor of which the bandgap energy is from 1.1 eV to 8 eV, for example, can be used for the semiconductor devices Q1 to Q6 applicable to the power module according to the embodiments.

Figure 38:
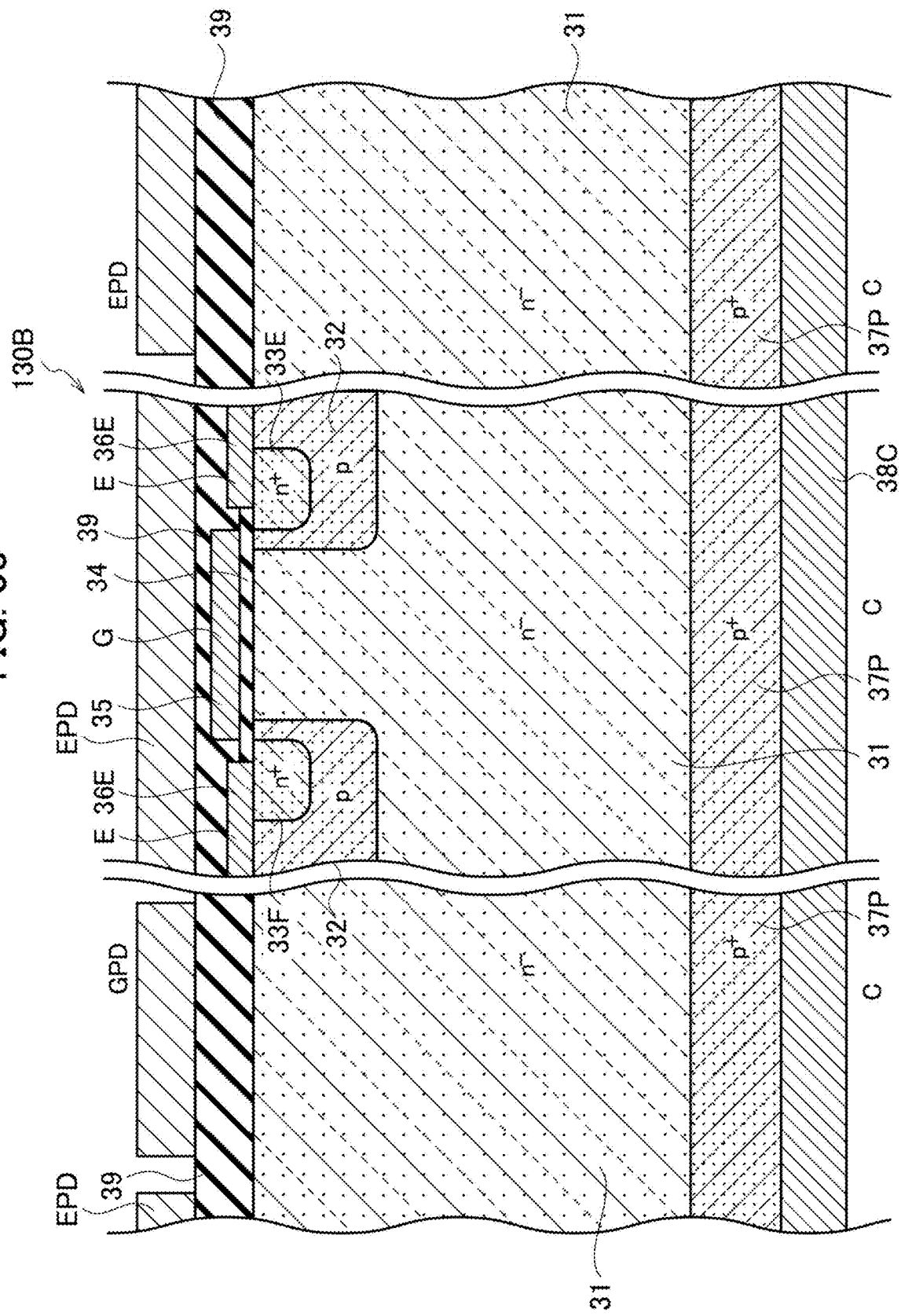
FIG. 38 is a schematic cross-sectional structure diagram showing an IGBT including an emitter pad electrode EPD and a gate pad electrode GPD, which is an example of the semiconductor device which can be applied to the power module according to the embodiments.

Similarly, FIG. 38 shows a schematic cross-sectional structure of an IGBT 130B including an emitter pad electrode EPD and a gate pad electrode GPD, which is an example of the semiconductor devices Q1 and Q4 applicable to the power module according to the embodiments.

As shown in FIG. 38, the IGBT 130B includes: a semiconductor layer 31 composed by including an n⁻ type high resistivity layer; a p body region 32 formed on a front surface side of the semiconductor layer 31; an emitter region 33E formed on a front side surface of the p body region 32; a gate insulating film 34 disposed on a front side surface of the semiconductor layer 31 between the p body regions 32S; a gate electrode 35 disposed on the gate insulating film 34; an emitter electrode 36E connected to the emitter region 33E and the p body region 32; a p⁺ collector region 37P disposed on a back side surface opposite to the surface of the semiconductor layer 31; and a collector electrode 38C connected to the p⁺ collector region 37P.

The gate pad electrode GPD is connected to the gate electrode 35 disposed on the gate insulating film 34, and the emitter pad electrode EPD is connected to the emitter electrode 36E connected to the emitter region 33E and the p body region 32. Moreover, as shown in FIG. 38, the gate pad electrode GPD and the emitter pad electrode EPD are disposed on an interlayer insulating film 39 for passivation which covers the surface of IDBT 130B.

In addition, a microstructural IGBT structure (not illustrated) may be formed in the semiconductor layer 31 below the gate pad electrode GPD and the emitter pad electrode EPD.

Furthermore, as shown in FIG. 38, the emitter pad electrode EPD may be disposed to be extended onto the interlayer insulating film 39 for passivation, also in the IGBT structure of the center portion.

In FIG. 38, although the IGBT 130B is composed by including a planar-gate-type n channel vertical IGBT, the IGBT 130B may be composed by including a trench-gate-type n channel vertical IGBT, etc.

The semiconductor devices Q2 and Q5 and semiconductor devices Q3 and Q6 applicable to the power module according to the embodiments can also be similarly realized.

GaN-based power devices, e.g. SiC-based power devices, e.g. SiC DIMOSFET or SiC TMOSFET, or a GaN-based high electron mobility transistor (HEMI), can be applied as the semiconductor devices Q1 to Q6. In some instances, power devices, e.g. Si based MOSFETs or Si based IGBT, are also applicable thereto.

SiC DIMOSFET

Figure 39:
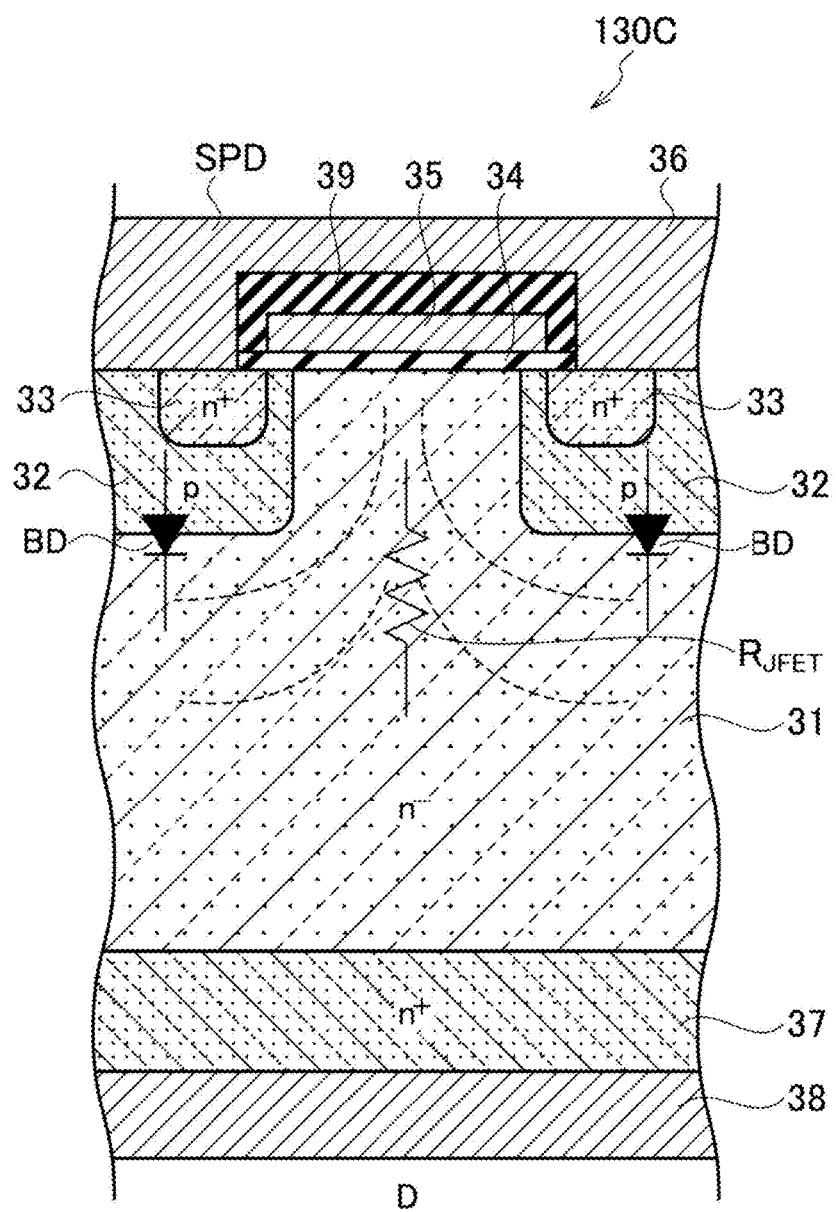
FIG. 39 is a schematic cross-sectional structure diagram showing a SiC Double Implanted MOSFET (SiC DIMOSFET), which is an example of the semiconductor device applicable to the power module according to the embodiments.

FIG. 39 shows a schematic cross-sectional structure of a SiC DIMOSFET 130C, which is an example of a semiconductor device which can be applied to the power module according to the embodiments.

As shown in FIG. 39, the SiC DIMOSFET 130C includes: semiconductor layer 31 composed by including an n⁻ type high resistivity layer; a p body region 32 formed on a front surface side of the semiconductor layer 31; an n+ source region 33 formed on a front side surface of the p body region 32; a gate insulating film 34 disposed on a front side surface of the semiconductor layer 31 between the p body regions 32S; a gate electrode 35 disposed on the gate insulating film 34; a source electrode 36 connected to the source region 33 and the p body region 32; an n⁺ type drain region 37 disposed on a back side surface opposite to the surface of the semiconductor layer 31; and a drain electrode 38 connected to the n⁺ type drain area 37.

In the SiC DIMOSFET 130C shown in FIG. 39, the p body region 32 and the n⁺ source region 33 formed on the front side surface of the p body region 32 are formed with double ion implantation (DII), and the source pad electrode SPD is connected to the source region 33 and the source electrode 36 connected to the p body region 32.

Moreover, a gate pad electrode GPD (not illustrated) is connected to the gate electrode 35 disposed on the gate insulating film 34. Moreover, as shown in FIG. 39, the gate pad electrode GPD and the source pad electrode SPD are disposed on an interlayer insulating film 39 for passivation which covers the surface of the SiC DIMOSFET 130C.

As shown in FIG. 39, in the SiC DIMOSFET 130C, since a depletion layer as shown with the dashed lines is formed in the semiconductor layer 31 composed of a n⁻ type high resistivity layer inserted into the p body regions 32, channel resistance $R_{JFET}$ accompanying the junction type FET (JFET) effect is formed. Moreover, as shown in FIG. 39, body diodes BD are respectively formed between the p body regions 32 and the semiconductor layers 31.

SiC TMOSFET

Figure 40:
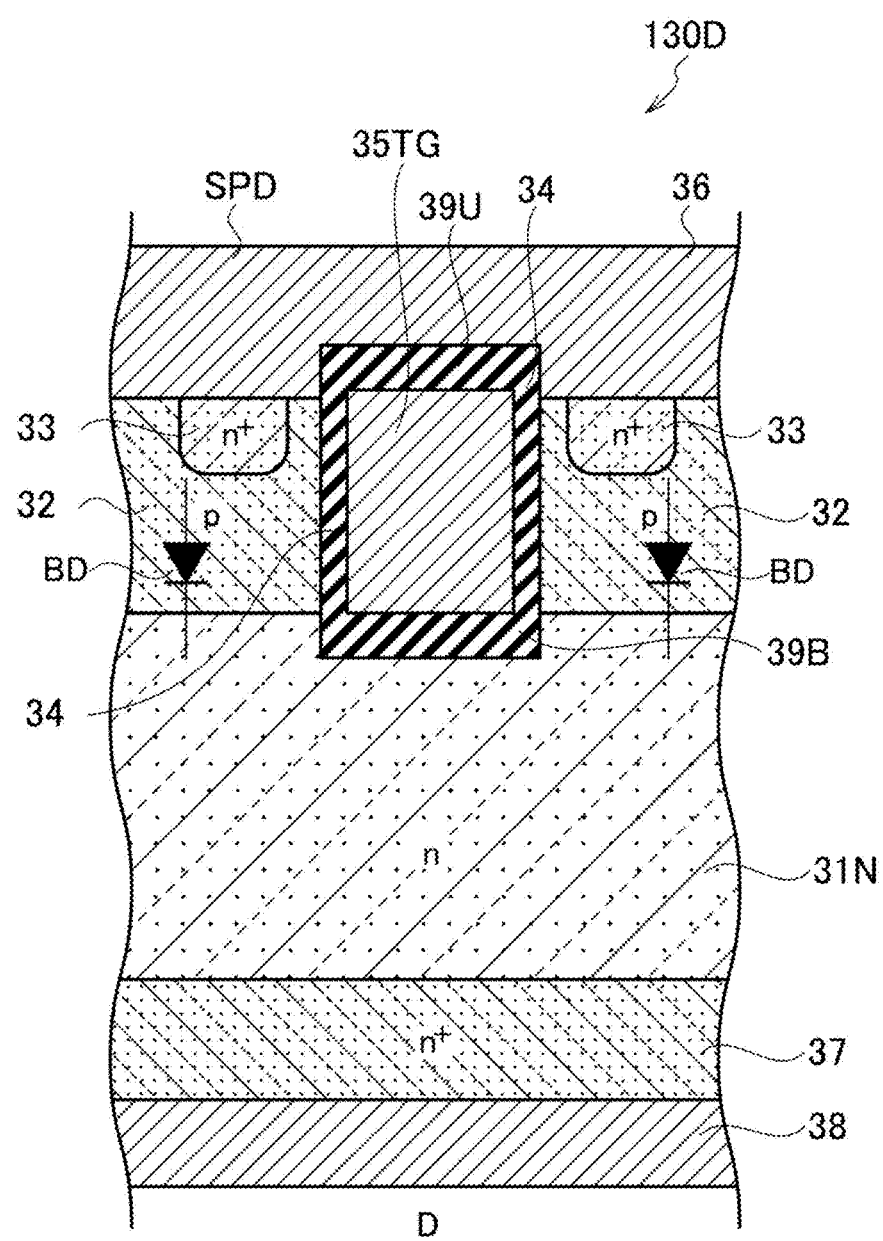
FIG. 40 is a schematic cross-sectional structure diagram of a SiC Trench MOSFET (SiC TMOSFET), which is an example of the semiconductor device applicable to the power module according to the embodiments.

FIG. 40 shows a schematic cross-sectional structure of a SiC TMOSFET 130D, which is an example of a semiconductor device which can be applied to the power module according to the embodiments.

As shown in FIG. 40, the SiC TMOSFET 130D includes: a semiconductor layer 31N composed by including an n layer; a p body region 32 formed on a front surface side of the semiconductor layer 31N; an n⁺ type source region 33 formed on a front side surface of the p body region 32; a trench gate electrode 35TG passing through the p body region 32, the trench gate electrode 35TG formed in the trench formed up to the semiconductor layer 31N via the gate insulating film 34 and the interlayer insulating films 39U and 39B; a source electrode 36 connected to the source region 33 and the p body region 32; an n+ type drain region 37 disposed on a back side surface opposite to the surface of the semiconductor layer 31N; and a drain electrode 38 connected to the n+ type drain area 37.

In FIG. 40, in the SiC TMOSFET 130D, a trench gate electrode 35TG passing through the p body region 32 is formed in the trench formed up to the semiconductor layer 31N via the gate insulating film 34 and the interlayer insulating films 39U and 39B; and the source pad electrode SPD is connected to the source region 33 and the source electrode 36 connected to the p body region 32.

Moreover, a gate pad electrode GPD (not illustrated) is connected to the trench gate electrode 35TG disposed on the gate insulating film 34. Moreover, as shown in FIG. 40, the gate pad electrode GPD and the source pad electrode SPD are disposed on an interlayer insulating film 39U for passivation which covers the surface of the SiC TMOSFET 130D.

In the SiC TMOSFET 130D, channel resistance $R_{JFET}$ accompanying the JFET effect as the SiC DIMOSFET 130D is not formed. Moreover, body diodes BD are respectively formed between the p body regions 32 and the semiconductor layers 31N, in the same manner as FIG. 39.

Example of Application

Figure 41A:
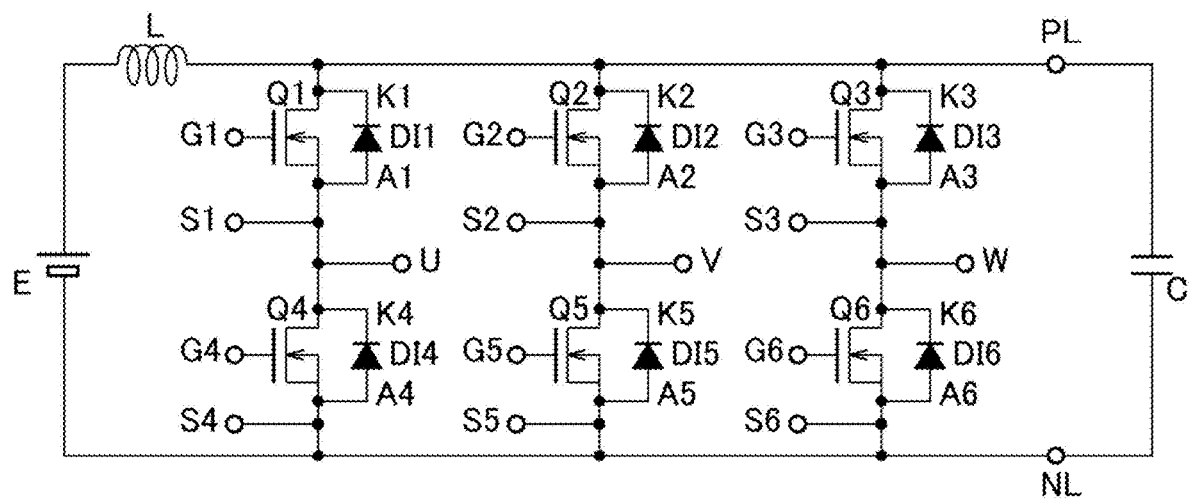
FIG. 41A shows an example of a circuit configuration in which the SiC MOSFET is applied as a semiconductor device, and a snubber capacitor is connected between a power terminal PL and an earth terminal (ground terminal) NL, in a circuit configuration of a three-phase alternating current (AC) inverter composed using the power module according to the embodiments.
Figure 41B:
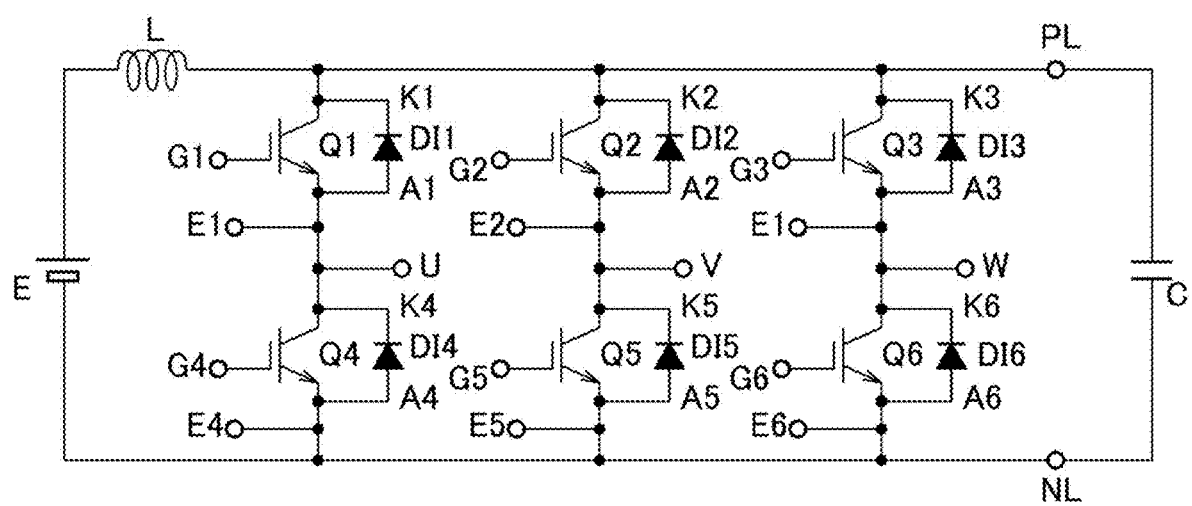
FIG. 41B shows an example of a circuit configuration of applying the IGBT as a semiconductor device and connecting a snubber capacitor C between the power terminal PL and the ground terminal NL.

FIG. 41A shows an example of a circuit configuration in which the SiC MOSFET is applied as a semiconductor device, and a snubber capacitor C is connected between the power terminal PL and the earth terminal (ground terminal) NL, in a circuit configuration of a three-phase AC inverter 40A composed using the power module according to the embodiments. Similarly, FIG. 41B shows a circuit configuration example of a three-phase AC inverter 40B composed by applying an IGBT as a semiconductor device and connecting a snubber capacitor C between the power terminal PL and the ground terminal NL.

When connecting the mower module to the power source E to execute switching operations, large surge voltage Ldi/dt is produced by an inductance L included in a connection line due to a high switching speed of the SiC MOSFET and IGBT. For example, di/dt is expressed as follows: di/dt=3× $10^9$ (A/s), where a current change di=300 A, and a time variation accompanying switching dt=100 ns.

Although a value of the surge voltage Ldi/dt changes dependent on a value of the inductance L, the surge voltage Ldi/dt is superimposed on the power source E. Such a surge voltage Ldi/dt can be absorbed by the snubber capacitor C connected between the power terminal PL and the earth terminal (ground terminal) NL.

Concrete Example

Next, with reference to FIG. 42, there will now be explained a three-phase AC inverter 42B to which a SiC MOSFET is applied as a semiconductor device.

Figure 42:
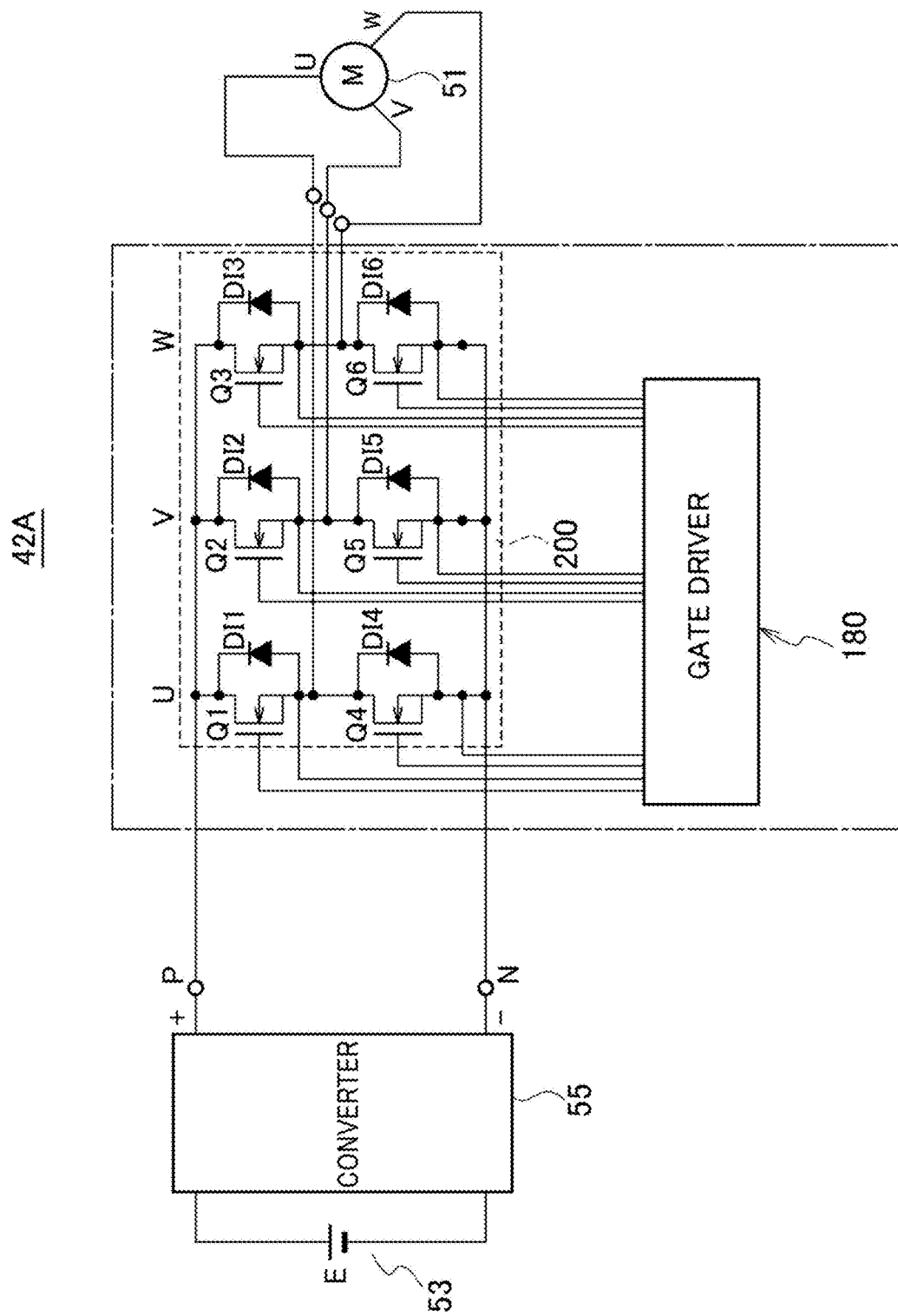
FIG. 42 shows an example of a circuit configuration in which the SiC MOSFET is applied as the semiconductor device, in a circuit configuration of a three-phase AC inverter composed using the power module according to the embodiments.

As shown in FIG. 42, the three-phase AC inverter 42A includes: a power module unit 200 connected to a gate driver (GD) 180; a three-phase AC motor unit 51; a power supply or storage battery (F) 53; and a converter 55. U-phase, V-phase, and W-phase inverters are respectively connected to the three-phase AC motor unit 51 so as to correspond to U phase, V phase, and W phase of the three-phase AC motor unit 51, in the power module unit 200.

In this case, the GD 180 is connected to SiC MOSFETs Q1 and Q4, SiC MOSFETs Q2 and Q5, and SiC MOSFETs Q3 and Q6.

The power module unit 200 includes the SiC MOSFETs (Q1 and Q4), (Q2 and Q5), and (Q3 and Q6) having inverter configurations connected between a positive terminal (+) P and a negative terminal (−) N of the converter 55 to which the power supply or storage battery (E) 53 is connected. Moreover, flywheel diodes DI1 to DI6 are respectively connected reversely in parallel between the source and the drain of the SiC MOSFETs Q1 to Q6.

Next, there will now be explained the three-phase AC inverter 42B composed using the power module according to the embodiments to which the IGBT is applied as the semiconductor device, with reference to FIG. 43.

Figure 43:
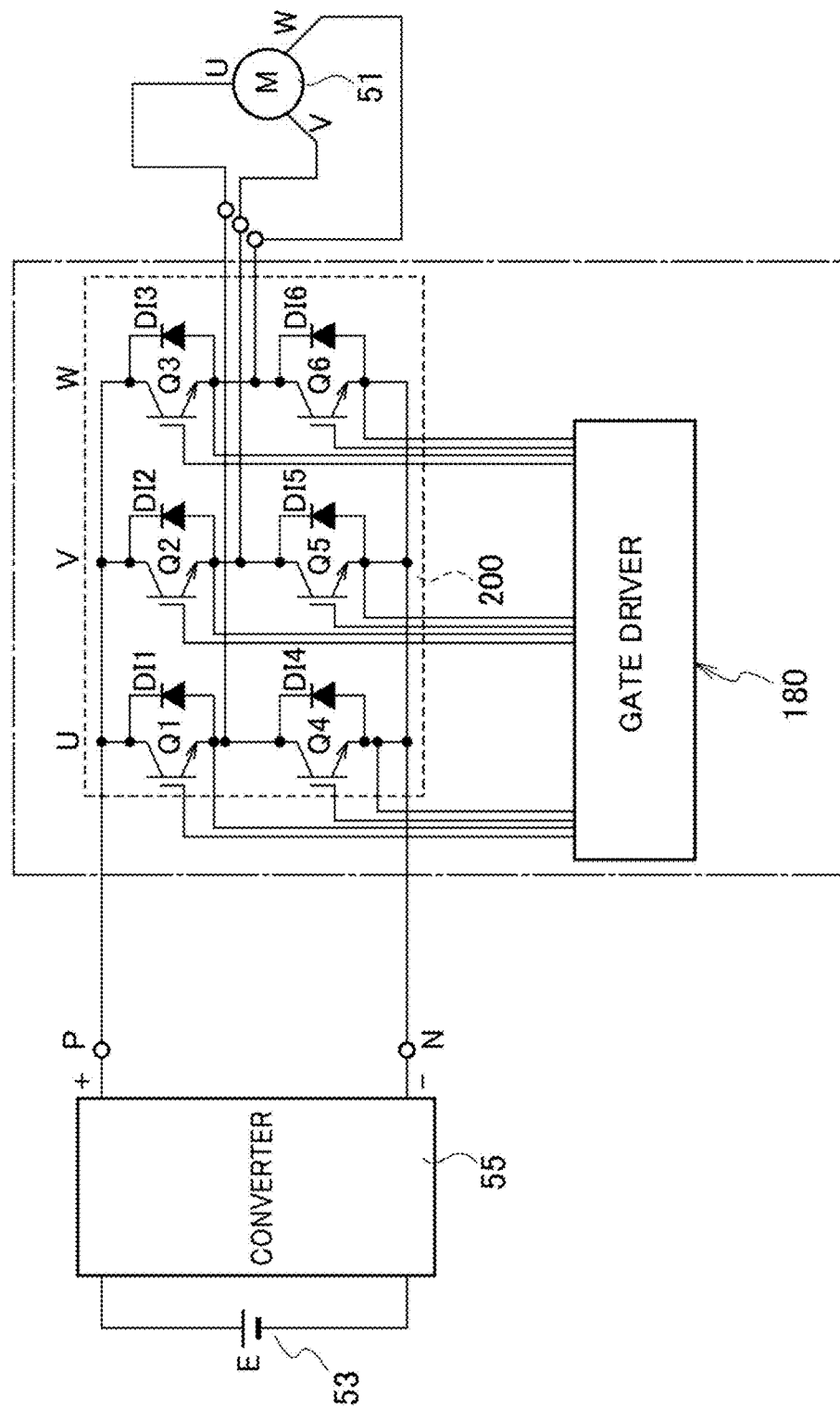
FIG. 43 shows an example of a circuit configuration in which the IGBT is applied as the semiconductor device, in a circuit configuration of a three-phase AC inverter composed using the power module according to the embodiments.

As shown in FIG. 43, the three-phase AC inverter 42S includes: a power module unit 200; a gate driver (GD) 180; a three-phase AC motor unit 51; a power supply or storage battery (E) 53; and a converter 55. U-phase, V-phase, and W-phase inverters are respectively connected to the three-phase AC motor unit 51 so as to correspond to U phase, V phase, and W phase of the three-phase AC motor unit 51, in the power module unit 200.

In this case, the GD 180 is connected to the IGBTs Q1, Q4, IGBTs Q2, Q5, and the IGBTs Q3, Q6.

The power module unit 200 includes the IGBTs (Q1 and Q4), (Q2 and Q5), and (Q3 and Q6) having inverter configurations connected between a positive terminal (+) P and a negative terminal (−) N of the converter 55 to which a storage battery (E) 53 is connected. Moreover, flywheel diodes DI1 to DI6 are respectively connected reversely in parallel between the emitter and the collector of the IGBTs Q1 to Q6.

(Diffusion Bonding Technology)

Example of not Inserting Insert Metal

Figure 44A:
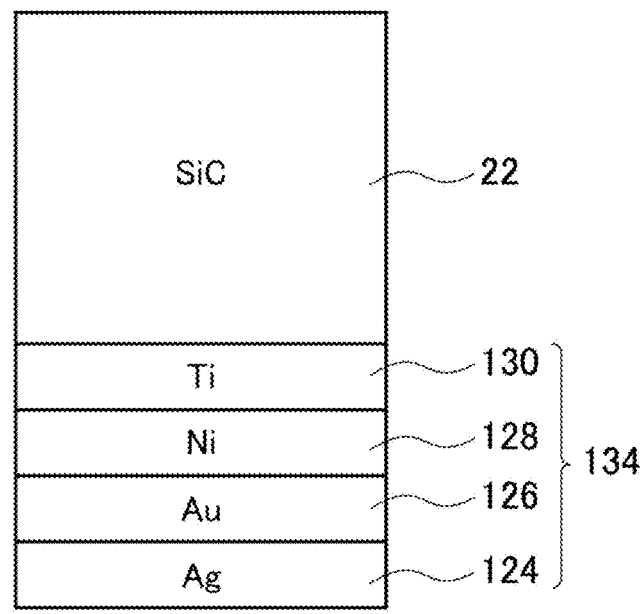
FIG. 44A is an explanatory diagram of a fabrication method of a power module according to one embodiment to which a diffusion bonding technology is applied, showing a schematic cross-sectional diagram near a back side surface of a SiC semiconductor device before performing diffusion bonding.
Figure 44B:
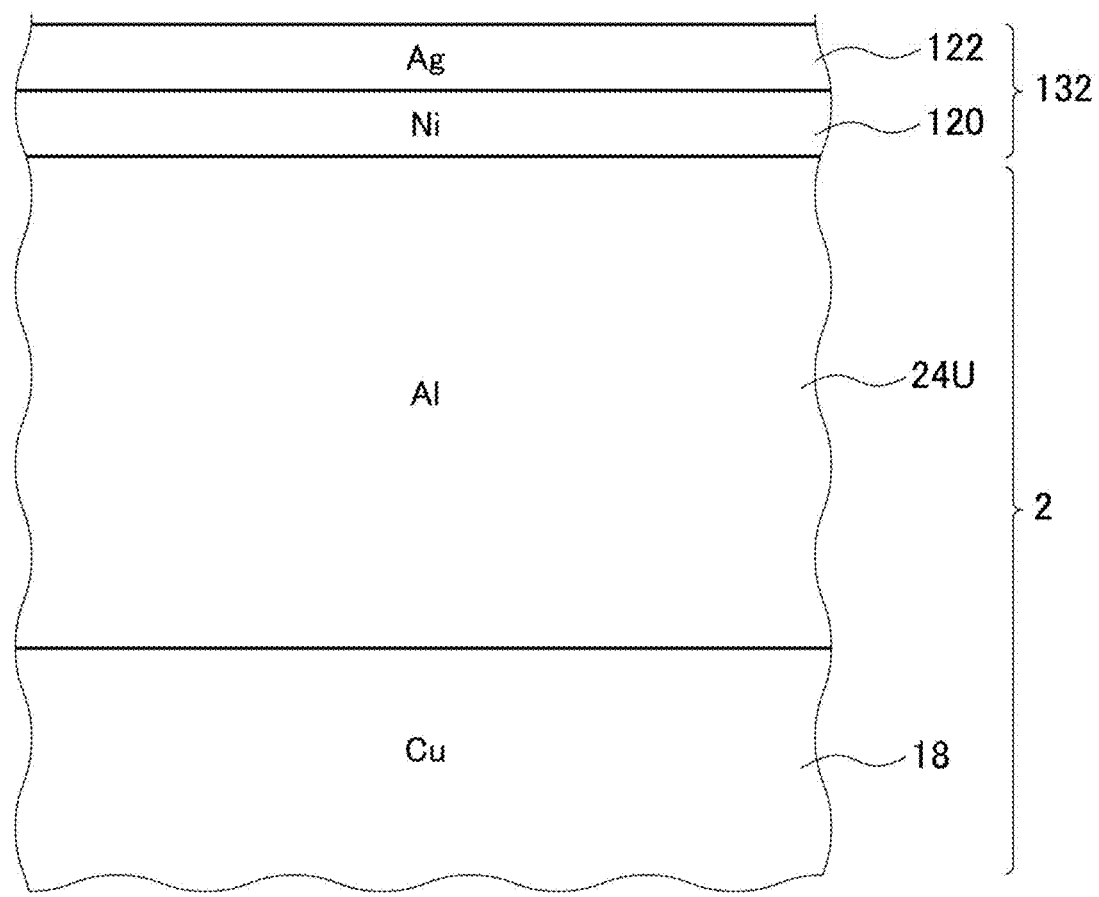
FIG. 44B is an explanatory diagram of the fabrication method of the power module according to one embodiment to which the diffusion bonding technology is applied, showing a schematic cross-sectional diagram near a front side surface of a thick copper substrate before performing the diffusion bonding.

In an explanatory diagram of a fabrication method of a power module according to one embodiment to which a diffusion bonding technology is applied, FIG. 44A shows a schematic cross-sectional structure near a back side surface of a SiC semiconductor device 22 before performing diffusion bonding. FIG. 44B shows a schematic cross-sectional structure near a front side surface of a thick copper substrate 2 before performing the diffusion bonding.

A back surface electrode 134 of the SiC semiconductor device 22 includes a metallic multilayered structure, including a titanium layer 130, a nickel layer 128, an Au layer 126, and an Ag layer 124 sequentially from a back surface side of the SiC semiconductor device 22, for example. The titanium layers 130, the nickel layer 128, the Au layer 126, and the Ag layer 124 can be formed by means of the sputtering technology, for example.

A surface electrode 132 of the thick copper substrate 2 includes a metallic multilayered structure, including a nickel layer 120 and an Ag layer 122 sequentially from a front surface side of the thick copper substrate 2, for example. The thick copper substrate 2 includes a Cu layer 18 and a stress relaxation metal layer 24U composed by including an aluminum layer formed on the Cu layer 18.

For example, by means of the plating technology, a nickel layer 120 is formed on the stress relaxation metal layer 24U composed by including an aluminum layer and an Ag layer 122 is formed on the nickel layer 120.

Figure 45:
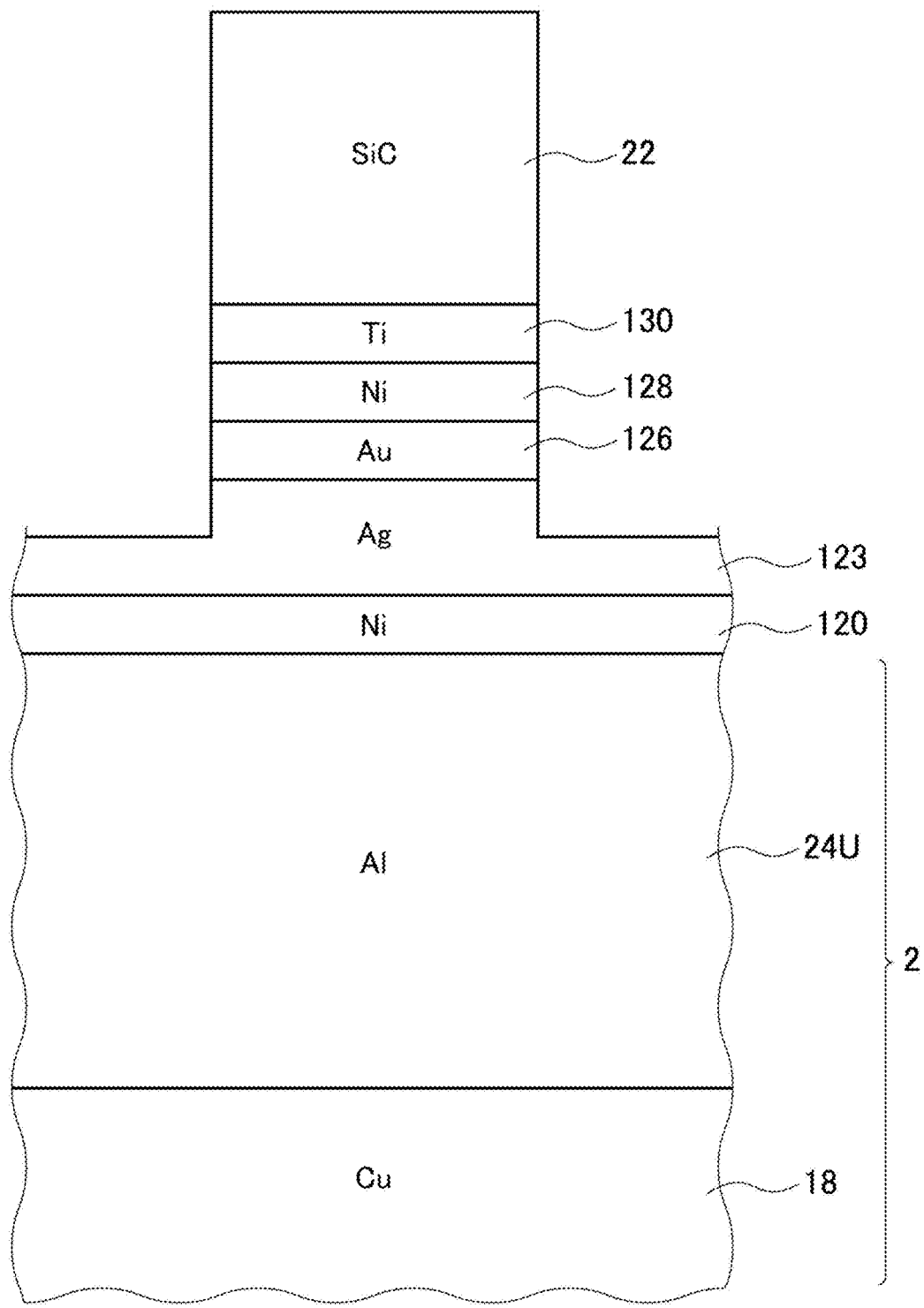
FIG. 45 is a schematic cross-sectional diagram showing the power module according to one embodiment in which a diffusion bonding portion is formed by heating and pressurizing the back side surface of the SiC semiconductor device and the front side surface of the thick copper substrate, by applying the diffusion bonding technology.

Next, FIG. 45 shows a schematic cross-sectional structure of the power module according to one embodiment in which a diffusion bonding portion is formed by heating and pressurizing the back side surface of the SiC semiconductor device 22 and the front side surface of the thick copper substrate 2, by applying the diffusion bonding technology.

More specifically, as shown in FIG. 45, the Ag layer 122 at the front surface side of the thick copper substrate 2 and the Ag layer 124 at the back surface side of the SIC semiconductor device 22 are diffusion-bonded to each other by the heating and pressurizing process, and thereby an Ag layer 123 in which the Ag layer and the Ag layer are integrated to each other is formed.

Examples of SEM Photograph of Cross-Sectional Structure

Figure 46A:
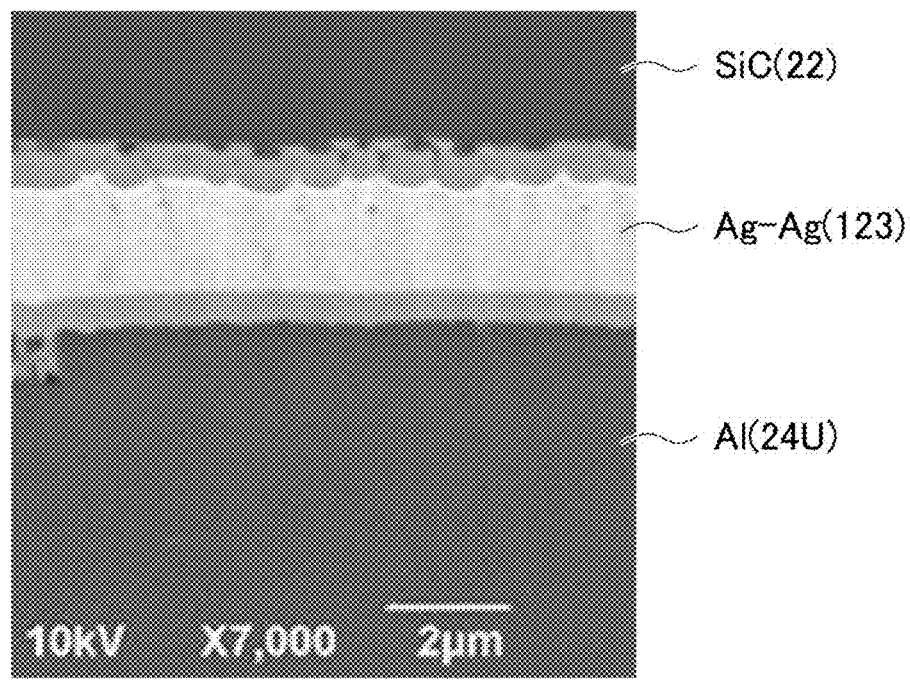
FIG. 46A shows an example of a Scanning Electron Microscope (SEM) photograph of a cross-sectional structure near the diffusion bonding portion of the power module according to one embodiment to which the diffusion bonding technology is applied.
Figure 46B:
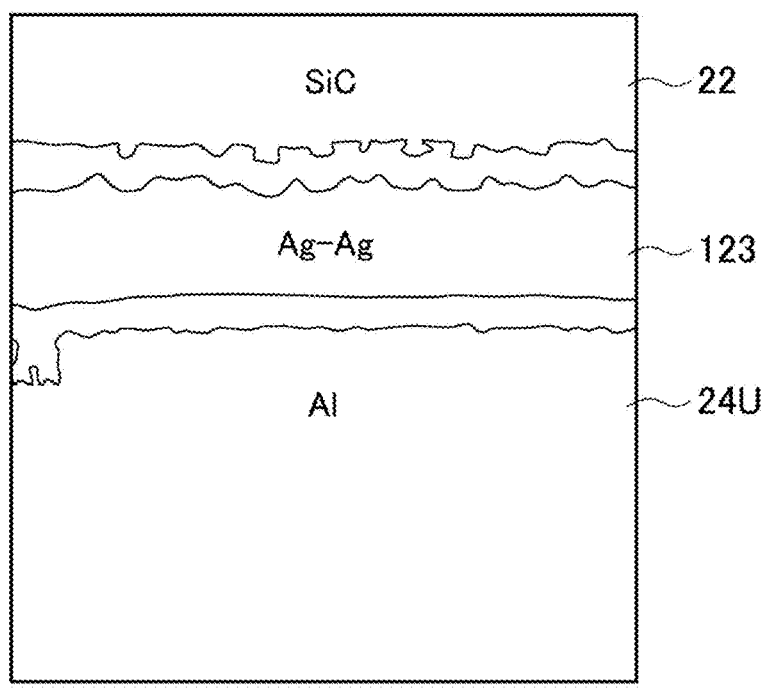
FIG. 46B is a diagram for explaining FIG. 46A.

FIG. 46A shows an example of an SEM photograph of a cross-sectional structure near the diffusion bonding portion of the power module according to one embodiment to which the diffusion bonding technology is applied; and FIG. 46B shows a diagram for explaining FIG. 46A.

Figure 47A:
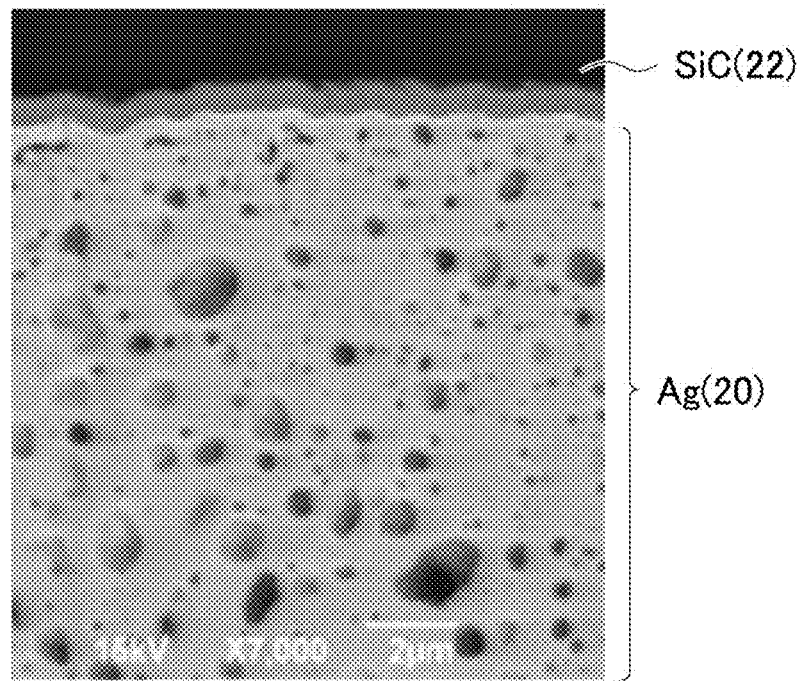
FIG. 47A shows an example of an SEM photograph of a cross-sectional structure near an Ag-fired bonding portion of a power module according to one embodiment to which an Ag-fired bonding technology is applied.
Figure 47B:
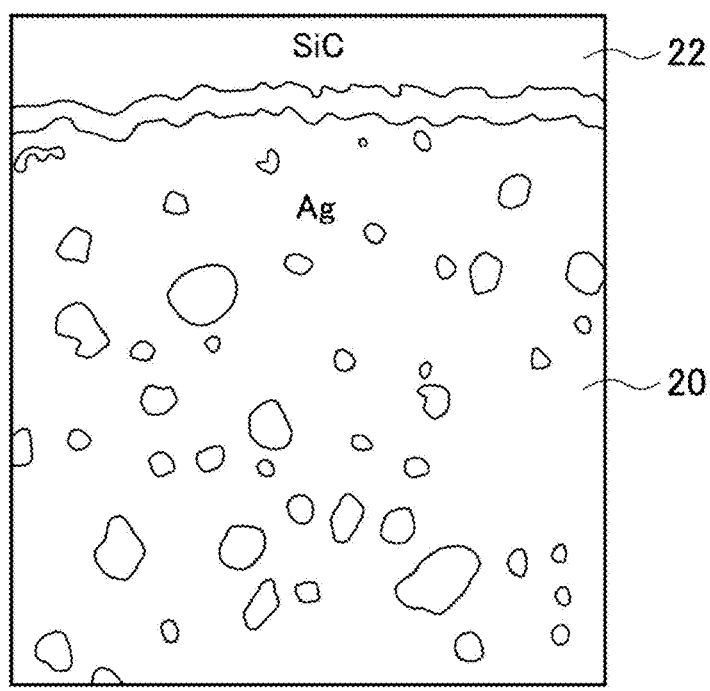
FIG. 47B is a diagram for explaining FIG. 47A.

FIG. 47A shows an example of an SEM photograph of a cross-sectional structure near an Ag-fired bonding portion of the power module according to one embodiment to which the Ag-fired bonding technology is applied; and FIG. 47B shows a diagram for explaining FIG. 47A.

As shown in FIGS. 46A and 46B, if the diffusion bonding is performed, the Ag layer and the Ag layer are integrated to each other. On the other hand, in the Ag-fired bonding portion, a porous structure having a large number of voids is formed in the Ag fired layer, and the bonded structure thereof is clearly different from that of the diffusion bonding.

In this case, a thickness of the Ag fired layer formed of Ag-fired bonding technology is approximately 80 μm, for example, and a value of CTE is approximately 200 W/mK, for example. On the other hand, a thickness of diffusion bonding layer between the Ag layer and the Ag layer formed by the diffusion bonding technology is approximately 2 μm, for example, and a value of CTE is approximately 430 W/mK, for example.

According to the power module according to one embodiment to which the present technology is applied, the thin-layered power module having high thermal conductive can be realized by means of the diffusion bonding to form the bonding layer on the thick copper substrate.

Example of Inserting Insert Metal

In the above-mentioned example of not inserting the insert metal, if the lowermost surface of the back surface electrode 134 of the SiC semiconductor device 22 is the Ag layer 124, and the uppermost surface of the surface electrode 132 of the thick copper substrate 2 is the Ag layer 122, an inserted metal composed by including an Ag layer may further be inserted between the Ag layer 124 and the Ag layer 122, and then the heating and pressurizing process may be performed. By using the metal of the lowermost surface of the back surface electrode 134 of the SIC semiconductor device 22 and the metal of the uppermost surface of the surface electrode 132 of the thick copper substrate 2 as the same metal, and also using the inserted metal as the same metal, satisfactory diffusion bonding can be formed. Also if an Ag layer is applied to the inserted metal, it is also possible to form a diffusion bonding portion in which the Ag layer 124, the inserted metal (Ag layer), and the Ag layer 122 are integrated to one another as in FIGS. 46A and 46B.

In addition, the above-mentioned Ag—Ag diffusion bonding can similarly be applied to the first embodiment. The solid phase diffusion bonding technology using the inserted metal may also be applied to the first embodiment.

The above-mentioned Ag—Ag diffusion bonding can similarly be applied to the second to third embodiments, instead of the Ag fired layer 20. Moreover, the solid phase diffusion bonding technology using the inserted metal may also be applied to the second to third embodiments.

As mentioned above, the present technology includes the embodiments of the diffusion bonding without the inserted metal and the embodiments of the solid phase diffusion with the inserted metal.

(Explanation of Embedded Portion)

Figure 48A:
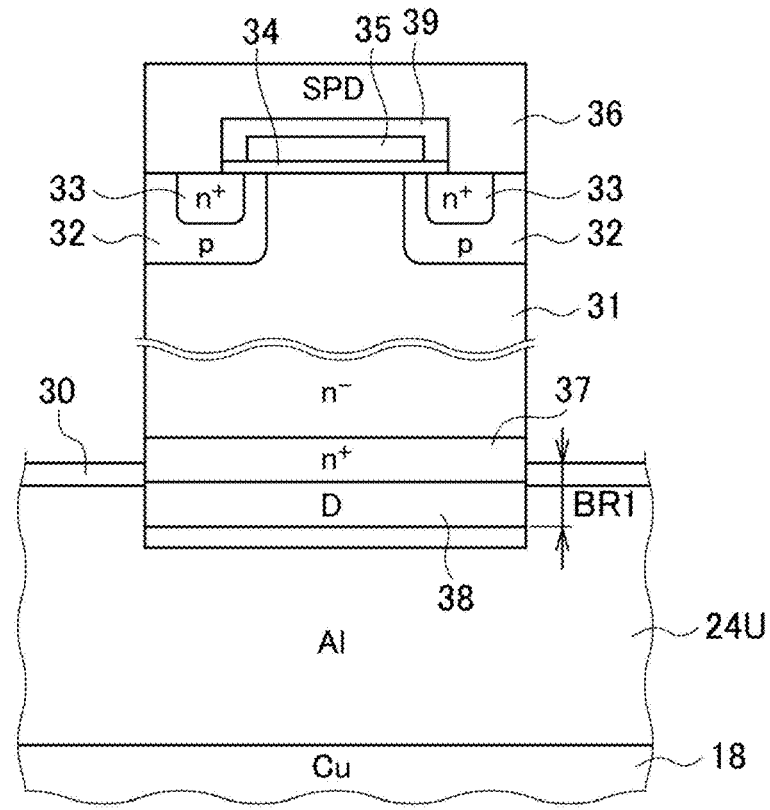
FIG. 48A is a schematic cross-sectional diagram near a front side surface of a thick copper substrate of a power module according to one embodiment to which the present technology is applied (Example 1).
Figure 48B:
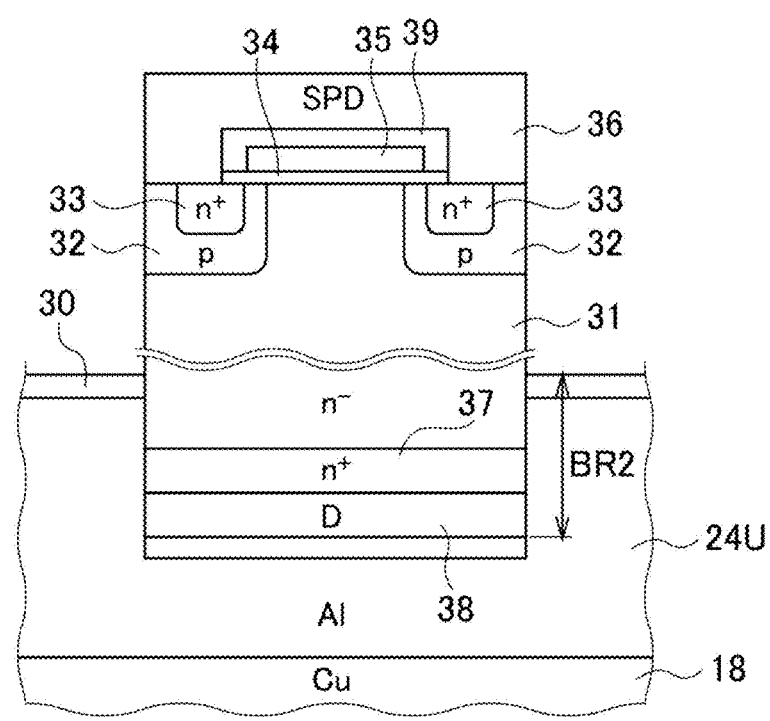
FIG. 48B is a schematic cross-sectional diagram near a front side surface of a thick copper substrate of a power module according to one embodiment to which the present technology is applied (Example 2).

FIG. 48A shows a schematic cross-sectional diagram near a front side surface of the thick copper substrate of the power module according to one embodiment to which the present technology is applied (Example 1), and FIG. 48B shows a schematic cross-sectional diagram near the front side surface of the thick copper substrate (Example 2).

Although the SiC semiconductor device 22 is represented as a SiC block in FIGS. 23 and 24, FIGS. 48A and 48B represent embedding degrees, as examples of the schematic cross-sectional structure of SiC DIMOSFET shown in FIG. 39 as the SiC semiconductor device 22.

In the example of FIG. 48A, s thickness of an embedded portion BR1 is relatively thin, and the SiC semiconductor device 22 is embedded from a back surface electrode side to the middle of the $n^+$ type drain region 37.

In the example of FIG. 48B, a thickness of an embedded portion BR2 is relatively thick, and the SiC semiconductor device 22 is embedded from the back surface electrode side to the middle of the semiconductor layer 31 composed of the $n^-$ type high resistivity layer. The SiC semiconductor device 22 is not limited to the SiC DIMOSFET shown in FIG. 39, but is similarly applied to the SiC TMOSFET shown in FIG. 40.

Result of Thermal Cycle Reliability Test

Figure 49:
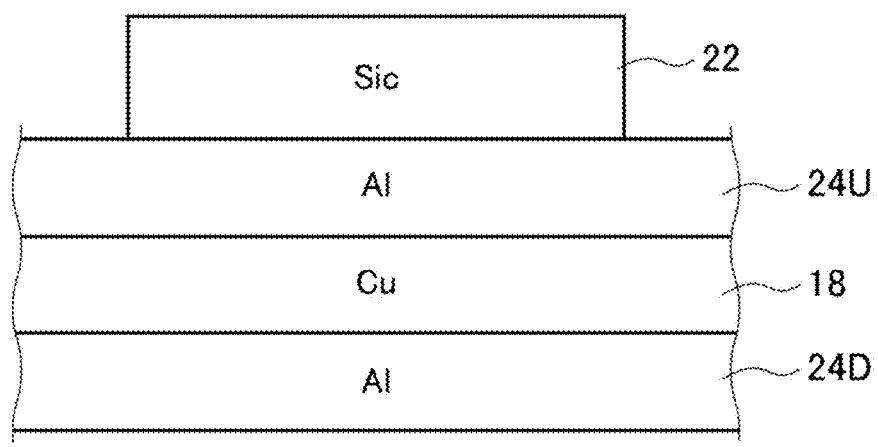
FIG. 49 is a schematic cross-sectional diagram showing a substrate structure used for a thermal cycle test of the power module according to one embodiment to which the diffusion bonding technology is applied.

FIG. 49 is a schematic cross-sectional structure of a substrate structure used for a thermal cycle test of the power module according to one embodiment to which the diffusion bonding technology is applied.

The substrate structure includes 3-layer structure of Al (24U)/Cu(18)/Al (24D). The SiC semiconductor device is bonded on the Al (24U) by the above-mentioned Ag—Ag diffusion bonding. An example of a thickness of the substrate structure are Al (24U)/Cu (18)/Al (24D) 0.1 mm/1.6 mm/0.1 mm.

Figure 50A:
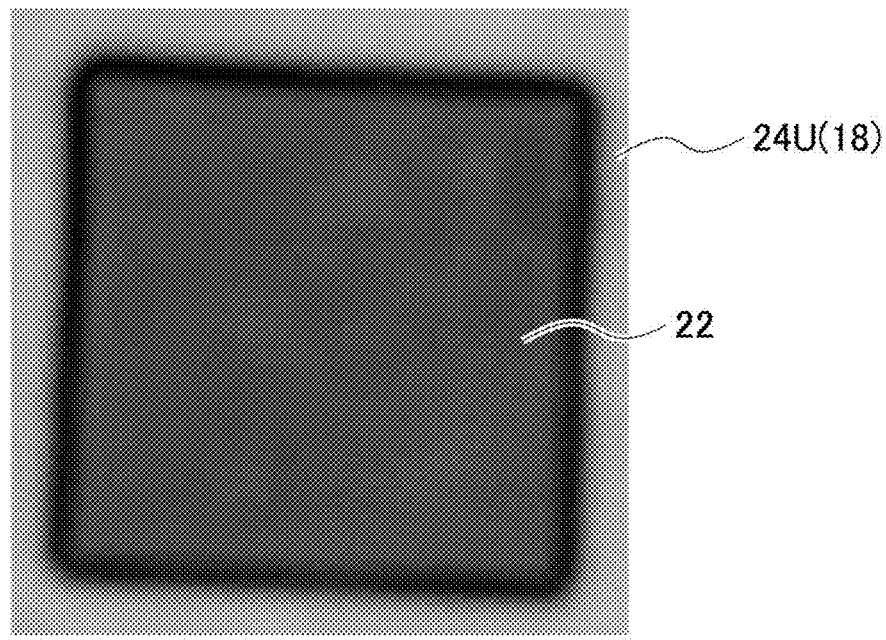
FIG. 50A shows a result of the thermal cycle test of the power module according to one embodiment to which the diffusion bonding technology is applied, showing an example of an SAT image in an initial state (0 cycle).
Figure 50B:
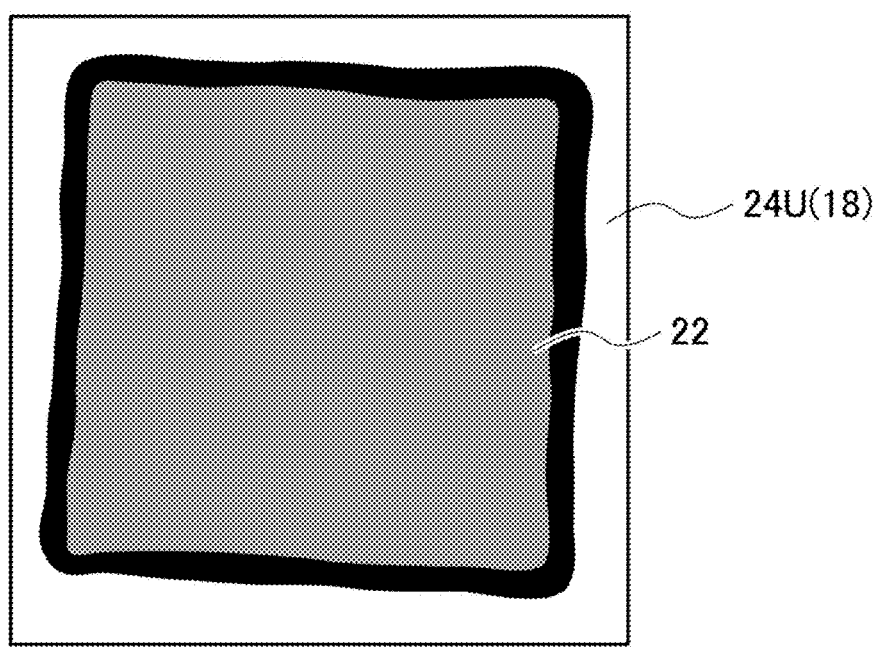
FIG. 50B is a diagram for explaining FIG. 50A.

FIG. 50A shows a result of the thermal cycle test of the power module according to one embodiment to which the diffusion bonding technology is applied, showing an example of an SAT image in an initial state (0 cycle); and FIG. 50B shows a diagram for explaining FIG. 50A.

Figure 51A:
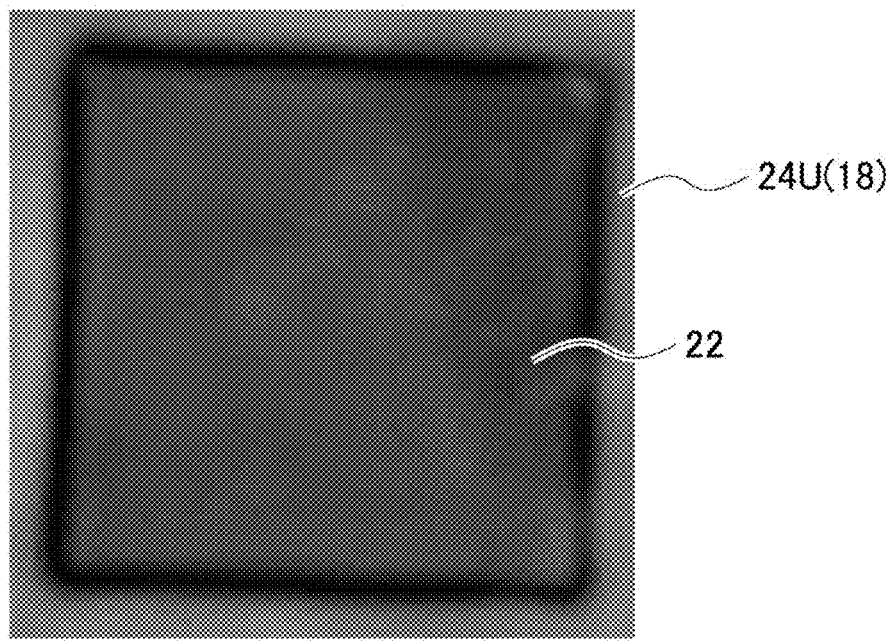
FIG. 51A shows a result of the thermal cycle test of the power module according to one embodiment to which the diffusion bonding technology is applied, showing an example of an SAT image after 500 cycles (from −40° C. to +150° C. for 30 minutes) of the thermal cycle test.
Figure 51B:
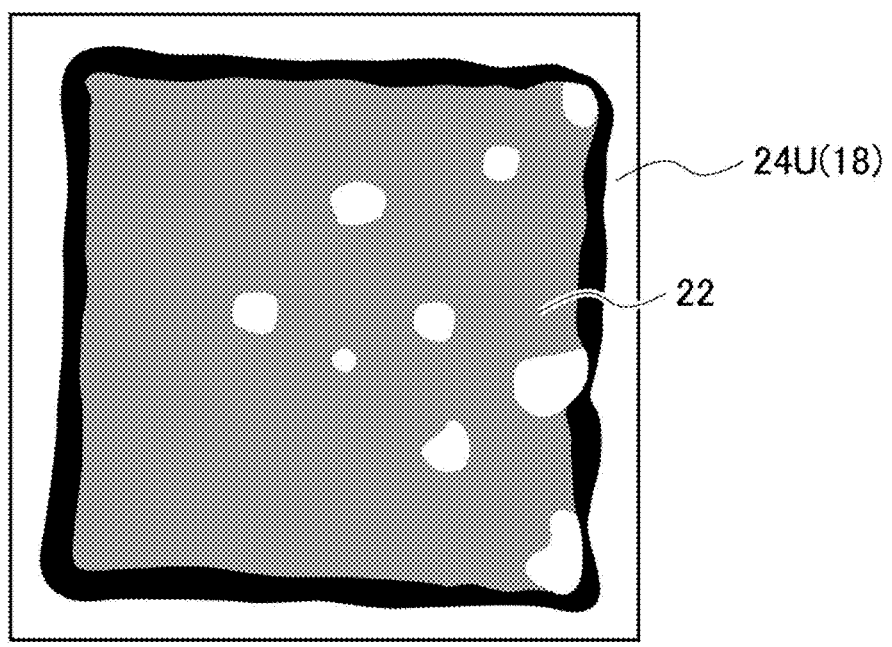
FIG. 51B is a diagram for explaining FIG. 51A.

FIG. 51A shows an example of an SAT image after 500 cycles (from −40° C. to +150° C. for 30 minutes), and FIG. 51B shows a diagram for explaining FIG. 51A.

Figure 52A:
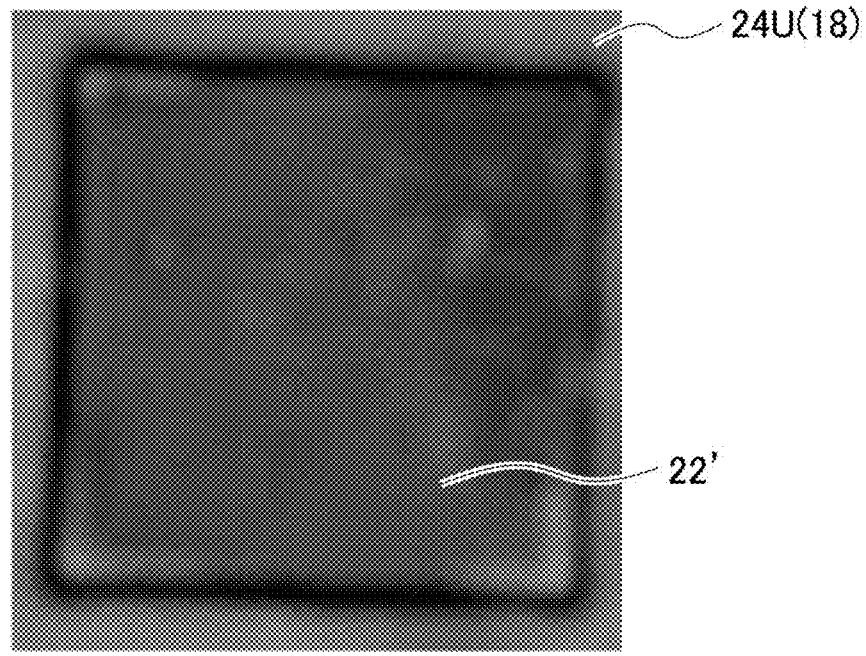
FIG. 52A shows a result of the thermal cycle test of the power module according to one embodiment to which the diffusion bonding technology is applied, showing an example of an SAT image after 1,000 cycles (from −40° C. to +150° C. for 30 minutes) of the thermal cycle test.
Figure 52B:
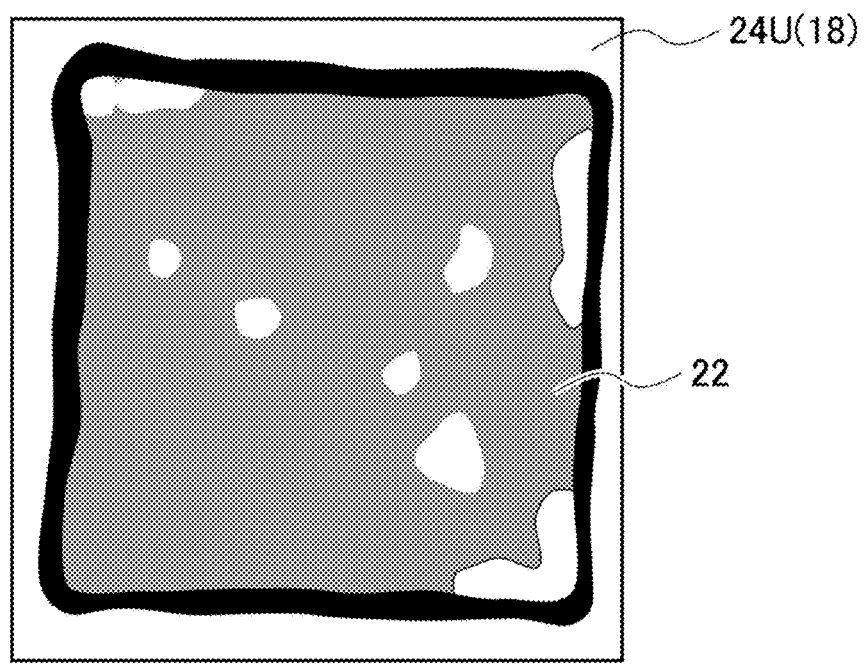
FIG. 52B is a diagram for explaining FIG. 52A.

FIG. 52A shows an example of an SAT image after 1,000 cycles (from −40° C. to +150° C. for 30 minutes), and FIG. 52B shows a diagram for explaining FIG. 52A.

Figure 53A:
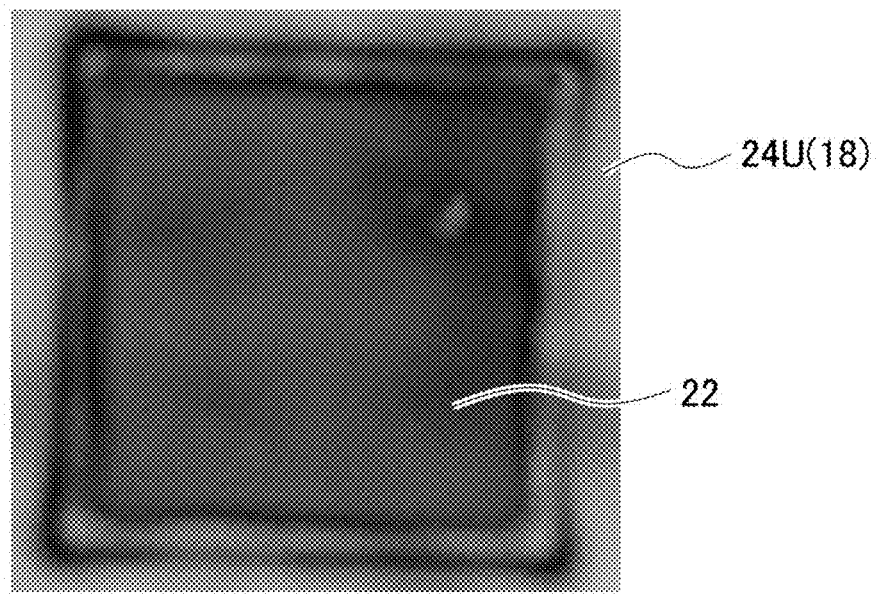
FIG. 53A shows a result of the thermal cycle test of the power module according to one embodiment to which the diffusion bonding technology is applied, showing an example of an SAT image after 1,500 cycles (from −40° C. to +150° C. for 30 minutes) of the thermal cycle test.
Figure 53B:
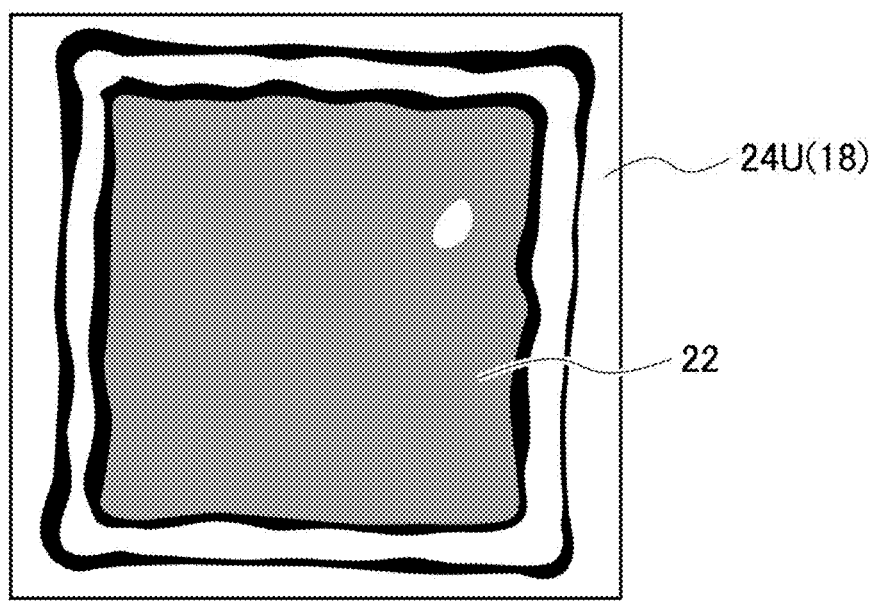
FIG. 53B is a diagram for explaining FIG. 53A.

FIG. 53A shows an example of an SAT image after 1,500 cycles (from −40° C. to +150° C. for 30 minutes), and FIG. 53B shows a diagram for explaining FIG. 53A.

Figure 54A:
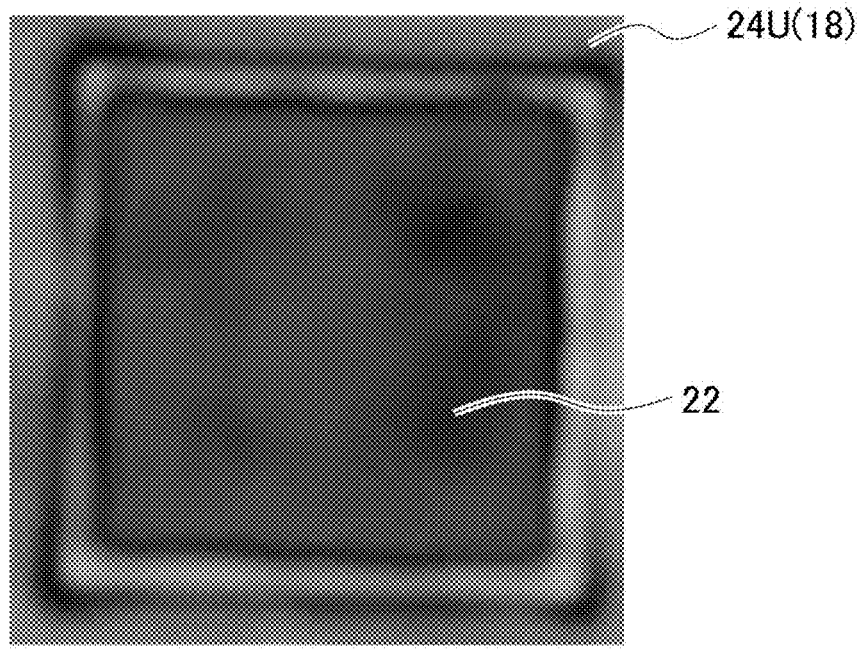
FIG. 54A shows a result of the thermal cycle test of the power module according to one embodiment to which the diffusion bonding technology is applied, showing an example of an SAT image after 2,000 cycles (from −40° C. to +150° C. for 30 minutes) of the thermal cycle test.
Figure 54B:
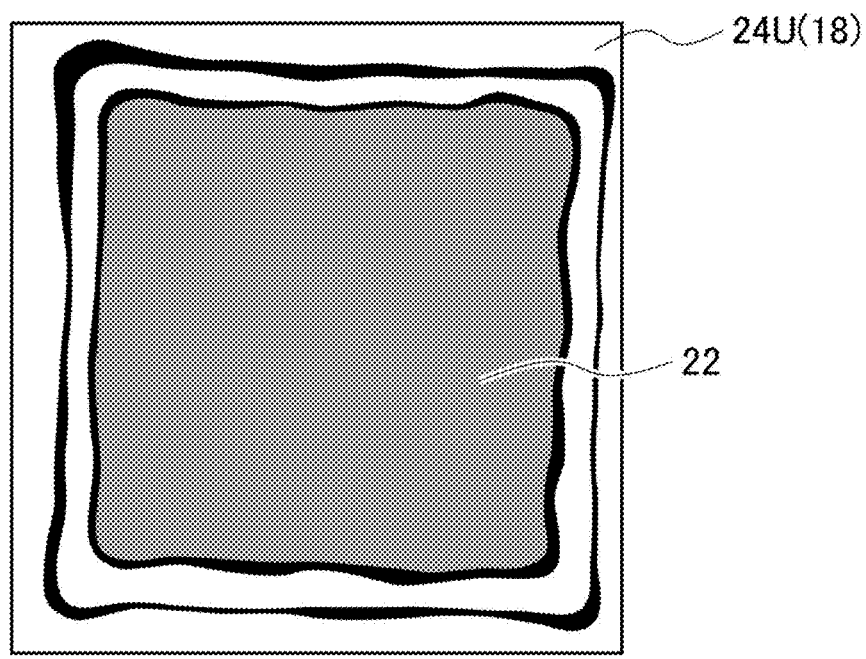
FIG. 54B is a diagram for explaining FIG. 54A.

FIG. 54A shows an example of an SAT image after 2,000 cycles (from −40° C. to +150° C. for 30 minutes), and FIG. 54B shows a diagram for explaining FIG. 54A.

As shown in FIGS. 50-54, according to the thermal cycle test results from 0 to 2,000 cycles (from −40° C. to +150° C. for 30 minutes), it can be confirmed that satisfactory bonding is formed by means of the diffusion bonding to form the bonding layer on the thick copper substrate.

OTHER EMBODIMENTS

Some embodiments have been described, as a disclosure including associated description and drawings to be construed as illustrative, not restrictive. This disclosure makes clear a variety of alternative embodiments, working examples, and operational techniques for those skilled in the art.

Such being the case, the embodiments cover a variety of embodiments, whether described or not.

INDUSTRIAL APPLICABILITY

The power module according to the embodiments can be used for semiconductor module techniques, e.g. IGBT modules, diode modules, MOS modules (Si, SiC, GaN), etc., and can be applied for wide applicable fields, e.g. inverters for Hybrid Electric Vehicles (HEVs)/Electric Vehicles (EVs), industrial inverters or converters.

What is claimed is:
1. A power module comprising:
a plate-shaped thick copper substrate;
a conductive stress relaxation metal layer disposed on the thick copper substrate;
a plated layer disposed on the stress relaxation metal layer; and
a semiconductor device disposed on the plated layer, wherein
the semiconductor device is bonded to the stress relaxation metal layer via the plated layer, and
a part of the semiconductor device is embedded to be fixed to the plated layer.
2. The power module according to claim 1, further comprising
an Ag fired layer disposed on the plated layer, wherein
the semiconductor device is bonded to the stress relaxation metal layer, via the Ag fired layer and the plated layer.
3. The power module according to claim 1, wherein
a bonded surface between the semiconductor device and the plated layer are integrated to each other.
4. The power module according to claim 3, wherein
the semiconductor device is bonded by being embedded in the plated layer by ⅓ to ½ of the thickness of the semiconductor device.
5. A power module comprising:
a plate-shaped thick copper substrate;
a conductive stress relaxation metal layer disposed on the thick copper substrate;
a semiconductor device disposed on and bonded to the stress relaxation metal layer; and
an Ag fired layer disposed on the stress relaxation metal layer, wherein
a part of the semiconductor device is embedded to be fixed to the stress relaxation metal layer, wherein
the semiconductor device is bonded to the stress relaxation metal layer via the Ag fired layer.
6. A power module comprising:
a plate-shaped thick copper substrate;
a conductive stress relaxation metal layer disposed on the thick copper substrate; and
a semiconductor device disposed on and bonded to the stress relaxation metal layer, wherein
a part of the semiconductor device is embedded to be fixed to the stress relaxation metal layer, wherein
a bonded surface between the semiconductor device and the stress relaxation metal layer are integrated to each other, wherein
the semiconductor device is bonded by being embedded in the stress relaxation metal layer by ⅓ to ½ of the thickness of the semiconductor device.
7. A power module comprising:
a plate-shaped thick copper substrate;
a conductive stress relaxation metal layer disposed on the thick copper substrate; and
a semiconductor device disposed on and bonded to the stress relaxation metal layer, wherein
a part of the semiconductor device is embedded to be fixed to the stress relaxation metal layer, wherein
the stress relaxation metal layer comprises a first aluminum relaxation layer.
8. A power module comprising:
a plate-shaped thick copper substrate;
a conductive stress relaxation metal layer disposed on the thick copper substrate; and
a semiconductor device disposed on and bonded to the stress relaxation metal layer, wherein
a part of the semiconductor device is embedded to be fixed to the stress relaxation metal layer, wherein
the thick copper substrate comprises
a first thick copper layer and
a second thick copper layer disposed on the first thick copper layer, wherein
the stress relaxation metal layer is disposed on the second thick copper layer.
9. The power module according to claim 8, further comprising
an insulating sheet layer disposed on the first thick copper layer, wherein
the second thick copper layer is disposed on the insulating sheet layer.
10. The power module according to claim 8, further comprising
a second aluminum relaxation layer disposed on the insulating sheet layer, wherein
the second thick copper layer is bonded on the second aluminum relaxation layer.
11. The power module according to claim 8, further comprising
a cooling apparatus; and
a first thermal compound layer disposed on the cooling apparatus, wherein
the thick copper substrate is disposed on the cooling apparatus via the first thermal compound layer.
12. A power module comprising:
a plate-shaped first thick copper layer;
an insulating sheet layer disposed on the first thick copper layer;
a second thick copper layer disposed on the insulating sheet layer, the second thick copper layer being pattern-formed;
a first aluminum relaxation layer disposed on the second thick copper layer; and
a semiconductor device disposed on the first aluminum relaxation layer, wherein
the semiconductor device is bonded to the first aluminum relaxation layer, and
a part of the semiconductor device is embedded to be fixed to the first aluminum relaxation layer.

13. The power module according to claim 12, further comprising
an Ag fired layer disposed on the first aluminum relaxation layer, wherein
the semiconductor device is bonded to the first aluminum relaxation layer via the Ag fired layer.

14. A power module comprising
a plate-shaped first thick copper layer;
an insulating sheet layer disposed on the first thick copper layer;
a second thick copper layer disposed on the insulating sheet layer, the second thick copper layer being pattern-formed;
a first aluminum relaxation layer disposed on the second thick copper layer;
a plated layer disposed on the first aluminum relaxation layer; and
a semiconductor device disposed on the plated layer, wherein
the semiconductor device is bonded to the first aluminum relaxation layer via the plated layer, and
a part of the semiconductor device is embedded to be fixed to the plated layer.

15. The power module according to claim 14, further comprising
an Ag fired layer disposed on the plated layer, wherein
the semiconductor device is bonded to the first aluminum relaxation layer, via the Ag fired layer and the plated layer.

* * * * *